United States Patent
Kidoguchi et al.

(10) Patent No.: US 6,911,351 B2
(45) Date of Patent: Jun. 28, 2005

(54) METHOD OF FABRICATING NITRIDE SEMICONDUCTOR, METHOD OF FABRICATING NITRIDE SEMICONDUCTOR DEVICE, NITRIDE SEMICONDUCTOR DEVICE, SEMICONDUCTOR LIGHT EMITTING DEVICE AND METHOD OF FABRICATING THE SAME

(75) Inventors: Isao Kidoguchi, Hyogo (JP); Akihiko Ishibashi, Osaka (JP); Ryoko Miyanaga, Nara (JP); Gaku Sugahara, Nara (JP); Masakatsu Suzuki, Osaka (JP); Masahiro Kume, Shiga (JP); Yuzaburo Ban, Osaka (JP); Kiyoyuki Morita, Kyoto (JP); Ayumu Tsujimura, Osaka (JP); Yoshiaki Hasegawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 90 days.

(21) Appl. No.: 10/345,377

(22) Filed: Jan. 16, 2003

(65) Prior Publication Data

US 2003/0143771 A1 Jul. 31, 2003

Related U.S. Application Data

(62) Division of application No. 09/712,127, filed on Nov. 15, 2000.

(30) Foreign Application Priority Data

| Nov. 15, 1999 | (JP) | 11-324010 |
| Dec. 24, 1999 | (JP) | 11-367169 |
| Dec. 27, 1999 | (JP) | 11-369834 |
| Jan. 27, 2000 | (JP) | 2000-018407 |
| Feb. 3, 2000 | (JP) | 2000-025931 |
| Feb. 25, 2000 | (JP) | 2000-048824 |
| Apr. 21, 2000 | (JP) | 2000-120760 |
| Apr. 21, 2000 | (JP) | 2000-120761 |

(51) Int. Cl.[7] .............................................. H01L 21/00
(52) U.S. Cl. ............................. 438/46; 438/44; 438/47; 438/604; 257/103
(58) Field of Search ...................... 438/37–44, 46–48, 438/604, 606, 607, 687, 589, 51; 257/103

(56) References Cited

U.S. PATENT DOCUMENTS

| 4,840,922 A | 6/1989 | Kobayashi et al. |
| 4,855,256 A | 8/1989 | Kobayashi et al. |
| 5,549,747 A | * 8/1996 | Bozler et al. .................. 117/43 |

(Continued)

FOREIGN PATENT DOCUMENTS

| JP | 60161489 | 1/1984 |

(Continued)

OTHER PUBLICATIONS

Tsvetanka et al., "Pendeo–Epitaxy: A new Approach for Lateral growth of Gallium Nitride Films", Journal of Electronic Materials, vol. 28, No. 4., L5–L8, Apr. 1999.

(Continued)

Primary Examiner—Amir Zarabian
Assistant Examiner—Khanh Duong
(74) Attorney, Agent, or Firm—McDermott Will & Emery LLP

(57) ABSTRACT

The method of fabricating a nitride semiconductor of this invention includes the steps of forming, on a substrate, a first nitride semiconductor layer of $Al_uGa_vIn_wN$, wherein $0 \leq u, v, w \leq 1$ and $u+v+w=1$; forming, in an upper portion of the first nitride semiconductor layer, plural convexes extending at intervals along a substrate surface direction; forming a mask film for covering bottoms of recesses formed between the convexes adjacent to each other; and growing, on the first nitride semiconductor layer, a second nitride semiconductor layer of $Al_xGa_yIn_zN$, wherein $0 \leq x, y, z \leq 1$ and $x+y+z=1$, by using, as a seed crystal, C planes corresponding to top faces of the convexes exposed from the mask film.

87 Claims, 43 Drawing Sheets

U.S. PATENT DOCUMENTS

| | | | |
|---|---|---|---|
| 5,625,637 | A | 4/1997 | Mori et al. |
| 5,739,554 | A | 4/1998 | Edmond et al. |
| 5,972,730 | A | 10/1999 | Saito et al. |
| 6,046,465 | A | 4/2000 | Wang et al. |
| 6,153,010 | A * | 11/2000 | Kiyoku et al. ............... 117/95 |
| 6,252,894 | B1 | 6/2001 | Sasanuma et al. |
| 6,335,546 | B1 | 1/2002 | Tsuda et al. |
| 6,448,102 | B1 | 9/2002 | Kneissl et al. |
| 6,608,327 | B1 * | 8/2003 | Davis et al. ............... 257/76 |
| 6,764,932 | B2 * | 7/2004 | Kong et al. ............... 439/589 |
| 2001/0010372 | A1 | 8/2001 | Takeuchi et al. |
| 2001/0026658 | A1 | 10/2001 | Althaus et al. |

FOREIGN PATENT DOCUMENTS

| | | | |
|---|---|---|---|
| JP | 62282474 A | 5/1986 | |
| JP | 02214182 A | 2/1989 | |
| JP | 11068256 A | 8/1997 | |
| JP | 11251631 | 9/1999 | |
| JP | 11312825 | 11/1999 | |
| JP | 2002-518826 | 12/1999 | |
| JP | 2000-106455 | 4/2000 | |

OTHER PUBLICATIONS

I. Kim et al., "Crystal tilting in GaN grown by pendeopitaxy method on sapphire substrate", Applied Physics Letters, vol. 75, No. 26, pp. 4109–4111, Dec. 27, 1999.

A. Sakai, "Transmission electron microscopy of defects in GaN films formed by epitaxial lateral overgrowth", Applied Physics Letters, vol. 73, No. 4, pp. 481–483, Jul. 27, 1998.

H. Sone et al., "Optical and Crystalline Properties of Epitaxial–Lateral–Overgrown–GaN Using Tungsten Mask by Hydride Vapor Phase Epitaxy", Jpn. J. Appl. Phys. vol. 38 (1999), Part 2, No. 4A, pp. L356–L359, Apr. 1, 1999.

Tsvetanka et al., "Pendeo–Epitaxy: A new Approach for Lateral growth of Gallium Nitride Films", Journal of Electronic Materials, vol. 28, No. 4., L5–L8, Apr. 1999.

* cited by examiner

METHOD OF FABRICATING NITRIDE SEMICONDUCTOR, METHOD OF FABRICATING NITRIDE SEMICONDUCTOR DEVICE, NITRIDE SEMICONDUCTOR DEVICE, SEMICONDUCTOR LIGHT EMITTING DEVICE AND METHOD OF FABRICATING THE SAME

CROSS-REFERENCED TO RELATED APPLICATIONS

This application is a Divisional of application Ser. No. 09/712,127 filed Nov. 15, 2000, now U.S. Pat. No. 6,720,586 issued Apr. 13, 2004.

BACKGROUND OF THE INVENTION

The present invention relates to a method of fabricating a nitride semiconductor for use in a short-wavelength semiconductor laser diode and the like expected to be applied to the fields of optical information processing and the like, a semiconductor device and a semiconductor light emitting device using the nitride semiconductor and a method of fabricating the same.

Recently, a nitride semiconductor of a group III–V compound, that is, a group V element including nitride (N), is regarded as a promising material for a short-wavelength light emitting device due to its large energy gap. In particular, a gallium nitride-based compound semiconductor ($Al_xGa_yIn_zN$, wherein $0 \leq x, y, z \leq 1$ and $x+y+z=1$) has been earnestly studied and developed, resulting in realizing a practical blue or green light emitting diode (LED) device. Furthermore, in accordance with capacity increase of an optical disk unit, a semiconductor laser diode lasing at approximately 400 nm is earnestly desired, and a semiconductor laser diode using a gallium nitride-based semiconductor is to be practically used.

CONVENTIONAL EXAMPLE 1

Now, a gallium nitride-based semiconductor laser diode according to Conventional Example 1 will be described with reference to drawings.

FIG. 37 shows the sectional structure of the conventional gallium nitride-based semiconductor laser diode showing laser action. As is shown in FIG. 37, the conventional semiconductor laser diode includes a buffer layer 302 of gallium nitride (GaN), an n-type contact layer 303 of n-type GaN, an n-type cladding layer 304 of n-type aluminum gallium nitride (AlGaN), an n-type light guiding layer 305 of n-type GaN, a multiple quantum well (MQW) active layer 306 including gallium indium nitride layers having different composition ratios of indium ($Ga_{1-x}In_xN/Ga_{1-y}In_yN$, wherein $0<y<x<1$), a p-type light guiding layer 307 of p-type GaN, a p-type cladding layer 308 of p-type AlGaN and a p-type contact layer 309 of p-type GaN successively formed on a substrate 301 of sapphire by, for example, metal organic vapor phase epitaxial growth (MOVPE).

An upper portion of the p-type cladding layer 308 and the p-type contact layer 309 is formed into a ridge with a width of approximately 3 through 10 $\mu$m. A lamination body including the MQW active layer 306 is etched so as to expose part of the n-type contact layer 303, and the upper face and the side faces of the etched lamination body are covered with an insulating film 310. In a portion of the insulating film 310 above the p-type contact layer 309, a stripe-shaped opening is formed, a p-side electrode 311 in ohmic contact with the p-type contact layer 309 through the opening is formed over a portion of the insulating film 310 above the ridge. Also, on a portion of the n-type contact layer 303 not covered with the insulating film 310, an n-side electrode 312 in ohmic contact with the n-type contact layer 303 is formed.

In the semiconductor laser diode having the aforementioned structure, when a predetermined voltage is applied to the p-side electrode 311 with the n-side electrode 312 grounded, optical gain is generated within the MQW active layer 306, so as to show laser action at a wavelength of approximately 400 nm.

The wavelength of laser action depends upon the composition ratios x and y or the thicknesses of the $Ga_{1-x}In_xN$ and $Ga_{1-y}In_yN$ layers included in the MQW active layer 306. At present, the laser diode having this structure has been developed to show continuous laser action at room temperature or more.

Furthermore, laser action in the fundamental mode of the lateral mode along a horizontal direction (parallel to the substrate surface) can be shown by adjusting the width or height of the ridge. Specifically, the laser action of the fundamental lateral mode can be shown by providing a difference in the light confinement coefficient between the fundamental lateral mode and a primary or higher mode.

The substrate 301 is formed from, apart from sapphire, silicon carbide (SiC), neodymium gallate ($NdGaO_3$) or the like, and any of these materials cannot attain lattice match with gallium nitride and is difficult to attain coherent growth. As a result, any of these materials includes a large number of mixed dislocations, namely, mixed presence of edge dislocations, screw dislocations and other dislocations. For example, when the substrate is made from sapphire, the substrate includes dislocations at a density of approximately $1 \times 10^9$ cm$^{-2}$, which degrades the reliability of the semiconductor laser diode.

As a method for reducing the density of dislocations, epitaxial lateral overgrowth (ELOG) has been proposed. This is an effective method for reducing threading dislocations in a semiconductor crystal with large lattice mismatch.

CONVENTIONAL EXAMPLE 2

FIG. 38 schematically shows the distribution of crystal dislocations in a semiconductor layer of gallium nitride formed by the ELOG.

The outline of the ELOG will be described with reference to FIG. 38. First, a seed layer 402 of GaN is grown on a substrate 401 of sapphire by the MOVPE or the like.

Next, a dielectric film of silicon oxide or the like is deposited by chemical vapor deposition (CVD) or the like, and the deposited dielectric film is formed into a mask film 403 having an opening pattern in the shape of stripes with a predetermined cycle by photolithography and etching.

Then, a semiconductor layer 404 of GaN is formed on the mask film 403 by selective growth with portions of the seed layer 402 exposed from the mask film 403 used as a seed crystal by the MOVPE or halide vapor phase epitaxial growth.

At this point, although a dislocation high-density region 404a where the dislocation density is approximately $1 \times 10^9$ cm$^{-2}$ is formed in a portion of the semiconductor layer 404 above the opening of the mask film 403, a dislocation low-density region 404b where the dislocation density is approximately $1 \times 10^7$ cm$^{-2}$ can be formed in a portion of the semiconductor layer 404 laterally grown on the mask film 403.

FIG. 39 shows the sectional structure of a semiconductor laser diode whose active area, namely, a ridge working as a current injecting region, is formed above the dislocation low-density region 404b. In FIG. 39, like reference numerals are used to refer to like elements shown in FIGS. 37 and 38.

When the current injecting region is formed above the dislocation low-density region 404b of the MQW active layer 306 in this manner, the reliability of the laser diode can be improved.

As a result of various examinations, the present inventors have found that semiconductor laser diodes according to Conventional Examples 1 and 2 have the following problems:

First, the problems of the growth method of a nitride semiconductor by the ELOG according to Conventional Example 2 will be described.

FIGS. 40(a) through 40(d) schematically show a state where polycrystals 405 of gallium nitride are deposited on the mask film 403 during the growth of the semiconductor layer 404 so as to degrade the crystallinity of the semiconductor layer 404.

Specifically, the mask film 403 having the openings is first formed on the seed layer 402 as is shown in FIG. 40(a), and plural semiconductor layers 404 are respectively grown by using, as the seed crystal, the portions of the seed layer 402 exposed in the openings of the mask film 403 as is shown in FIG. 40(b). At this point, since the mask film 403 is formed from a dielectric, plural polycrystals 405 that cannot be crystallized on a dielectric may be deposited on the mask film 403.

Next, as is shown in FIGS. 40(c) and 40(d), when the plural semiconductor layers 404 are grown to be integrated and to have a flat face with the polycrystals 405 deposited, a region 404c with poor crystallinity is formed on each polycrystal 405.

The present inventors have found that a laser diode with good characteristics cannot be obtained when the current injecting region is formed above the region 404c with poor crystallinity.

Second, the present inventors have found a problem that, in the semiconductor laser diode according to Conventional Example 1 or 2, it is difficult to increase the light confinement coefficient of the active layer along a direction vertical to the substrate surface.

FIG. 41 shows the relationship, in the semiconductor laser diode of Conventional Example 1, between the distribution of a refractive index of the MQW active layer 306 along the direction vertical to the substrate surface and the distribution of light intensity on a cavity facet. It is understood that part of generated light confined within the MQW active layer 306 leaks to the substrate 301 so as to generate a standing wave in the n-type contact layer 303. When the generated light is thus largely leaked from the MQW active layer 306 to the substrate 301, the light confinement ratio in the MQW active layer 306 is lowered, resulting in increasing the threshold value for laser action.

Also, FIG. 42 shows a far-field pattern of the laser diode of Conventional Example 1. In this drawing, the abscissa indicates a shift of emitted light from the normal direction of the cavity facet toward the horizontal direction (along the substrate surface), and the ordinate indicates light intensity of the emitted light. When the generated light is largely leaked to the substrate 301 as in Conventional Example 1, it is also difficult to obtain a unimodal far-field pattern. This goes for the semiconductor laser diode of Conventional Example 2.

Thirdly, the semiconductor laser diode of Conventional Example 1 has a problem that, in dividing plural laser diodes formed on a wafer into individual laser chips by, for example, cleavage, the facet of the cavity cannot be flat because the substrate of sapphire and the nitride semiconductor layer have different crystal planes. Specifically, as is shown in FIG. 43, sapphire forming the substrate 301 is easily cleaved on the (1–100) surface orientation, namely, the so-called M plane, and hence, the substrate is generally cleaved on the M plane of sapphire.

However, the M plane of a nitride semiconductor, for example, gallium nitride is shifted from the M plane of sapphire by 30 degrees in the plane, and hence, the M plane of sapphire accords with the (11–20) surface orientation, namely, the so-called A plane, of gallium nitride. Accordingly, when the substrate 301 is cleaved, cleaved ends of the buffer layer 302 and the lamination body above are shifted from that of the substrate 301 by 30 degrees so as to appear as an irregular face with level differences of several hundreds nm.

When the cavity facet is such an irregular face, mirror loss of laser at the cavity facet is increased, so as to increase the operation current of the semiconductor laser diode, which can degrade the reliability of the semiconductor laser diode. Furthermore, since the irregularities are randomly formed on the cavity facet, it is difficult to form with good reproducibility a cavity facet having a predetermined reflectance, which lowers the yield. Even when the cavity is formed not by cleavage but by dry etching, the same problem arises. Herein, a minus sign "–" used in a surface orientation indicates inversion of an index following the minus sign.

On the other hand, in the semiconductor laser diode of Conventional Example 2, the stripe-shaped opening of the mask film 403 for the selective growth is formed parallel to the M-axis of the semiconductor layer 404. This is because a rate of the lateral growth along the A-axis is much higher than in other directions, and hence, the selective growth can be effectively proceeded in a short period of time. Therefore, the dislocation low-density region 404b is parallel to the M-axis, and therefore, the cavity facet of the laser diode formed above the dislocation low-density region naturally accords with the M plane. As a result, it is necessary to cleave the substrate 401 on the A plane. Although sapphire can be easily cleaved on the M plane as described above, it cannot be easily cleaved on the A plane, which largely lowers the yield of the semiconductor laser diode.

Fourthly, it is known that an angle (tilt) between the C-axis of the seed layer 402 and the C-axis of the semiconductor layer 404 selectively grown above the seed layer 402 is approximately 0.1 through 1 degree in the ELOG.

On the other hand, when the ELOG is conducted again by using the dislocation low-density region 404b obtained by the ELOG as the seed crystal and covering the dislocation high-density region 404a with another mask film for selective growth, a nitride semiconductor crystal can be obtained merely from the dislocation low-density region 404b. Accordingly, a cavity having a facet according to the A plane can be formed on the crystal formed from merely the dislocation low-density region 404b, resulting in largely increasing the yield in the cleavage.

When the cavity is formed along the A-axis, however, a waveguide is formed in a zigzag manner along the C-axis because of the tilt of the C-axis between the seed layer 402 and the selectively grown layer above the seed layer 402 as described above. Such a zigzag waveguide causes waveguide loss, resulting in a problem of increase of the operation current of the laser diode. Moreover, in a vertical cavity surface emitting laser diode array where plural cavitys are arranged in a direction vertical to the substrate surface, there arises a problem that the directions of emitting laser beams from the respective cavitys in the array do not accord with one another.

Fifthly, in the semiconductor laser diode of Conventional Example 2, the width of the dislocation low-density region 404$b$ is as small as approximately 5 $\mu$m, and it is necessary to align a photomask for the ridge with a width of approximately 3 $\mu$m so as not to miss the dislocation low-density region 404$b$. Accordingly, high accuracy is required for alignment in the photolithography, which lowers the throughput and the yield in the photolithography. As a result, there arises a problem that productivity cannot be improved.

SUMMARY OF THE INVENTION

The present invention was devised in consideration of the aforementioned various conventional problems. A first object of the invention is improving crystallinity in ELOG, a second object is increasing a light confinement coefficient of a cavity, a third object is forming a cavity facet with small mirror loss, a fourth object is forming a cavity with small waveguide loss, and a fifth object is easing alignment of a mask for forming a ridge. By achieving these objects, the invention exhibits an excellent effect, in particular, in application to a laser diode for use in an optical disk unit.

The first method of fabricating a nitride semiconductor of this invention achieves the fist object and comprises the steps of forming, on a substrate, a first nitride semiconductor layer of $Al_uGa_vIn_wN$, wherein $0 \leq u$, v, w 1 and u+v+w=1; forming, in an upper portion of the first nitride semiconductor layer, plural convexes extending at intervals along a substrate surface direction; forming a mask film for covering bottoms of recesses formed between the convexes adjacent to each other; and forming, on the first nitride semiconductor layer, a second nitride semiconductor layer of $Al_xGa_yIn_zN$, wherein $0 \leq x$, y, $z \leq 1$ and x+y+z=1, by using, as a seed crystal, C planes corresponding to top faces of the convexes exposed from the mask film.

In the first method of fabricating a nitride semiconductor, the plural convexes are formed in the upper portion of the first nitride semiconductor layer and the bottoms of the recesses sandwiched between the convexes are covered with the mask film. Therefore, the second nitride semiconductor layer is grown by using, as the seed crystal, merely the C planes appearing on the top faces of the convexes of the first nitride semiconductor layer. As a result, even when polycrystals of the second nitride semiconductor layer are deposited on the mask film, the second nitride semiconductor layer grows over the polycrystals in the growth along a direction parallel to the substrate surface (lateral growth) owing to the mask film formed on the bottoms of the recesses between the convexes. Accordingly, the second nitride semiconductor layer is never prevented from growing by the polycrystals, resulting in attaining good crystallinity.

The second method of fabricating a nitride semiconductor of this invention achieves the first object and comprises the steps of forming, on a substrate, a first nitride semiconductor layer of $Al_uGa_vIn_wN$, wherein $0 \leq u$, v, $w \leq 1$ and u+v+w=1; forming, in an upper portion of the first nitride semiconductor layer, plural convexes extending at intervals along a substrate surface direction; forming a mask for covering bottoms and at least part of walls of recesses formed between the convexes adjacent to each other; and forming, on the first nitride semiconductor layer, a second nitride semiconductor layer of $Al_xGa_yIn_zN$, wherein $0 \leq x$, y, $z \leq 1$ and x+y+z=1, by using, as a seed crystal, portions of the convexes exposed from the mask film.

In the second method of fabricating a nitride semiconductor, even when polycrystals of the second nitride semiconductor layer are deposited on the mask film in growing the second nitride semiconductor layer in a direction parallel to the substrate surface, the second nitride semiconductor layer grows over the polycrystals owing to the mask film formed on the bottoms and at least part of the walls of the recesses between the convexes. Accordingly, the second nitride semiconductor layer is never prevented from growing by the polycrystals, resulting in attaining good crystallinity.

The first method of fabricating a nitride semiconductor device of this invention achieves the first object and comprises the steps of forming a first nitride semiconductor layer on a substrate; forming, in an upper portion of the first nitride semiconductor layer, plural grooves extending at intervals along a substrate surface direction; forming a mask film for covering bottoms of the grooves; growing, by using, as a seed crystal, C planes corresponding to portions of a top face of the first nitride semiconductor layer exposed from the mask film between the grooves, a lamination body including a second nitride semiconductor layer, an active layer formed from a third nitride semiconductor layer having a smaller energy gap than the second nitride semiconductor layer and a fourth nitride semiconductor layer having a larger energy gap than the active layer stacked in this order from a substrate side; and forming, on the lamination body, a current confinement part for selectively injecting carriers into the active layer.

In the first method of fabricating a nitride semiconductor device, the lamination body including the active layer is formed by the first method of fabricating a nitride semiconductor of this invention. Accordingly, the active layer and the nitride semiconductor layers sandwiching the active layer in the vertical direction attain good crystallinity. As a result, there liability of the semiconductor device can be largely improved.

The second method of fabricating a nitride semiconductor device of this invention achieves the first object and comprises the steps of forming a first nitride semiconductor layer on a substrate; forming, in an upper portion of the first nitride semiconductor layer, plural grooves extending at intervals along a substrate surface direction; forming a mask film for covering bottoms and at least part of walls of the grooves; growing, by using, as a seed crystal, portions of the first nitride semiconductor layer exposed from the mask film between the grooves, a lamination body including a second nitride semiconductor layer, an active layer formed from a third nitride semiconductor layer having a smaller energy gap than the second nitride semiconductor layer and a fourth nitride semiconductor layer having a larger energy gap than the active layer stacked in this order from a substrate side; and forming, on the lamination body, a current confinement part for selectively injecting carriers into the active layer.

In the second method of fabricating a nitride semiconductor device, the lamination body including the active layer is formed by the second method of fabricating a nitride semiconductor of this invention. Accordingly, the active layer and the nitride semiconductor layers sandwiching the active layer in the vertical direction attain good crystallinity. As a result, the reliability of the semiconductor device can be largely improved.

The third method of fabricating a nitride semiconductor of this invention achieves the first object and comprises the steps of forming, in an upper portion of a substrate, plural convexes extending at intervals along a substrate surface direction; and selectively growing a nitride semiconductor layer of $Al_xGa_yIn_zN$, wherein $0 \leq x, y, z \leq 1$ and $x+y+z=1$, on top faces of the convexes of the substrate.

In the third method of fabricating a nitride semiconductor, not only the same effect as that of the first method of fabricating a nitride semiconductor can be attained but also there is no need to form a semiconductor layer as a seed crystal because the convexes in the shape of stripes are formed in the substrate itself. Furthermore, when the substrate is not a nitride semiconductor, there is no need to provide a mask film for selective growth, resulting in largely simplifying the fabrication process of the semiconductor.

The third method of fabricating a nitride semiconductor device of this invention achieves the first object and comprises the steps of forming, in an upper portion of a substrate, plural grooves extending at intervals along a substrate surface direction; selectively growing, on a top face of the substrate between the grooves, a lamination body including a first nitride semiconductor layer, an active layer formed from a second nitride semiconductor layer having a smaller energy gap than the first nitride semiconductor layer and a third nitride semiconductor layer having a larger energy gap than the active layer stacked in this order from a substrate side; and forming, on the lamination body, a current confinement part f or selectively injecting carriers into the active layer.

In the third method of fabricating a nitride semiconductor device, the lamination body including the active layer is formed by the third method of fabricating a nitride semiconductor of this invention. Accordingly, the active layer and the nitride semiconductor layers sandwiching the active layer in the vertical direction attain good crystallinity and the fabrication process can be largely simplified, resulting in improving the productivity.

The first nitride semiconductor device of this invention achieves the second object and comprises a lamination body including a first nitride semiconductor layer, an active layer formed from a second nitride semiconductor layer having a larger refractive index than the first nitride semiconductor layer and a third nitride semiconductor layer having a smaller refractive index than the active layer successively stacked on a substrate; and a current confinement part formed on the lamination body for selectively injecting carriers into the active layer, and a gap is formed in a region below the current confinement part and between the active layer and the substrate.

In the first nitride semiconductor device, the gap with a smaller refractive index than the semiconductor is formed in the region below the current confinement part and between the active layer and the substrate. Accordingly, light generated in the active layer is less leaked to the substrate, resulting in increasing the confinement coefficient of the generated light in the active layer.

The second nitride semiconductor device of this invention achieves the second object and comprises a first nitride semiconductor layer formed on a substrate and including, in an upper portion thereof, plural convexes extending at intervals along a substrate surface direction; a second nitride semiconductor layer formed on the first nitride semiconductor layer with a lower face thereof in contact with top faces of the convexes; and a lamination body formed on the second nitride semiconductor layer and including a third nitride semiconductor layer, an active layer formed from a fourth nitride semiconductor layer having a larger refractive index than the third nitride semiconductor layer and a fifth nitride semiconductor layer having a smaller refractive index than the active layer, and the second nitride semiconductor layer has a refractive index smaller than or equivalent to a refractive index of the third nitride semiconductor layer.

In the second nitride semiconductor device, the second nitride semiconductor layer is grown by using, as the seed crystal, the top faces of the convexes formed in the shape of stripes in the upper portion of the first nitride semiconductor layer. Accordingly, gaps are formed between the convexes of the first nitride semiconductor layer below the second nitride semiconductor layer. Furthermore, the second nitride semiconductor layer has a refractive index smaller than or equivalent to that of the third nitride semiconductor layer, the light confinement coefficient in the active layer can be definitely increased by providing a current confinement part in the lamination body above the gap.

The fourth method of fabricating a nitride semiconductor device of this invention achieves the second object and comprises the steps of forming a first nitride semiconductor layer on a substrate; forming, in an upper portion of the first nitride semiconductor layer, plural grooves extending at intervals along a substrate surface direction; forming a mask film for covering bottoms of the grooves; growing, by using, as a seed crystal, C planes corresponding to portions of a top face of the first nitride semiconductor layer exposed from the mask film between the grooves, a lamination body including a second nitride semiconductor layer, a third nitride semiconductor layer, an active layer formed from a fourth nitride semiconductor layer having a larger refractive index than the third nitride semiconductor layer and a fifth nitride semiconductor layer having a smaller refractive index than the active layer stacked in this order from a substrate side; and forming, on the lamination body, a current confinement part for selectively injecting carriers into the active layer, and the step of growing the lamination body includes a sub-step of growing the second nitride semiconductor layer with a refractive index thereof smaller than or equivalent to a refractive index of the third nitride semiconductor layer.

According to the fourth method of fabricating a nitride semiconductor device, the second nitride semiconductor device of the invention can be definitely fabricated.

The fifth method of fabricating a nitride semiconductor device of this invention achieves the second object and comprises the steps of forming a first nitride semiconductor layer on a substrate; forming, in an upper portion of the first nitride semiconductor layer, plural grooves extending at intervals along a substrate surface direction; forming a mask film for covering bottoms and at least part of walls of the grooves; growing, by using, as a seed crystal, portions of the first nitride semiconductor layer exposed from the mask film between the grooves, a lamination body including a second nitride semiconductor layer, a third nitride semiconductor layer, an active layer formed from a fourth nitride semiconductor layer having a larger refractive index than the third nitride semiconductor layer and a fifth nitride semiconductor layer having a smaller refractive index than the active layer stacked in this order from a substrate side; and forming, on the lamination body, a current confinement part for selectively injecting carriers into the active layer, and the step of growing the lamination body includes a sub-step of growing the second nitride semiconductor layer with a refractive index thereof smaller than or equivalent to a refractive index of the third nitride semiconductor layer.

According to the fifth method of fabricating a nitride semiconductor device, the second nitride semiconductor device of the invention can be definitely fabricated.

The fourth method of fabricating a nitride semiconductor of this invention achieves the third object and comprises the steps of forming, on a substrate, a first nitride semiconductor layer of $Al_uGa_vIn_wN$, wherein $0 \leq u, v, w \leq 1$ and $u+v+w=1$; forming, in an upper portion of the first nitride semiconductor layer, plural convexes extending at intervals along a substrate surface direction; forming a mask film for covering bottoms of recesses formed between the convexes adjacent to each other; and growing, on the first nitride semiconductor layer, plural second nitride semiconductor layers of $Al_xGa_yIn_zN$, wherein $0 \leq x, y, z \leq 1$ and $x+y+z=1$, by using, as a seed crystal, C planes corresponding to top faces of the convexes exposed from the mask film, and the step of forming the plural second nitride semiconductor layers includes a sub-step of forming each of the second nitride semiconductor layers in a manner that a facet of the second nitride semiconductor layer parallel to a direction of extending the convexes is exposed every time the second nitride semiconductor layer extends over a given number of convexes among the plural convexes.

In the fourth method of fabricating a nitride semiconductor, each of the second nitride semiconductor layers is formed so as to expose the facet parallel to the direction of extending the convexes every time the second nitride semiconductor layer extends over a given number of convexes among the plural convexes formed in the upper portion of the first nitride semiconductor layer. Accordingly, when the facet is used as a cavity facet, the cavity facet is obtained without being affected by a cleaved end and an etched end, resulting in reducing mirror loss of the cavity facet.

The fifth method of fabricating a nitride semiconductor of this invention achieves the third object and comprises the steps of forming, on a substrate, a first nitride semiconductor layer of $Al_uGa_vIn_wN$, wherein $0 \leq u, v, w \leq 1$ and $u+v+w=1$; forming, in an upper portion of the first nitride semiconductor layer, plural convexes extending at intervals along a substrate surface direction; forming a mask film for covering bottoms and at least part of walls of recesses formed between the convexes adjacent to each other; and forming, on the first nitride semiconductor layer, plural second nitride semiconductor layers of $Al_xGa_yIn_zN$, wherein $0 \leq x, y, z \leq 1$ and $x+y+z=1$, by using, as a seed crystal, portions of the convexes exposed from the mask film, and the step of forming the plural second nitride semiconductor layers includes a sub-step of forming each of the second nitride semiconductor layers in a manner that a facet of the second nitride semiconductor layer parallel to a direction of extending the convexes is exposed every time the second nitride semiconductor layer extends over a given number of convexes among the plural convexes.

In the fifth method of fabricating a nitride semiconductor, each of the second nitride semiconductor layers is formed so as to expose the facet parallel to the direction of extending the convexes every time the second nitride semiconductor layer extends over a given number of convexes among the plural convexes formed in the upper portion of the first nitride semiconductor layer. Accordingly, when the facet is used as a cavity facet, the cavity facet is obtained without being affected by a cleaved end or an etched end, resulting in reducing mirror loss of the cavity facet.

The sixth method of fabricating a nitride semiconductor device of this invention achieves the third object and comprises the steps of forming a first nitride semiconductor layer on a substrate; forming, in an upper portion of the first nitride semiconductor layer, plural grooves extending at intervals along a substrate surface direction; forming a mask film for covering bottoms of the grooves; growing, by using, as a seed crystal, C planes corresponding to portions of a top face of the first nitride semiconductor layer exposed from the mask film between the grooves, plural lamination bodies each including a second nitride semiconductor layer, an active layer formed from a third nitride semiconductor layer having a smaller energy gap than the second nitride semiconductor layer and a fourth nitride semiconductor layer having a larger energy gap than the active layer stacked in this order from a substrate side; and forming, on each of the lamination bodies, a current confinement part for selectively injecting carriers into the active layer, and the step of growing the plural lamination bodies includes a sub-step of forming each of the lamination bodies in a manner than a cavity facet including the current confinement part is exposed every time the lamination body extends over a given number of C planes of the first nitride semiconductor layer.

In the sixth method of fabricating a nitride semiconductor device, the lamination bodies each including the active layer are formed by the fourth method of fabricating a nitride semiconductor of this invention. Accordingly, the cavity facet is obtained without being affected by a cleaved end or an etched end, resulting in reducing mirror loss of the cavity facet.

The seventh method of fabricating a nitride semiconductor device of this invention achieves the third object and comprises the steps of forming a first nitride semiconductor layer on a substrate; forming, in an upper portion of the first nitride semiconductor layer, plural grooves extending at intervals along a substrate surface direction; forming a mask film for covering bottoms and at least part of walls of the grooves; growing, by using, as a seed crystal, portions of the first nitride semiconductor layer exposed from the mask film between the grooves, plural lamination bodies each including a second nitride semiconductor layer, an active layer formed from a third nitride semiconductor layer having a smaller energy gap than the second nitride semiconductor layer and a fourth nitride semiconductor layer having a larger energy gap than the active layer stacked in this order from a substrate side; and forming, on each of the lamination bodies, a current confinement part for selectively injecting carriers into the active layer, and the step of growing the plural lamination bodies includes a sub-step of forming each of the lamination bodies in a manner than a cavity facet including the current confinement part is exposed every time the lamination body extends over a given number of portions of the first nitride semiconductor layer sandwiched between the grooves adjacent to each other.

In the seventh method of fabricating a nitride semiconductor device, the lamination bodies each including the active layer are formed by the fifth method of fabricating a nitride semiconductor of this invention. Accordingly, the cavity facet is obtained without being affected by a cleaved end or an etched end, resulting in reducing mirror loss of the cavity facet.

The third nitride semiconductor device of this invention achieves the third and fourth objects and comprises a first nitride semiconductor layer formed on a substrate and including, in an upper portion thereof, plural convexes extending at intervals along a substrate surface direction; a second nitride semiconductor layer formed on the first nitride semiconductor layer with gaps formed between side faces of the convexes; and a third nitride semiconductor layer formed on the second nitride semiconductor layer and including a cavity in the shape of a stripe into which confined carriers are injected, and the cavity is provided with a resonating direction of generated light substantially perpendicular to a direction of extending the convexes.

In the third nitride semiconductor device, the cavity is provided so that the resonating direction of generated light can be substantially perpendicular to the direction of extending the convexes. Therefore, when the direction of extending the convexes is, for example, the M-axis direction and the resonating direction of the cavity is the A-axis direction, the cavity facet accords with the A plane. Accordingly, when the substrate is formed from sapphire, the cleaved end of the substrate is the M plane, and hence, the cleave can be eased so as to improve the yield in the cleavage. Also, in this case, although the cavity crosses plural convexes working as the seed crystal, the waveguide loss is also reduced because the tilt in the C-axis between the first nitride semiconductor layer and the second nitride semiconductor layer is suppressed by the gaps formed in the first nitride semiconductor layer between the side faces of the convexes.

The eighth method of fabricating a nitride semiconductor device of this invention achieves the third and fourth objects and comprises the steps of forming a first nitride semiconductor layer on a substrate; forming, in an upper portion of the first nitride semiconductor layer, plural first grooves extending at intervals along one substrate surface direction; forming a first mask film for covering bottoms of the first grooves; growing a second nitride semiconductor layer by using, as a seed crystal, C planes corresponding to portions of a top face of the first nitride semiconductor layer exposed from the first mask film between the first grooves; forming, in an upper portion of the second nitride semiconductor layer, plural second grooves extending at intervals in the one substrate surface direction and having portions between the second grooves adjacent to each other in different positions, in a substrate surface direction, from the portions between the first grooves adjacent to each other; forming a second mask film for covering bottoms of the second grooves; growing a third nitride semiconductor layer including an active layer by using, as a seed crystal, C planes corresponding to portions of a top face of the second nitride semiconductor layer exposed from the second mask film between the second grooves; and forming, on the third nitride semiconductor layer, a current confinement part with a resonating direction of generated light substantially perpendicular to the one substrate surface direction.

According to the eighth method of fabricating a nitride semiconductor device, the third nitride semiconductor device of the invention can be definitely fabricated.

The ninth method of fabricating a nitride semiconductor device of this invention achieves the third and fourth objects and comprises the steps of forming a first nitride semiconductor layer on a substrate; forming, in an upper portion of the first nitride semiconductor layer, plural first grooves extending at intervals along one substrate surface direction; forming a first mask film for covering bottoms and at least part of walls of the first grooves; growing a second nitride semiconductor layer by using, as a seed crystal, portions of the first nitride semiconductor layer exposed from the first mask film between the first grooves; forming, in an upper portion of the second nitride semiconductor layer, plural second grooves extending at intervals along the one substrate surface direction and having portions between the second grooves adjacent to each other in positions different, in a substrate surface direction, from portions between the first grooves adjacent to each other; forming a second mask film for covering bottoms and at least part of walls of the second grooves; growing a third nitride semiconductor layer including an active layer by using, as a seed crystal, portions of the second nitride semiconductor layer exposed from the second mask film between the second grooves; and forming, on the third nitride semiconductor layer, a current confinement part with a resonating direction of generated light substantially perpendicular to the one substrate surface direction.

According to the ninth method of fabricating a nitride semiconductor device, the third nitride semiconductor device of the invention can be definitely fabricated.

The semiconductor light emitting device of this invention achieves the fifth object and comprises a first semiconductor layer formed on a substrate and including, in an upper portion thereof, plural first convexes extending at intervals along a substrate surface direction; and a second semiconductor layer formed from a lamination body including an active layer on the first semiconductor layer in contact with the first convexes and including, in an upper portion thereof, plural second convexes extending in a direction the same as the first convexes at intervals different from the intervals of the first convexes, and carriers are injected into the active layer from a top face of one of the plural second convexes.

The second semiconductor layer generally formed by the ELOG includes a large number of threading dislocations in regions above the first convexes, and hence, it is necessary to form a current injecting region in a position excluding such regions. In the semiconductor light emitting device of this invention, since there is a difference between the formation cycle of the first convexes and the formation cycle of the second convexes, there appears, on the substrate, a region where the first convex accords with the second convex in a cycle larger than the formation cycles of these convexes. An alignment mark can be easily and definitely provided by using this large cycle, resulting in improving the yield and the throughput of the fabrication process.

The first method of fabricating a semiconductor light emitting device of this invention achieves the fifth object and comprises the steps of forming a first semiconductor layer on a substrate and forming, in an upper portion of the first semiconductor layer, plural first convexes extending at intervals along a substrate surface direction; forming, on the first semiconductor layer, a second semiconductor layer having a lower face in contact with the first convexes from a lamination body including an active layer, and forming, in an upper portion of the second semiconductor layer, plural second convexes extending in a direction the same as the first convexes at intervals different from the intervals of the first convexes; forming, on the substrate, a mark for aligning a mask for identifying a convex for injecting carriers into the active layer among the plural second convexes; and aligning the mask by using the mark and forming one of the plural second convexes into a carrier injection part by using the mask.

According to the first method of fabricating a semiconductor light emitting device, the semiconductor light emitting device of this invention can be definitely fabricated.

The second method of fabricating a semiconductor light emitting device of this invention achieves the fifth object and comprises the steps of forming a first nitride semiconductor layer on a substrate; forming, in an upper portion of the first nitride semiconductor layer, plural grooves extending at intervals in a substrate surface direction; forming a mask film for covering bottoms of the grooves; growing, by using, as a seed crystal, C planes corresponding to portions of a top face of the first nitride semiconductor layer exposed from the mask film between the grooves, a lamination body including a second nitride semiconductor layer, an active layer formed from a third nitride semiconductor layer having a smaller energy gap than the second nitride semiconductor layer and a fourth nitride semiconductor layer having a larger energy gap than the active layer stacked in this order from a substrate side; forming, in an upper portion of the lamination body, plural convexes extending in a direction the same as the grooves at intervals different from the intervals of the grooves; and selecting one convex in a position above any of the grooves and in the vicinity of an area between the grooves among the plural convexes and forming the selected convex into a carrier injection part for injecting carriers into the active layer.

According to the second method of fabricating a semiconductor light emitting device, the semiconductor light emitting device of this invention can be definitely fabricated.

The third method of fabricating a semiconductor light emitting device of this invention achieves the fifth object and comprises the steps of forming a first nitride semiconductor layer on a substrate; forming, in an upper portion of the first nitride semiconductor layer, plural grooves extending at intervals in a substrate surface direction; forming a mask film for covering bottoms and at least part of walls of the grooves; growing, by using, as a seed crystal, portions of the first nitride semiconductor layer exposed from the mask film between the grooves, a lamination body including a second nitride semiconductor layer, an active layer formed from a third nitride semiconductor layer having a smaller energy gap than the second nitride semiconductor layer and a fourth nitride semiconductor layer having a larger energy gap than the active layer stacked in this order from a substrate side; forming, in an upper portion of the lamination body, plural convexes extending in a direction the same as the grooves at intervals different from the intervals of the grooves; and selecting one convex in a position above any of the grooves and in the vicinity of an area between the grooves among the plural convexes and forming the selected convex into a carrier injection part for injecting carriers into the active layer.

According to the third method of fabricating a semiconductor light emitting device, the semiconductor light emitting device of this invention can be definitely fabricated.

BRIEF DESCRIPTION OF THE DRAWINGS

FIGS. 36(a) and 36(b) show the fabrication of the gallium nitride-based semiconductor laser diode of Embodiment 7, wherein FIG. 36(a) is a cross-sectional view of an appropriate ridge and an inappropriate ridge for use in current injection and FIG. 36(b) is a cross-sectional view of a state where identification marks are cyclically provided on respective ridges;

DETAILED DESCRIPTION OF THE INVENTION

Embodiment 1

Embodiment 1 of the invention will now be described with reference to the accompanying drawings.

Figure 1:
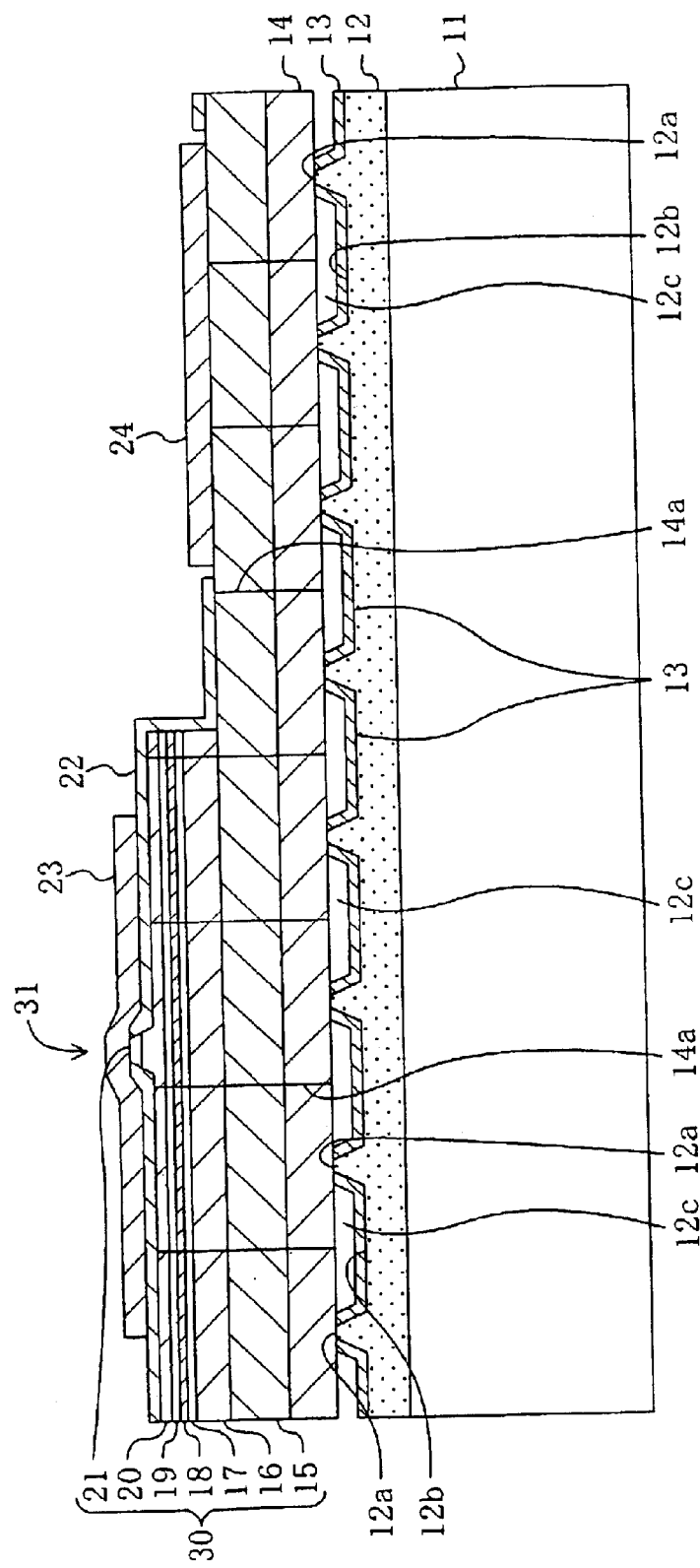
FIG. 1 is a cross-sectional view for showing the structure of a gallium nitride-based semiconductor laser diode according to Embodiment 1 of the invention.

FIG. 1 shows the sectional structure of a gallium nitride-based semiconductor laser diode according to this embodiment.

As is shown in FIG. 1, on a substrate 11 of sapphire (crystalline $Al_2O_3$), a seed layer 12 of gallium nitride (GaN) for ELOG is formed with a low temperature buffer layer (not shown) of GaN sandwiched therebetween.

Convexes 12a in the shape of stripes extending at intervals along a substrate surface direction are formed in an upper portion of the seed layer 12, and a mask film 13 of silicon nitride ($SiN_x$) is formed on the bottom and the walls of each concave (groove) 12b formed between the convexes 12a.

On the seed layer 12, a selectively grown layer 14 of GaN is formed so as to be in contact with the respective convexes 12a and to have gaps 12c between its lower face and the bottoms of the grooves 12b.

The group III elements of the seed layer 12 and the selectively grown layer 14 are not limited to gallium but may include aluminum and indium. Specifically, the materials for the seed layer 12 and the selectively grown layer 14 are represented by $Al_uGa_vIn_wN$, wherein $0 \leq u, v, w \leq 1$ and $u+v+w=1$.

On the selectively grown layer 14, a lamination body 30 consisting of plural nitride semiconductor layers including double heterojunction of the laser diode is formed.

Specifically, the lamination body 30 includes an n-type contact layer 15 of n-type GaN, an n-type cladding layer 16 of n-type $Al_{0.07}Ga_{0.93}N$, an n-type light guiding layer 17 of n-type GaN, a multiple quantum well (MQW) active layer 18 including a well layer of $Ga_{0.8}In_{0.2}N$ with a thickness of approximately 3 nm and a barrier layer of GaN with a thickness of 6 nm, a p-type light guiding layer 19 of p-type GaN, a p-type cladding layer 20 of p-type $Al_{0.07}Ga_{0.93}N$ and a p-type contact layer 21 of p-type GaN successively formed on the selectively grown layer 14.

As is well known, in the double heterojunction type laser structure, the energy gap of the well layer containing indium and included in the MQW active layer 18 is smaller than the energy gap of the n-type and p-type cladding layers 16 and 20 containing aluminum. On the other hand, the refractive index is the largest in the well layer of the MQW active layer 18 and is smaller in the order of the light guiding layers 17 and 19 and the cladding layers 16 and 20.

An upper portion of the p-type cladding layer 20 and the p-type contact layer 21 is formed into a ridge 31 working as a current confining portion corresponding to a current injecting region with a width of approximately 3 through 5 $\mu$m.

The lamination body 30 including the MQW active layer 18 is etched so as to partly expose the n-type contact layer 15, and the top face and the side face of the etched lamination body 30 are covered with an insulating film 22 of silicon oxide.

In a portion of the insulating film 22 on the p-type contact layer 21, an opening parallel to the convex 12a is formed. On a portion of the insulating film 22 over and on both sides of the ridge 31, a p-side electrode 23 including stacked layers of nickel (Ni) and gold (Au) is formed to be in ohmic contact with the p-type contact layer 21 through the opening.

On a portion of the n-type contact layer 15 not covered with the insulating film 22, an n-side electrode 24 including stacked layers of titanium (Ti) and aluminum (Al) is formed so as to be in ohmic contact with the n-type contact layer 15.

At this point, the ridge 31 is formed in a dislocation low-density region including fewer crystal dislocations positioned above the gap 12c.

Now, a method of fabricating the semiconductor laser diode having the aforementioned structure will be described with reference to the accompanying drawings.

FIGS. 2(a), 2(b), 3(a), 3(b) and 4 are sectional views for showing procedures in the method of fabricating the semiconductor laser diode of Embodiment 1.

Figure 2A:
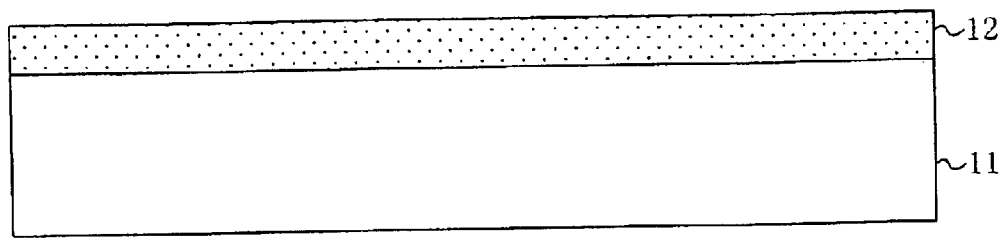
FIGS. 2(a) and 2(b) are cross-sectional views for showing procedures in fabrication of the gallium nitride-based semiconductor laser diode of Embodiment 1.

First, as is shown in FIG. 2(a), after setting the substrate temperature at approximately 500° C. through 530° C., trimethyl gallium (TMG) serving as a group III element source and ammonia (NH$_3$) serving as a nitrogen source are supplied onto a substrate 11 having the C plane (=the (0001) surface orientation) as the principal plane by, for example, MOVPE, thereby depositing a low temperature buffer layer (not shown) of GaN. Subsequently, after increasing the substrate temperature to approximately 1020° C. through 1030° C., TMG and NH$_3$ are supplied onto the substrate 11, thereby growing a seed layer 12 of GaN.

Figure 2B:
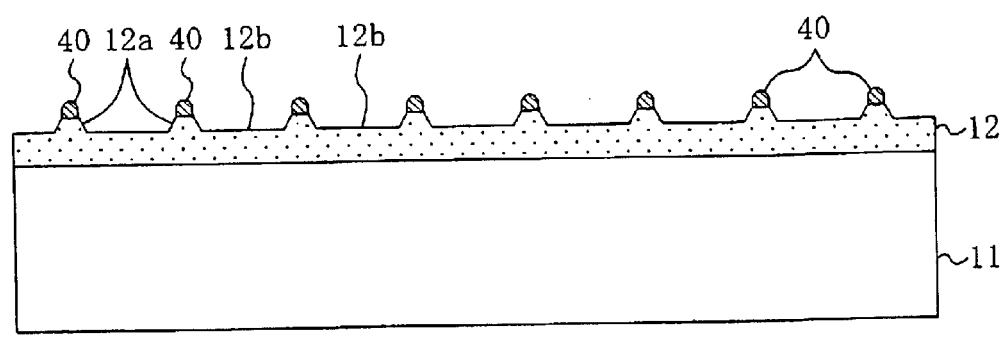

Next, as is shown in FIG. 2(b), after applying a resist film on the seed layer 12, the resist film is patterned into stripes by photolithography, thereby forming a resist pattern 40. Then, the seed layer 12 is dry etched by using the resist pattern 40 as a mask. Thus, a cyclic structure including, as one cycle, a convex 12a with a sectional width of approximately 3 μm and a groove (recess) 12b with a sectional width of approximately 12 μm is formed in the upper portion of the seed layer 12.

Figure 3A:
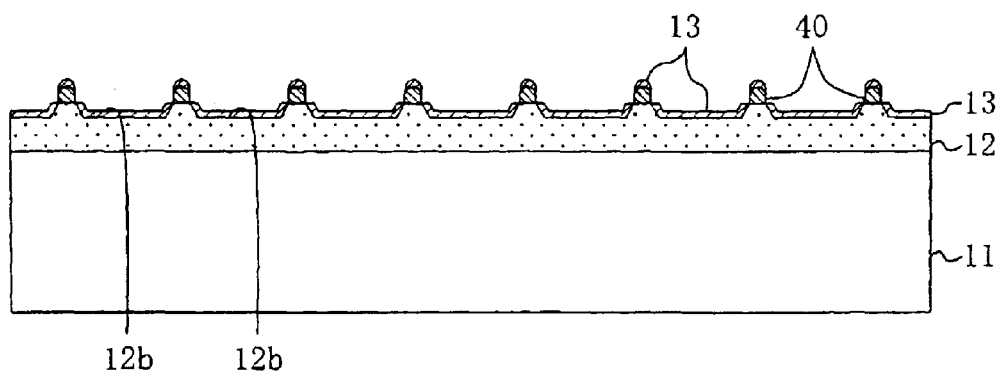
FIGS. 3(a) and 3(b) are cross-sectional views for showing other procedures in the fabrication of the gallium nitride-based semiconductor laser diode of Embodiment 1.

Then, as is shown in FIG. 3(a), a mask film 13 of silicon nitride is deposited on the bottoms and the walls of the grooves 12b of the seed layer 12 and the resist pattern 40 by electron cyclotron resonance (ECR) sputtering. At this point, solid silicon is used as the raw material of silicon, nitrogen is used as a reaction gas and argon is used as plasma gas. Since the ECR sputtering is employed for depositing the mask film 13, the mask film 13 with high quality can be formed at a low temperature.

Figure 3B:
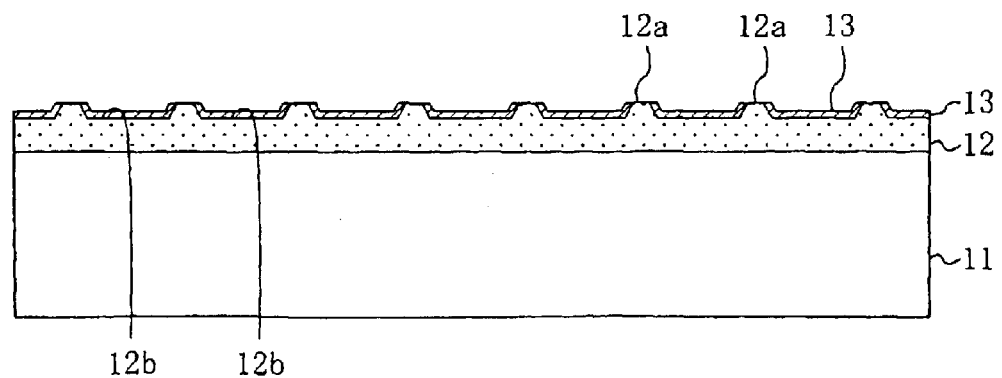

Next, as is shown in FIG. 3(b), the resist pattern 40 is lifted off, thereby removing the resist pattern 40 and a portion of the mask film 13 deposited on the resist pattern 40. The mask film 13 may cover whole or a part of the wall of the groove 12b.

Figure 4:
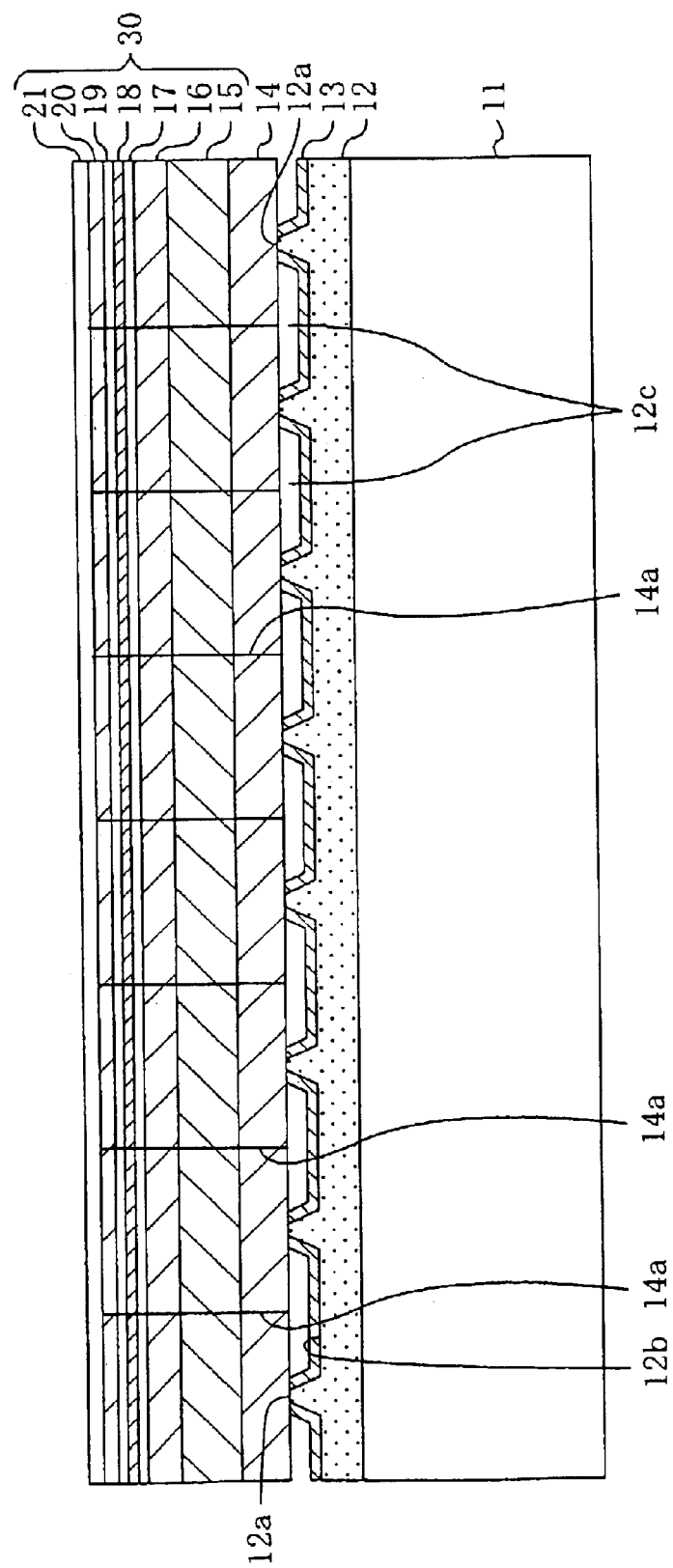
FIG. 4 is a cross-sectional view for showing another procedure in the fabrication of the gallium nitride-based semiconductor laser diode of Embodiment 1.

Subsequently, as is shown in FIG. 4, a selectively grown layer 14 of GaN is grown on the seed layer 12 by the MOVPE again by using, as the seed crystal, the C plane appearing on the top faces of the convexes 12a exposed from the mask film 13. At this point, the selectively grown layer 14 grows upward from the top face of each convex 12a as well as grows along a direction parallel to the substrate surface (i.e., laterally grows). Therefore, the crystals grown from the both sides of each groove 12b meet each other at substantially the center of the groove 12b, so as to form a junction portion 14a. As a result, the respective crystals grown from the top faces of the plural convexes 12a are integrated and the integrated top face accords with the C plane. Subsequently, on the integrated selectively grown layer 14, an n-type contact layer 15, an n-type cladding layer 16, an n-type light guiding layer 17, a MQW active layer 18, a p-type light guiding layer 19, a p-type cladding layer 20 and a p-type contact layer 21 are successively grown, thereby forming a lamination body 30.

Thereafter, as is shown in FIG. 1, a ridge 31 for selectively injecting a current into the MWQ active layer 18 is formed from the upper portion of the p-type cladding layer 20 and the p-type contact layer 21 in a dislocation low-density region positioned above the gap 12c and not overlapping the junction portion 14a.

Then, the lamination body 30 excluding the ridge 31 is dry etched so as to partly expose the n-type contact layer 15, and an insulating film 22 is deposited on the exposed faces of the lamination body 30. Next, after selectively forming openings in portions of the insulating film 22 on the ridge 31 and the n-type contact layer 15, a p-side electrode 23 is formed over and on both sides of the ridge 31 exposed in the opening of the insulating film 22 and an n-side electrode 24 is formed on a portion of the n-type contact layer 15 exposed in the opening of the insulating film 22 by deposition or sputtering.

In the semiconductor laser diode thus fabricated, when a predetermined voltage in a forward direction is applied between the p-side electrode 23 and the n-side electrode 24, holes are injected from the p-side electrode 23 and electrons are injected from the n-side electrode 24 into the MQW active layer 18. As a result, optical gain is generated in the MQW active layer 18, so as to show laser action at a wavelength of approximately 404 nm.

Figure 5:
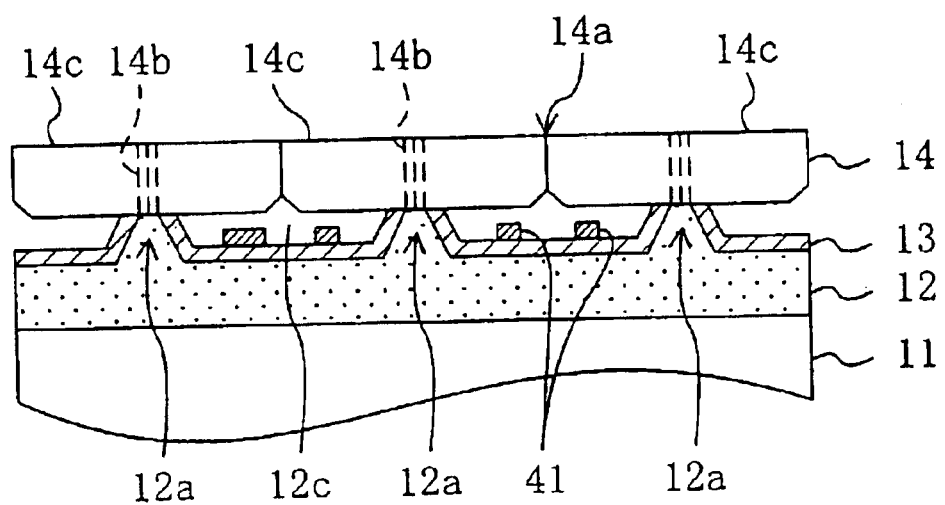
FIG. 5 is a schematic cross-sectional view for showing the characteristic of the fabrication of the gallium nitride-based semiconductor laser diode of Embodiment 1.

As is shown in FIG. 5, in a portion of the selectively grown layer 14 above the seed crystal, namely, above the convex 12a, a dislocation high-density region 14b with a dislocation density of approximately $1 \times 10^9$ cm$^{-2}$ is formed. On the other hand, a laterally grown region of the selectively grown layer 14 is formed into a dislocation low-density region 14c with a dislocation density of approximately $1 \times 10^7$ cm$^{-2}$. Accordingly, when the ridge 31, namely, the current injecting region serving as a cavity of laser, is formed above the dislocation low-density region 14c of the lamination body 30, the reliability of the laser diode can be improved.

Now, the effect attained by the grooves 12b of the seed layer 12, that is, the characteristic of this embodiment, will be described with reference to FIGS. 6(a) through 6(d).

Figure 6A:
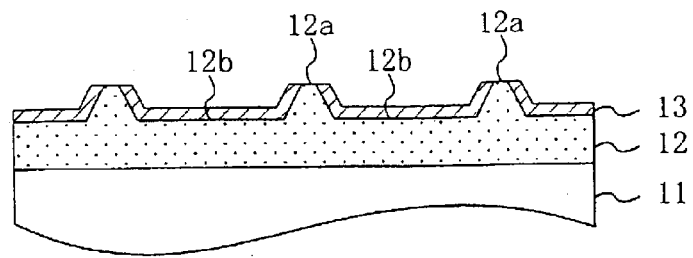
FIGS. 6(a), 6(b), 6(c) and 6(d) are schematic cross-sectional views for showing, in a stepwise manner, the characteristic of the fabrication of the gallium nitride-based semiconductor laser diode of Embodiment 1.

As is shown in FIG. 6(a), the grooves 12b in the shape of stripes are formed in the upper portion of the seed layer 12, and the mask film 13 is formed at least on the bottoms of the grooves.

Figure 6B:
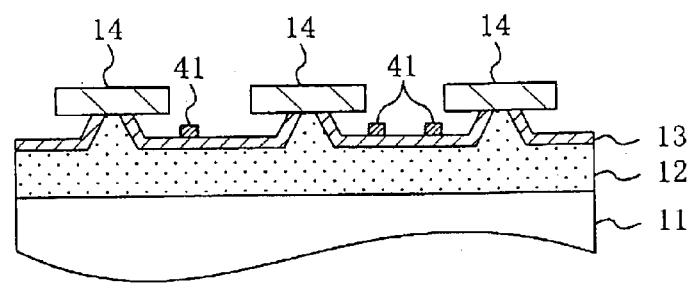
Figure 6C:
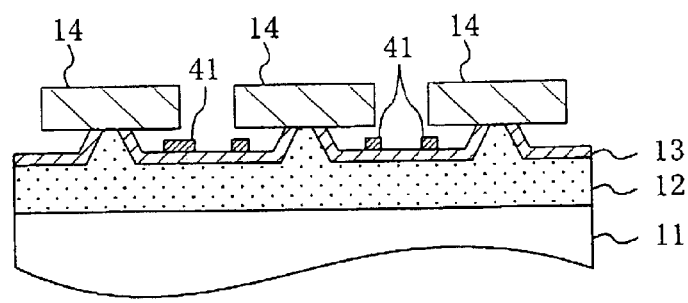

Then, as is shown in FIGS. 6(b) and 6(c), the selectively grown layers 14 are grown by using, as the seed crystal, the top faces of the convexes 12a sandwiched between the grooves 12b. At this point, polycrystals 41 of GaN may be deposited on the mask film 13.

Figure 6D:
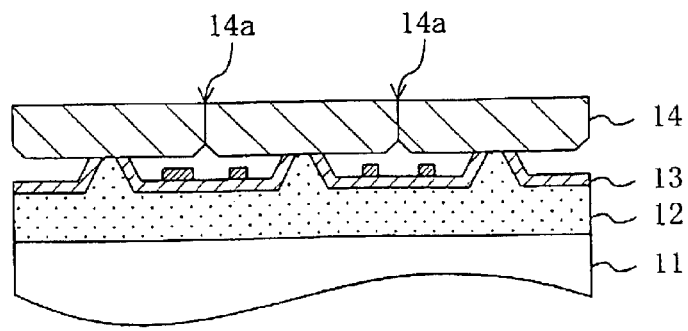

Next, as is shown in FIG. 6(d), even when the selectively grown layers 14 are integrated by continuing the ELOG with the polycrystals 41 deposited, there still remains a level difference between the top face of the convex 12a serving as the seed crystal and the bottom of the groove 12b where the polycrystal 41 is deposited Accordingly, the polycrystals 41 never affect the crystallinity of the selectively grown layer 14 and the lamination body 30. As a result, variation in the crystallinity of the lamination body 30 can be largely reduced, so as to largely improve the yield in the fabrication of the semiconductor laser diode.

The junction portion 14a threading the selectively grown layer 14 and the lamination body 30 shown in FIG. 1 along a direction vertical to the substrate surface is formed as a small angle boundary where edge dislocations are collected. Accordingly, although electrons injected from the n-side electrode 24 pass through a plurality of junction portions 14a to reach the MQW active layer 18, the dislocations collected in the junction portions 14a never prevent the injection of the electrons.

In forming the semiconductor laser diode on a chip, it is necessary to form a cavity facet working as a mirror face of the cavity. In general, the cavity facet of a semiconductor laser diode is formed by cleaving the substrate 11, and flaws and cracks may be caused in the substrate 11 during the cleavage.

Figure 39:
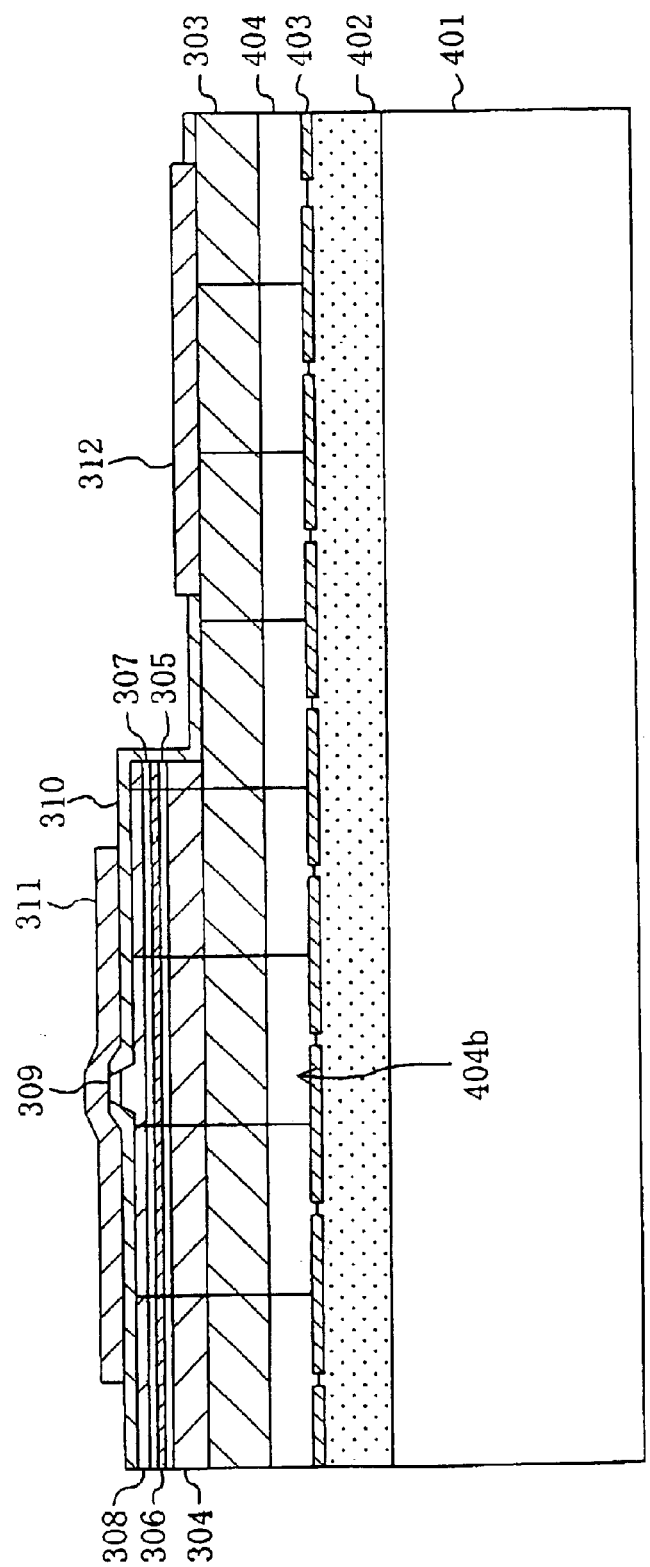
FIG. 39 is a cross-sectional view for showing the structure of the gallium nitride-based semiconductor laser diode of Conventional Example 2.
Figure 40A:
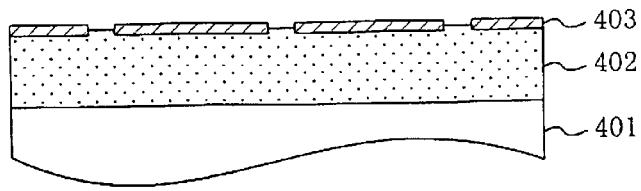
FIGS. 40(a), 40(b), 40(c) and 40(d) are schematic cross-sectional views for showing, in a stepwise manner, crystal growth in fabrication of the gallium nitride-based semiconductor laser diode of Conventional Example 2.
Figure 40B:
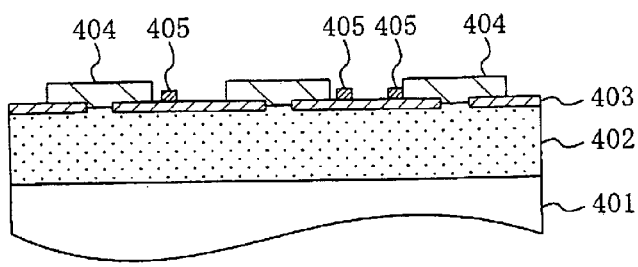
Figure 40C:
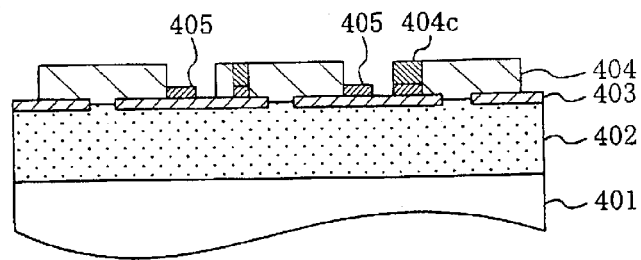
Figure 40D:
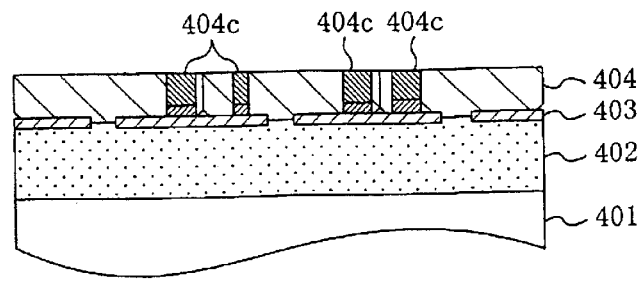

In the fabrication method for a semiconductor laser diode of Conventional Example 2 shown in FIG. 39, since the substrate 401 and the lowermost semiconductor layer 404 are in contact with each other, a flaw caused in the substrate 401 may reach the lamination body including the MQW active layer 306, which can disadvantageously largely spoil the operation and the optical characteristics of the laser diode.

On the other hand, according to this embodiment, since the gaps 12c are provided between the substrate 11 and the lamination body 30, flaws caused in the substrate 11 can be stopped by the gaps 12c. Accordingly, possibility of damage of the lamination body 30 due to the flaws caused in the substrate 11 can be remarkably reduced.

Figure 37:
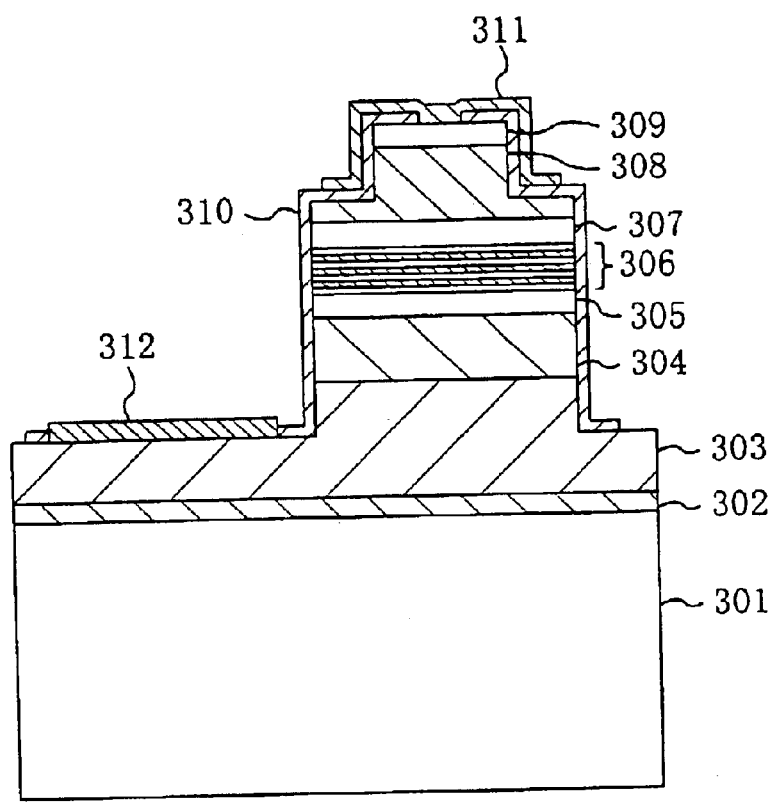
FIG. 37 is a cross-sectional view of a gallium nitride-based semiconductor laser diode according to Conventional Example 1.

Furthermore, in the fabrication method for a semiconductor laser diode of Conventional Example 1 shown in FIG. 37, when a nitride semiconductor layer is grown on the substrate 301 of sapphire or silicon carbide, the dislocation density of the crystal is as high as approximately $10^9$ cm$^{-2}$. In the semiconductor crystal having such a high dislocation density, a step on the crystal surface is terminated during step flow growth due to the dislocations, screw dislocations in particular, included at a high density, resulting in forming microfacets on the crystal surface. Accordingly, the crystal surface becomes irregular and the crystal becomes poor in flatness. As a result, in growing the MQW active layer 306 including indium, the quantity of a raw material of indium incorporated into the crystal is varied, resulting in causing harmful effects such as increase of the threshold current of the laser diode.

In the fabrication method of this embodiment, uniform step flow growth is observed in a laterally grown region, namely, the dislocation low-density region 14c of FIG. 5, and the crystal surface is good at flatness. As a result, in growing the MQW active layer 18, local segregation of indium can be avoided, resulting in lowering the threshold current.

The MOVPE is used for growing the nitride semiconductor in this embodiment, which does not limit the invention. Any growth method other than the MOVPE such as halide vapor phase epitaxial (HVPE) growth and molecular beam epitaxial (MBE) growth may be used as far as a nitride semiconductor can be grown. This goes for respective embodiments described below.

Furthermore, although the substrate 11 is made from sapphire in this embodiment, for example, silicon carbide, neodymium gallate (NGO), gallium nitride or the like can be used instead of sapphire.

Although the seed layer 12 is grown on the substrate 11 in two steps with the low temperature buffer layer formed therebetween in this embodiment, the low temperature buffer layer is not always necessary as far as the seed layer 12 can be formed in monocrystal.

Although the lift-off method is employed for forming the convexes 12a in the upper portion of the seed layer 12 in this embodiment, any other method can be employed as far as the convexes 12a and the grooves 12b can be formed with the mask film 13 remaining at least on the bottoms of the grooves 12b. In other words, any method can be employed as far as the C plane of the convexes 12a not covered with the mask film 13 can be used as the seed crystal and the gaps 12c can be formed. Furthermore, in stead of forming the convexes 12a through recess etching for etching the upper portion of the seed layer 12, a mask film for selective growth with an opening pattern in the shape of stripes may be formed on the flat top face of the seed layer 12 so as to grow the convexes projecting from the opening pattern of the mask film.

Moreover, the mask film 13 may be formed merely on the bottoms of the grooves 12b as far as the gaps 12c can be formed.

Although the mask film 13 is formed from silicon nitride in this embodiment, another dielectric film or a amorphous insulating film may be used instead of the silicon nitride film. Specifically, silicon oxide ($SiO_2$), nitrided silicon oxide (SiON), aluminum oxide ($Al_2O_3$), nitrided aluminum oxide (AlNO), titanium oxide ($TiO_2$), zirconium oxide ($ZrO_2$) or niobium oxide ($Nb_2O_3$) may be used. Films of these materials can be comparatively easily formed by the ECR sputtering.

Modification 1 of Embodiment 1

As Modification 1 of Embodiment 1, a mask film of a metal with a high melting point or a metal compound with a high melting point will be described.

When tungsten (W), that is, a metal with a high melting point, is used for the mask film 13 for the selective growth, the selectivity of crystal growth can be improved as compared with the case where the mask film 13 is formed from a dielectric, and hence, deposition of polycrystals 41 on the mask film 13 can be further suppressed. As a result, the lamination body 30 with high quality can be very easily formed without being affected by the polycrystals 41.

This is because the bonding strength between the mask film 13 and the nitride semiconductor crystal is lower when the mask film 13 is formed from a metal than when it is formed from a dielectric.

Tungsten, that is, a metal with a high melting point, is stable in its characteristics owing to its melting point of 3380° C. the highest among those of metals and its low vapor pressure. Therefore, an impurity such as silicon and oxygen can be prevented from being mixed in the selectively grown layer 14 differently from the case where a dielectric such as silicon oxide is used. As a result, a deep level and a non-luminescent center are never formed in the selectively grown layer 14 formed by using the mask film 13 of tungsten.

Figure 7:
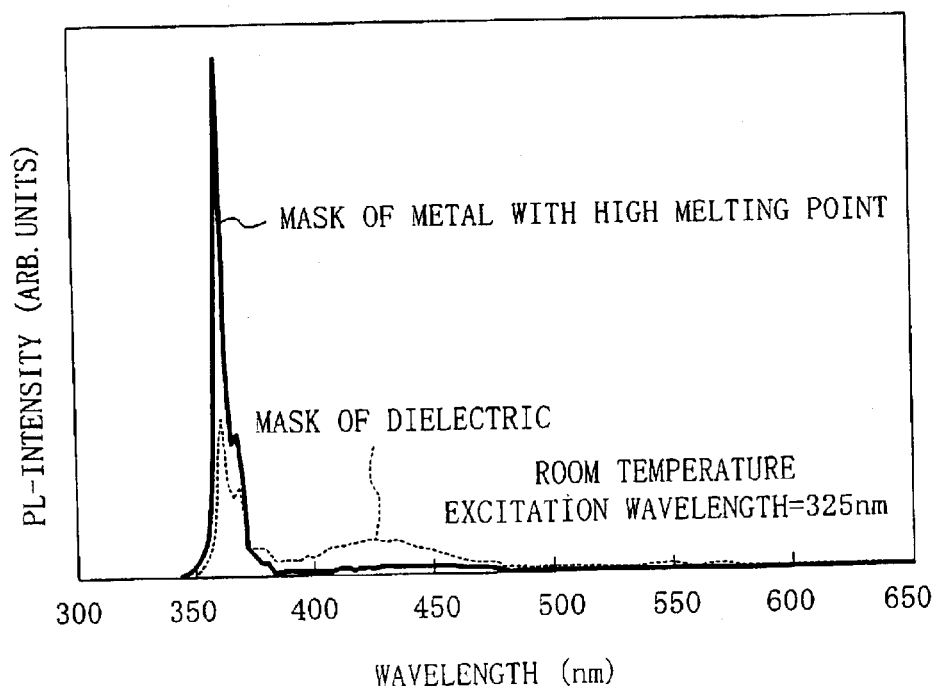
FIG. 7 is a graph for showing comparison in photoluminescence at room temperature of a selectively grown layer between a gallium nitride-based semiconductor laser diode according to Modification 1 of Embodiment 1 and the semiconductor laser diode of Embodiment 1.

FIG. 7 shows comparison in photoluminescence at room temperature between a selectively grown layer 14 formed by using a mask film 13 of a dielectric and a selectively grown layer 14 formed by using a mask film 13 of a metal with a high melting point.

As is shown in FIG. 7, in the selectively grown layer 14 of Modification 1, there is no luminescence at a deep level of a wavelength of approximately 430 nm, and very strong luminescence can be obtained at the end of the band. This reveals that the selectively grown layer 14 of Modification 1 has higher quality than the selectively grown layer 14 of Embodiment 1. Accordingly, when the lamination body 30 is grown on the selectively grown layer 14 with such high quality, the MQW active layer 18 can attain higher luminous efficiency.

Although tungsten is used for the mask film 13 of Modification 1, another metal with a high melting point or a metal compound with a high melting point may be used instead. For example, molybdenum (Mo), niobium (Nb), tungsten silicide ($WSi_x$), molybdenum silicide ($MoSi_x$) or niobium silicide ($NbSi_x$) may be used. Films of these materials can be comparatively easily formed by electron beam deposition or sputtering.

Modification 2 of Embodiment 1

Figure 8:
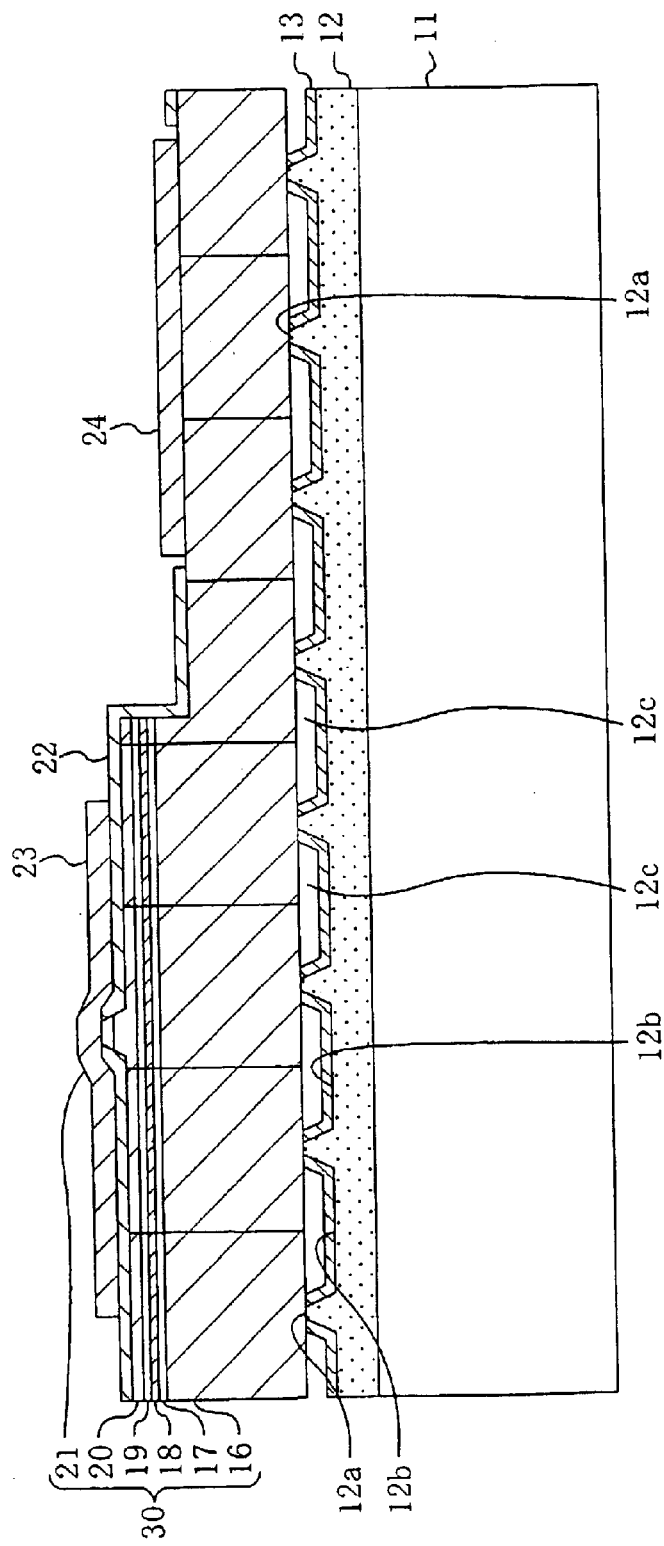
FIG. 8 is a cross-sectional view for showing the structure of a gallium nitride-based semiconductor laser diode according to Modification 2 of Embodiment 1.

FIG. 8 shows the sectional structure of a gallium nitride-based semiconductor laser diode according to Modification 2 of Embodiment 1. In FIG. 8, like reference numerals are used to refer to like elements shown in FIG. 1 so as to omit the description.

As is shown in FIG. 8, in the semiconductor laser diode of Modification 2, the n-type cladding layer 16 of n-type $Al_{0.07}Ga_{0.93}N$ is directly formed on the seed layer 12 without forming a selectively grown layer and an n-type contact layer therebetween.

As described in Embodiment 1, since the grooves 12b are formed in the upper portion of the seed layer 12 excluding portions serving as the seed crystal, the gaps 12c are formed on the mask film 13. Therefore, even when polycrystals are deposited on the mask film 13, the polycrystals are never incorporated into a semiconductor layer selectively grown on the seed layer 12. As a result, the selectively grown semiconductor layer can attain so good crystallinity that the n-type cladding layer 16 corresponding to a part of the lamination body 30 of the laser structure can be formed directly on the seed layer 12. In this case, the n-side electrode 24 is provided on an exposed portion of the n-type cladding layer 16.

Embodiment 2

Embodiment 2 of the invention will now be described with reference to the accompanying drawings.

Figure 9:
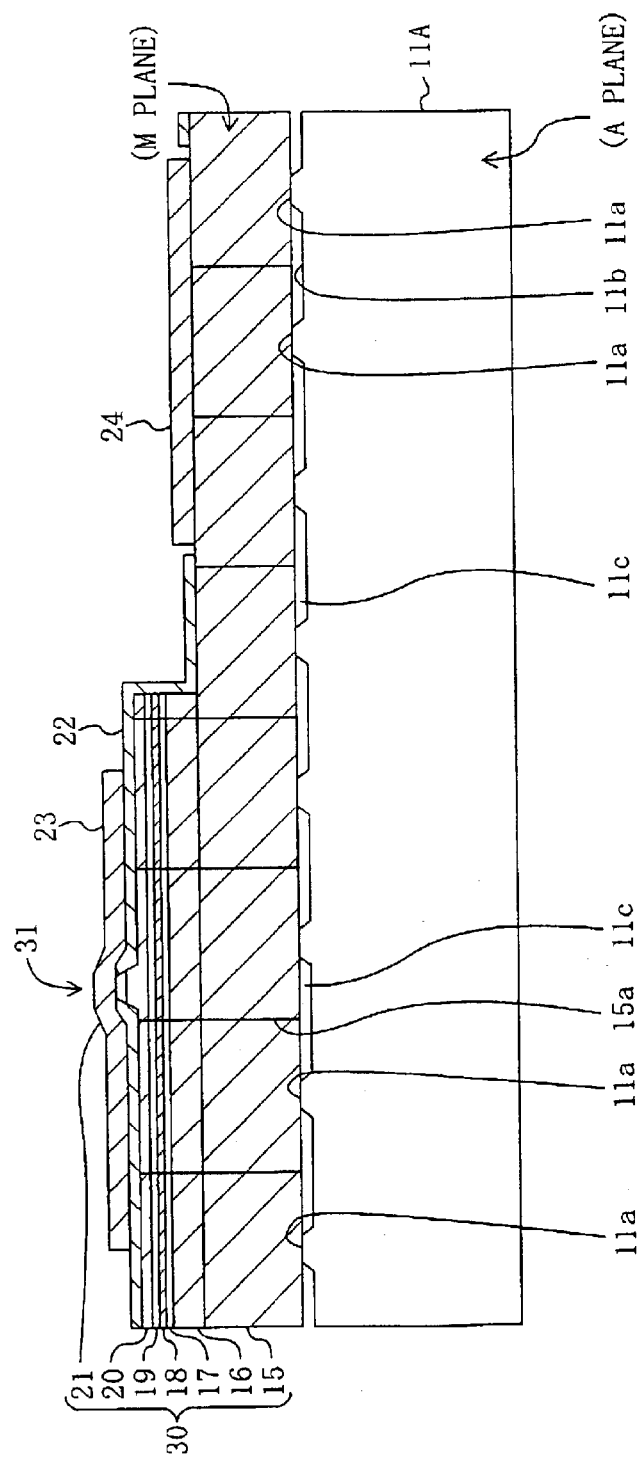
FIG. 9 is across-sectional view for showing the structure of a gallium nitride-based semiconductor laser diode according to Embodiment 2 of the invention.

FIG. 9 shows the sectional structure a gallium nitride-based semiconductor laser diode using the M plane as a cavity facet according to Embodiment 2. In FIG. 9, like reference numerals are used to refer to like elements shown in FIG. 1 so as to omit the description.

In the semiconductor laser diode of this embodiment, convexes 11a in the shape of stripes for the selective growth are formed in an upper portion of a substrate 11A of, for example, sapphire along a direction vertical to the M plane of the cavity facet, namely, along the A-axis (=<11–20>) of the substrate 11A.

In this case, an n-type contact layer 15 is characterized by being directly formed by using, as a seed crystal, monocrystal nuclei generated on the C plane of the respective convexes 11a of the substrate 11A.

Now, a method of fabricating the semiconductor laser diode having the aforementioned structure will be described with reference to the drawings.

FIGS. 10(a), 10(b), 11 and 12 are sectional views for showing procedures in the method of fabricating the semiconductor laser diode of Embodiment 2.

Figure 10A:
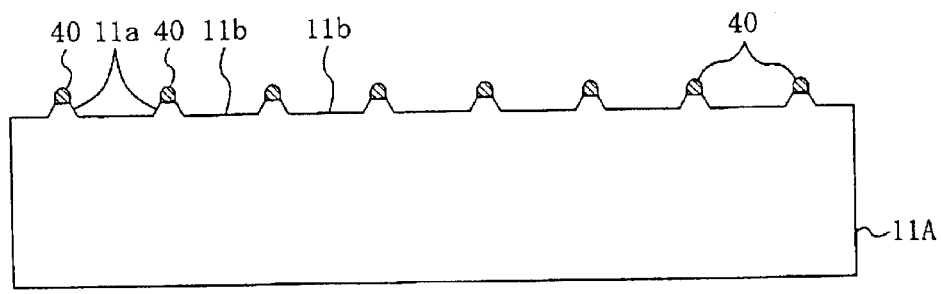
FIGS. 10(a) and 10(b) are cross-sectional views for showing procedures in fabrication of the gallium nitride-based semiconductor laser diode of Embodiment 2.

First, as is shown in FIG. 10(a), after a resist film is applied on a substrate 11A having the C plane as the principal plane, the resist film is patterned into stripes by the photolithography, thereby forming a resist pattern 40 in the shape of stripes extending along the A-axis of the substrate 11A with a cycle of approximately 10 through 30 $\mu$m. Subsequently, by using the resist pattern 40 as a mask, grooves 11b each with a sectional width of approximately 9 through 27 $\mu$m and a depth of approximately 20 through 500 nm are formed in an upper portion of the substrate 11A by dry etching such as reactive ion etching (RIE). In this embodiment, a convex 11a formed between the grooves 11b has a sectional width of approximately 1 through 3 $\mu$m.

Figure 10B:
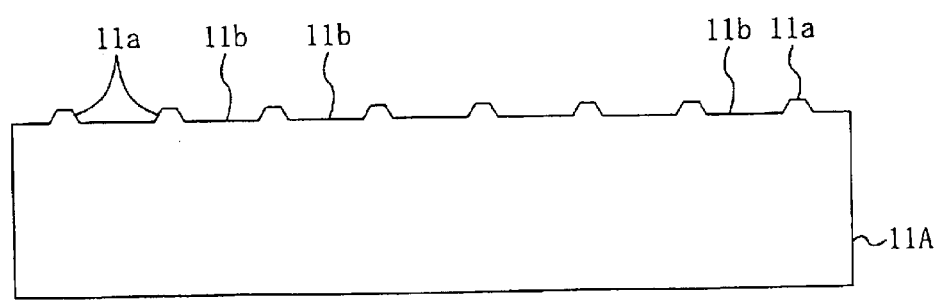

Next, as is shown in FIG. 10(b), the resist pattern 40 is removed, so as to obtain the substrate 11A having, in its upper portion, the convexes 11a in the shape of stripes extending along the A-axis.

Figure 11:
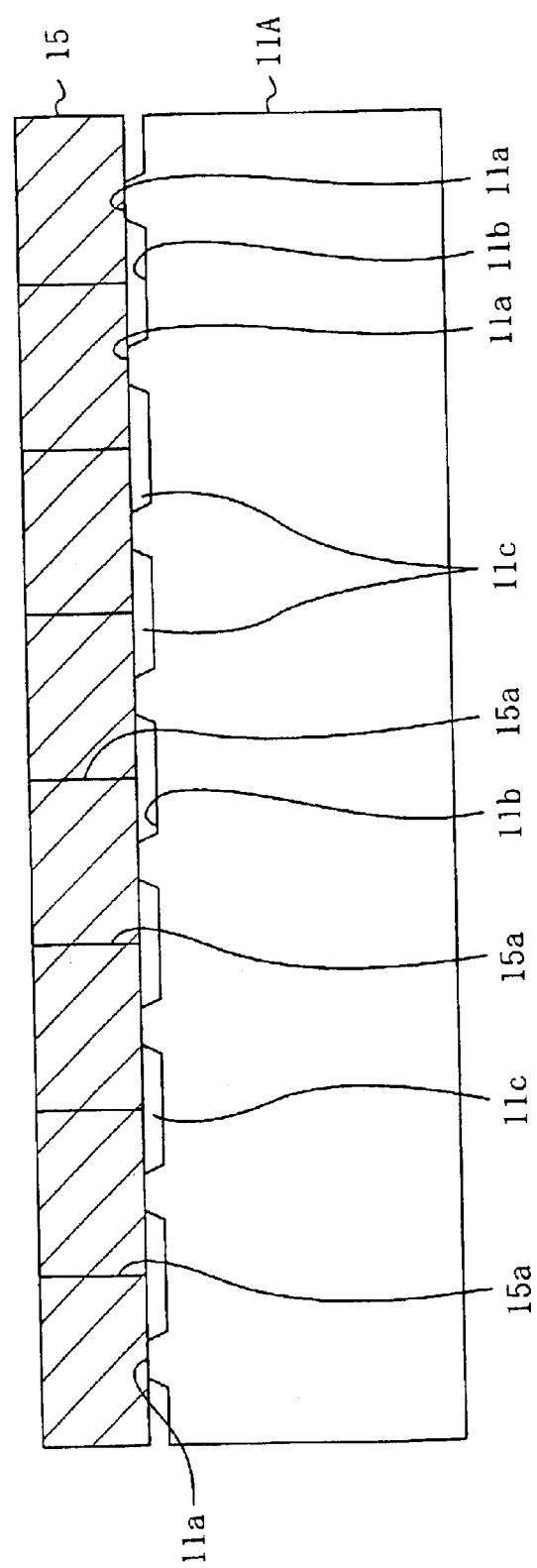
FIG. 11 is a cross-sectional view for showing another procedure in the fabrication of the gallium nitride-based semiconductor laser diode of Embodiment 2.

Then, as is shown in FIG. 11, after increasing the substrate temperature to approximately 1000° C., trimethyl gallium (TMG), ammonia ($NH_3$) and silane ($SiH_4$) are supplied onto the substrate 11A in, for example, a mixed atmosphere of hydrogen and nitrogen at a pressure of approximately 100 Torr (1 Torr=133.322 Pa), so as to grow an n-type contact layer 15 of n-type GaN on the substrate 11A by the MOVPE by using, as the seed crystal, monocrystal nuclei generated on the C plane appearing on the top faces of the convexes 11a. At this point, the n-type contact layer 15 is grown not only upward from the top faces of the convexes 11a but also along a direction parallel to the substrate surface. The crystals grown from the both sides of the groove 11b meet each other so as to form a junction portion 15a at substantially the center of the groove 11b. In this manner, the crystals grown from the top faces of the plural convexes 11a are integrated, so as to form the n-type contact layer 15 having the C plane as the top face. Also at this point, plural gaps 11c are formed so as to be surrounded with the bottoms and the walls of the respective grooves 11b and the lower face of the n-type contact layer 15.

Now, growth mechanism in the selective growth by using the substrate 11A of sapphire will be described.

In growing a nitride semiconductor in general on a substrate having a different lattice constant from the nitride semiconductor, if GaN crystal is directly grown on the substrate without forming a low temperature buffer layer of a nitride semiconductor therebetween, merely a three-dimensional film including a combination of monocrystal nuclei of GaN is formed.

On the other hand, according to this embodiment, since the dry etching is employed for forming the grooves 11b of the substrate 11A, damage layers derived from the dry etching are formed on the bottoms and the walls of the grooves 11b. Therefore, generation of the monocrystal nuclei are prevented on the bottoms and the walls of the grooves 11b. Furthermore, the top face of each convex 11a not subjected to the dry etching has a small sectional width of approximately 1 through 3 $\mu$m, and hence, monocrystal nuclei with a high density can be easily generated thereon. In this manner, the monocrystal nuclei generated on the top faces of the convexes 11a work as the seed crystal for the selective growth, resulting in accelerating the selective growth along the substrate surface direction under the aforementioned conditions.

In FIG. 11, threading dislocations are observed in a selectively grown region excluding the junction portions 15a at a density of approximately $1 \times 10^6$ cm$^{-2}$ while dislocations horizontal to the C plane are observed in the junction portions 15a at a density of approximately $4 \times 10^7$ cm$^{-2}$. The thickness of the n-type contact layer 15 depends upon the width and the like of the groove 11b and is herein approximately 2 through 6 $\mu$m. Also, a tilt angle between the C-axis in-a portion of the n-type contact layer 15 above the convex 11a and the C-axis in a portion thereof above the gap 11c is suppressed to 0.01 through 0.03 degree.

The tilt angle can be thus very small in the ELOG of this embodiment as compared with that in the conventional ELOG because the n-type contact layer 15 corresponding to the crystal layer formed through the ELOG is not in contact with the substrate 11A, and hence, stress as in the conventional ELOG is not applied to the interface with the mask film 13.

At this point, a void in the shape of a reverse V having an opening on the gap 11c is formed in a lower portion of the junction portion 15a.

Furthermore, in this embodiment, even when polycrystals are deposited on the bottoms of the grooves 11b in the selective growth of then-type contact layer 15, the polycrystals are never in contact with the n-type contact layer 15 owing to a level difference caused between the convex 11a and the groove 11b formed in the upper portion of the substrate 11A. Therefore, the crystal quality of the lamination body 30 is never harmfully affected. As a result, variation in the operation characteristic of the laser diode including the lamination body 30 can be reduced, so as to improve the yield.

Figure 12:
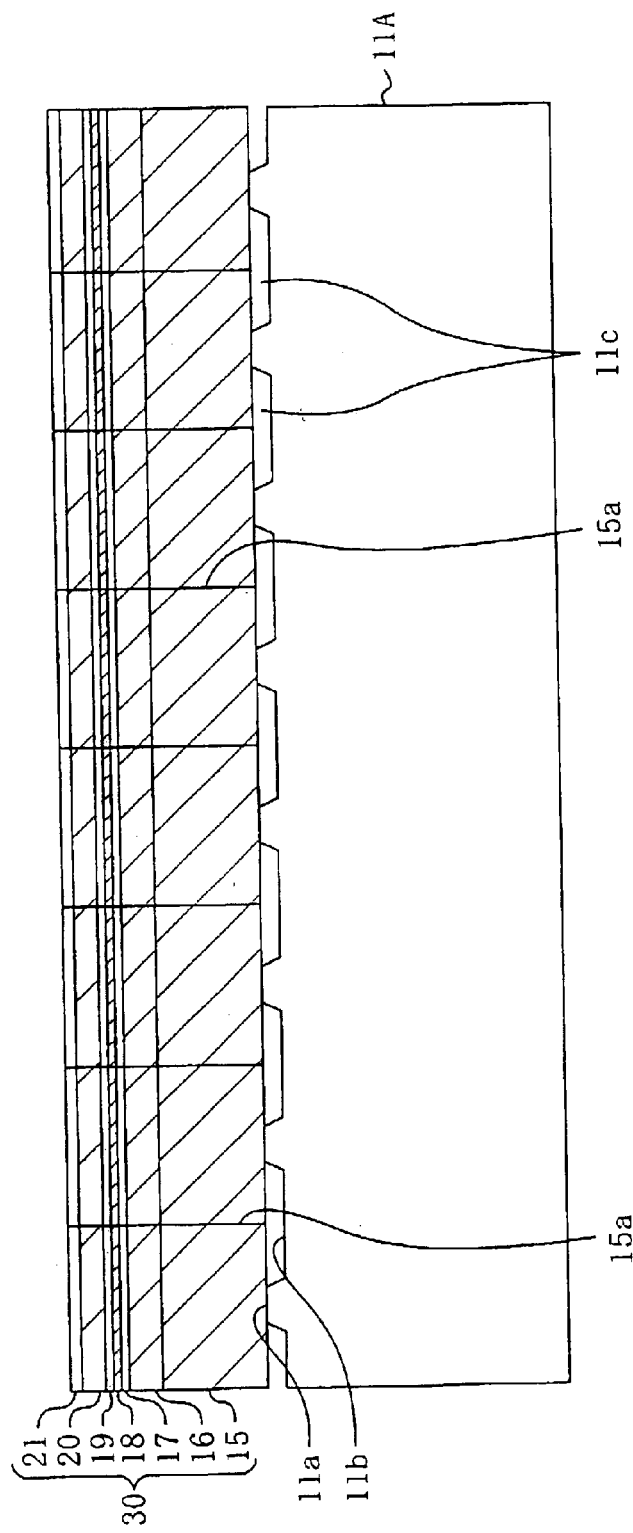
FIG. 12 is across-sectional view for showing still another procedure in the fabrication of the gallium nitride-based semiconductor laser diode of Embodiment 2.

Next, as is shown in FIG. 12, the rest of semiconductor layers of the lamination body 30 are formed on the n-type contact layer 15.

Specifically, after setting the substrate temperature to, for example, approximately 970° C., an n-type cladding layer 16, an n-type light guiding layer 17, a MQW active layer 18, a p-type light guiding layer 19, a p-type cladding layer 20 and a p-type contact layer 21 are successively grown on the n-type contact layer 15 in a mixed atmosphere of hydrogen and nitrogen at a pressure of approximately 300 Torr. In this case, the MQW active layer 18 includes a well layer of $Ga_{0.92}In_{0.08}N$ with a thickness of approximately 4 nm and a barrier layer of GaN with a thickness of approximately 6 nm.

Subsequently, as is shown in FIG. 9, an upper portion of the p-type cladding layer 20 and the p-type contact layer 21 are formed into a ridge 31 for selectively injecting a current into the MWQ active layer 18 in a direction along the M-axis (=<1–100>) of the lamination body 30, namely, in a direction parallel to the grooves 11b of the substrate 11A in a region positioned above the gap 11c and not overlapping the junction portion 15a, namely, in a dislocation low-density region. In this case, the ridge 31 has a width of approximately 2 through 5 $\mu$m.

Since GaN crystal is transparent against visible light, it is easy to distinguish the convex 11a from the gap 11c with an optical microscope. Therefore, in determining the position of the ridge 31 in the photolithography, there is no need to use a dedicated alignment pattern.

Next, after partly exposing the n-type contact layer 15 by masking the lamination body 30 excluding the ridge 31, an insulating film 22 is deposited on the exposed faces of the lamination body 30. Then, a p-side electrode 23 is formed on the insulating film 22 so as to extend over the ridge 31 and cover a portion of the p-type contact layer 21 exposed from the insulating film 22. Also, an n-side electrode 24 is formed on a portion of the n-type contact layer 15 exposed from the insulating film 22.

Then, the substrate 11A is cleaved on the M plane of the lamination body 30, namely, on it's A plane, thereby forming a cavity facet. Although the A plane of sapphire is a crystal plane difficult to cleave-as described above, even when the sapphire crystal is broken with the cleavage shifted from a predetermined position, the breakage is prevented from being propagated to the lamination body 30 owing to the gaps 11c formed in the substrate 11A. Accordingly, a good cleaved end can be easily obtained in the vicinity of the cavity facet. The yield in the cleavage of the laser diode can be thus improved.

Next, the cleaved end of the cavity is coated with a dielectric film or the like so as to attain appropriate reflectance, and thereafter, the substrate is divided along a plane parallel to the ridge 31 into chips so as to obtain semiconductor laser diodes.

In the semiconductor laser diode of this embodiment, uniform step flow growth is observed in the ELO grown region as described in Embodiment 1. When the MQW active layer 18 is grown on such a flat surface, local segregation of indium can be avoided. As a result, the MQW active layer 18 is formed as a high quality crystal, so as to reduce the operation current of the laser diode.

Figure 13:
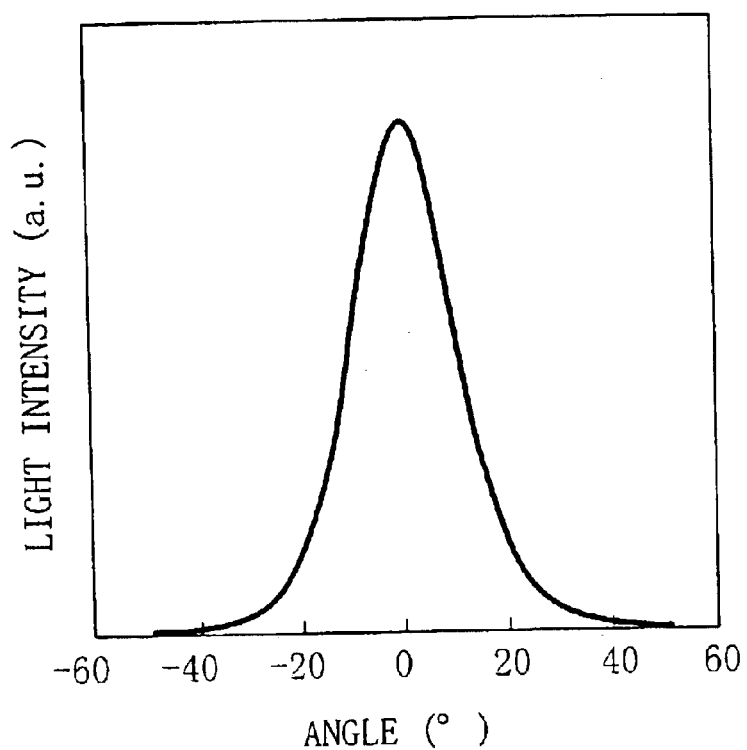
FIG. 13 is a graph for showing a far-field pattern, along a direction parallel to a cavity facet, of a laser beam emitted from the gallium nitride-based semiconductor laser diode of Embodiment 2.
Figure 42:
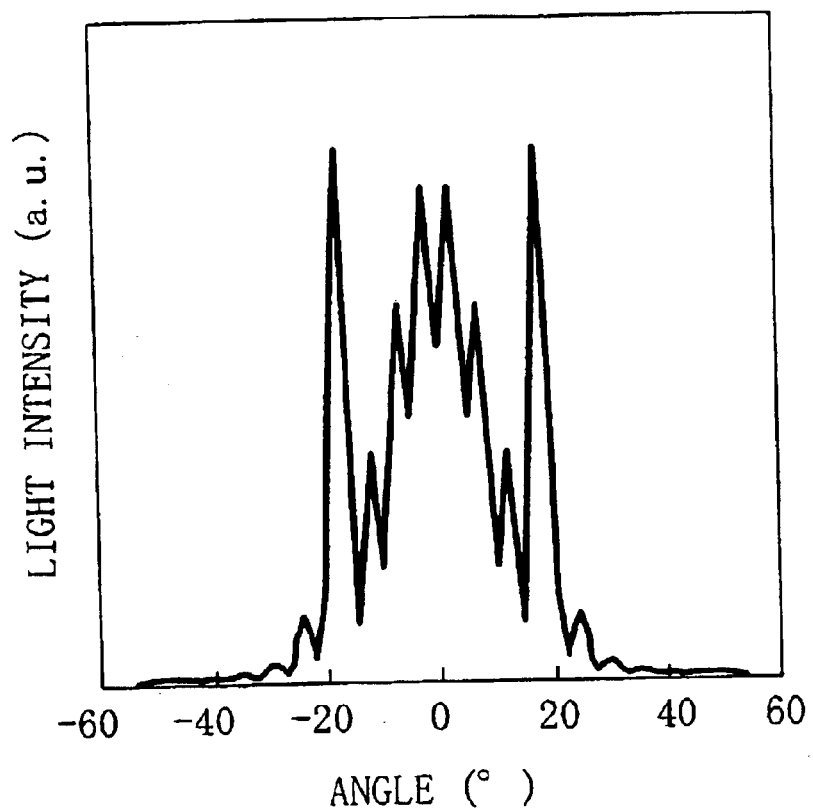
FIG. 42 is a graph for showing a far-field pattern of the gallium nitride-based semiconductor laser diode of Conventional Example 1.

FIG. 13 shows a far-field pattern, in a direction parallel to the cavity facet, of laser emitted from the semiconductor laser diode of this embodiment, and thus, a unimodal distribution of light intensity can be satisfactorily obtained. On the other hand, the far-field pattern of the semiconductor laser diode of Conventional Example 1 exhibits a multimodal distribution of light intensity as shown in FIG. 42.

The semiconductor laser diode of this embodiment attains the unimodal distribution because the gaps 11c provided between the lamination body 30 and the substrate 1A can optically separate the lamination body 30 and the substrate 11A from each other.

Specifically, as is shown in FIG. 9, since the n-type contact layer 15 having a large refractive index than the n-type cladding layer 16 is formed under the n-type cladding layer 16, light generated in the MQW active layer 18 can easily leak to the substrate 11A. However, in this embodiment, since the gaps 11c with a very small refractive index are formed below the n-type contact layer 15, a parasitic waveguide is never formed between the n-type cladding layer 16 and the substrate 11A. As a result, the light confinement coefficient of the MQW active layer 18 is never lowered by the leakage of the generated light.

This effect to suppress the formation of a parasitic waveguide depends upon a dimension of the gap 11c along a direction vertical to the substrate surface, namely, the depth of the groove 11b. According to computer simulation, it is confirmed that the leakage of light to the substrate 11A can be substantially avoided when the depth of the groove 11b is at least approximately 50 nm.

It is also confirmed that when the n-type contact layer 15 of GaN includes 2% or more of aluminum, the leakage of light to the substrate 11A can be more effectively avoided.

Although gallium nitride is used as the monocrystal nuclei generated on the top faces of the convexes 11a of the substrate 11A in this embodiment, the monocrystal nucleus may be another gallium nitride-based mixed crystal, namely, $Al_uGa_vIn_wN$, wherein $0 \leq u$, v, $w \leq 1$ and $u+v+w=1$. When the mixed crystal is used, the optimal conditions for the ELOG can be appropriately selected in accordance with the composition of the mixed crystal.

Although sapphire is used for the substrate 11A in this embodiment, for example, silicon carbide, gallium nitride or the like may be used instead of sapphire. However, when the substrate 11A is made from silicon carbide, tensile strain is applied to the lamination body 30 so as to easily cause cracks. Therefore, it is preferred in this case that the integrated n-type contact layer 15 has a thickness smaller than 2 $\mu$m by setting the sectional width of each groove 11b as small as possible. Furthermore, when the substrate 11A is made from silicon carbide or gallium nitride, although it can be easily cleaved on the M plane as well as A plane, the yield can be improved by cleaving the substrate on a plane perpendicular to the direction of the stripes of the grooves 11b.

Although the dry etching by the RIE is employed in forming the grooves 11b in the substrate 11A in this embodiment, any other dry etching method, such as ion milling, may be employed as far as a damage layer can be formed on the bottoms and the walls of the grooves 11b so as to selectively grow a gallium nitride-based semiconductor.

The damage layer formed in the grooves 11b is used as a mask layer for the ELOG in this embodiment. In the case where the deposited polycrystals are adhered onto the damage layer, in particular, in the case where the substrate 1A is made from gallium nitride, a mask film of silicon nitride or the like is preferably formed at least on the bottoms of the grooves 11b so as to further improve the selectivity.

The material for the mask film 13 is not limited to silicon nitride but may be a dielectric or amorphous insulator as described in Embodiment 1, and is preferably a metal with a high melting point or a metal compound with a high melting point as described in Modification 1 of Embodiment 1.

The invention is applied to a laser diode in this embodiment as described so far, but the invention can be applied to a method of growing a semiconductor for obtaining a gallium nitride-based crystal with a low dislocation density. Furthermore, since the seed layer 12 formed on the substrate 11 in Embodiment 1 is not used in this embodiment, the fabrication process can be simplified.

Moreover, not only a light emitting device but also another semiconductor device such as an electronic device can be fabricated by using the nitride semiconductor layer including a dislocation low-density region of this embodiment. In this manner, the reliability and the yield of the semiconductor device can be improved.

Embodiment 3

Embodiment 3 of the invention will now be described with reference to the accompanying drawings.

Figure 14:
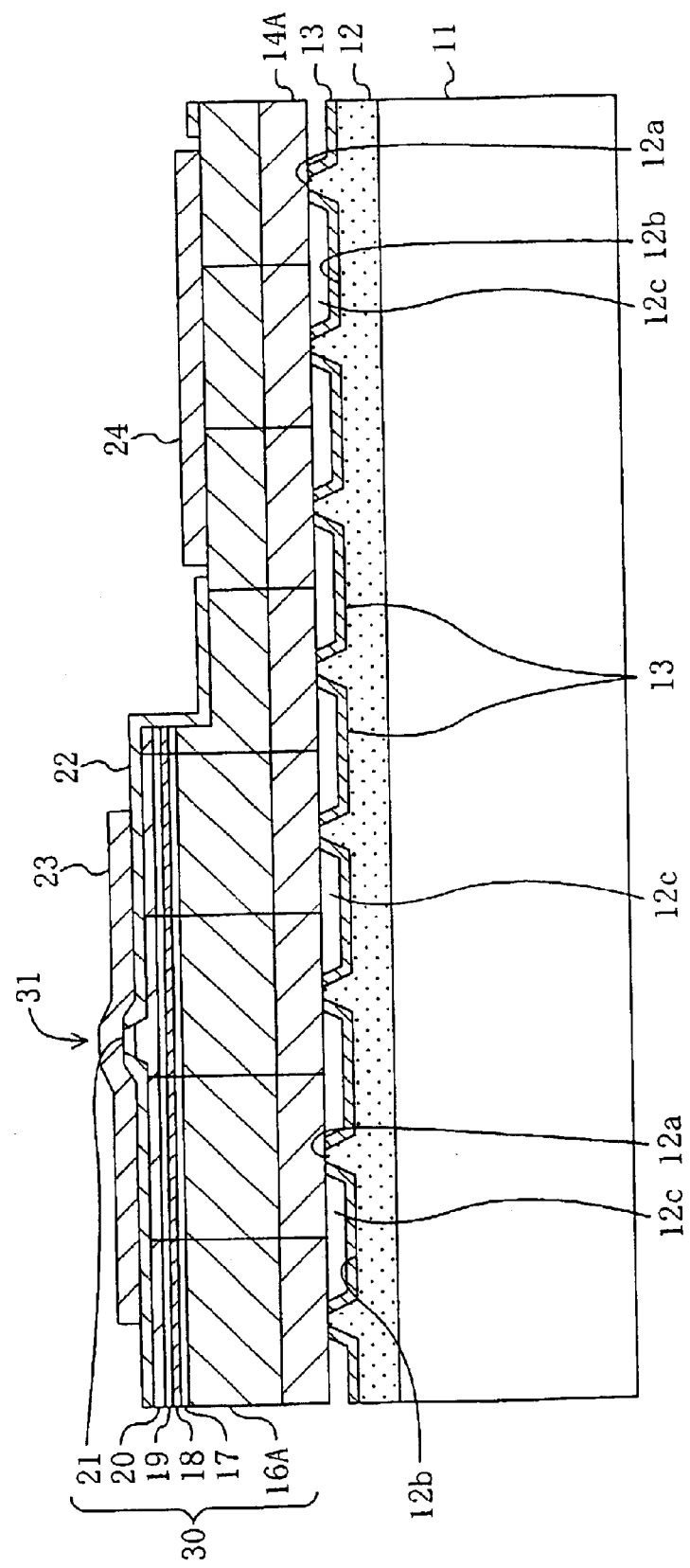
FIG. 14 is a cross-sectional view for showing the structure of a gallium nitride-based semiconductor laser diode according to Embodiment 3 of the invention.

FIG. 14 shows the sectional structure of a gallium nitride-based semiconductor laser diode according to Embodiment 3. In FIG. 14, like reference numerals are used to refer to like elements shown in FIG. 1 so as to omit the description.

Herein, structural differences from the structure of Embodiment 1 alone will be described.

Aluminum gallium nitride (AlGaN) is used for a selectively grown layer 14A grown from the top faces of the respective convexes 12a of the seed layer 12 to be integrated, and an n-type superlattice cladding layer 16A having a superlattice structure including n-type AlGaN and n-type GaN also serves as the n-type contact layer 15. Thus, the light confinement coefficient of the MQW active layer 18 can be increased.

Figure 15:
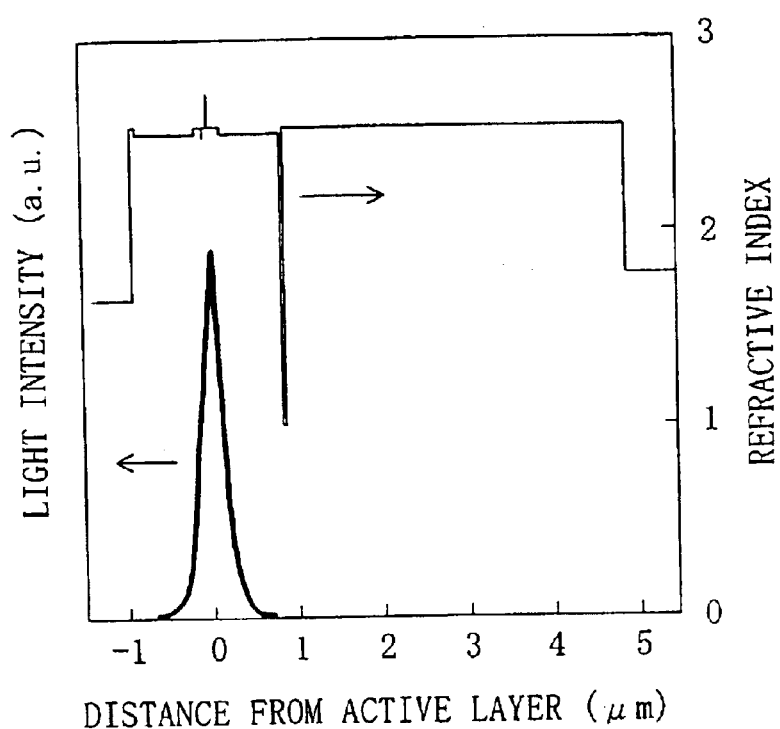
FIG. 15 is a graph for showing the relationship between the distribution of a refractive index in a ridge along a direction vertical to a substrate surface and the distribution of light intensity on a cavity facet in the gallium nitride-based semiconductor laser diode of Embodiment 3.
Figure 16:
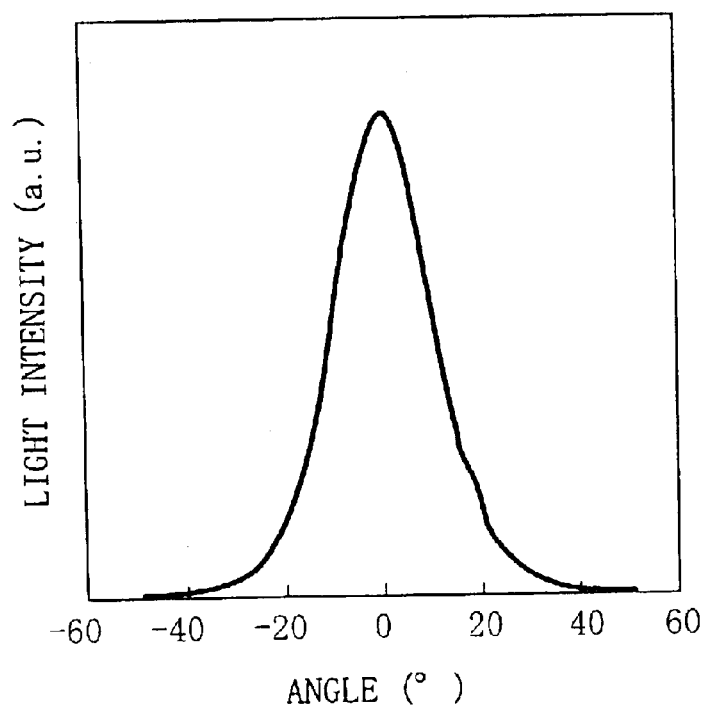
FIG. 16 is a graph for showing a far-field pattern, along a direction parallel to the cavity facet, of a laser beam emitted by the gallium nitride-based semiconductor laser diode of Embodiment 3.

FIG. 15 shows the relationship between the distribution of a refractive index on the ridge along a direction vertical to the substrate surface and the distribution of light intensity on a cavity facet in the semiconductor laser diode of this embodiment. Also, FIG. 16 shows a far-field pattern, along a direction parallel to the cavity facet, of laser emitted from the semiconductor laser diode of this embodiment.

In Embodiment 3, each groove 12b of the seed layer 12 has a depth of approximately 50 nm, and the n-type superlattice cladding layer 16A has an average composition of $Al_{0.07}Ga_{0.93}N$. Furthermore, the structure of the lamination body above the n-type light guiding layer 17 is the same as that of the conventional semiconductor laser diode shown in FIG. 37.

As is understood from FIG. 15, no leakage of generated light to the substrate 11 is observed in the semiconductor laser diode of this embodiment. Also, the light confinement coefficient of the MQW active layer 18 is confirmed to be approximately 1.54 times as large as that shown in FIG. 41.

This is because the MQW active layer 18 is separated from the substrate 11 by the gaps 12c of the seed layer 12 and the selectively grown layer 14A of n-type AlGaN having a refractive index smaller than or equal to the n-type superlattice cladding layer 16A is provided between the n-type superlattice cladding layer 16A and the seed layer 12. Accordingly, no parasitic waveguide is formed between the n-type superlattice cladding layer 16A and the substrate 11, and the light confinement coefficient of the MQW active layer 18 can be suppressed from being lowered due to the leakage of the generated light.

This effect to suppress the formation of a parasitic waveguide depends upon a dimension of the gap 11c along a direction vertical to the substrate surface, namely, the depth of the groove 11b. As described above, it is confirmed that the leakage of light to the substrate 11 can be substantially avoided when the depth of the groove 11b is at least approximately 50 nm.

Furthermore, when the selectively grown layer 14A includes 2% or more and preferably 4% or more aluminum, the leakage of light to the substrate 11 can be suppressed.

Also in this embodiment, even when the ELOG of the selectively grown layer 14A is continued with polycrystals of AlGaN deposited on the mask film 13, the crystallinity of the selectively grown layer 14A is never degraded by the polycrystals because there is a level difference between the top face of the convex 12a serving as the seed crystal and the bottom of the groove 12b where the polycrystals are deposited. As a result, the variation in the crystallinity of the lamination body 30 can be largely reduced, so as to improve the yield in the fabrication of semiconductor laser diodes.

Now, a method of aligning the ridge 31 on the lamination body 30 will be described.

In order to form the ridge 31 in a dislocation low-density region of the lamination body 30 above the gap 12c, it is necessary to accurately align the ridge 31 in the photolithography.

Figure 17:
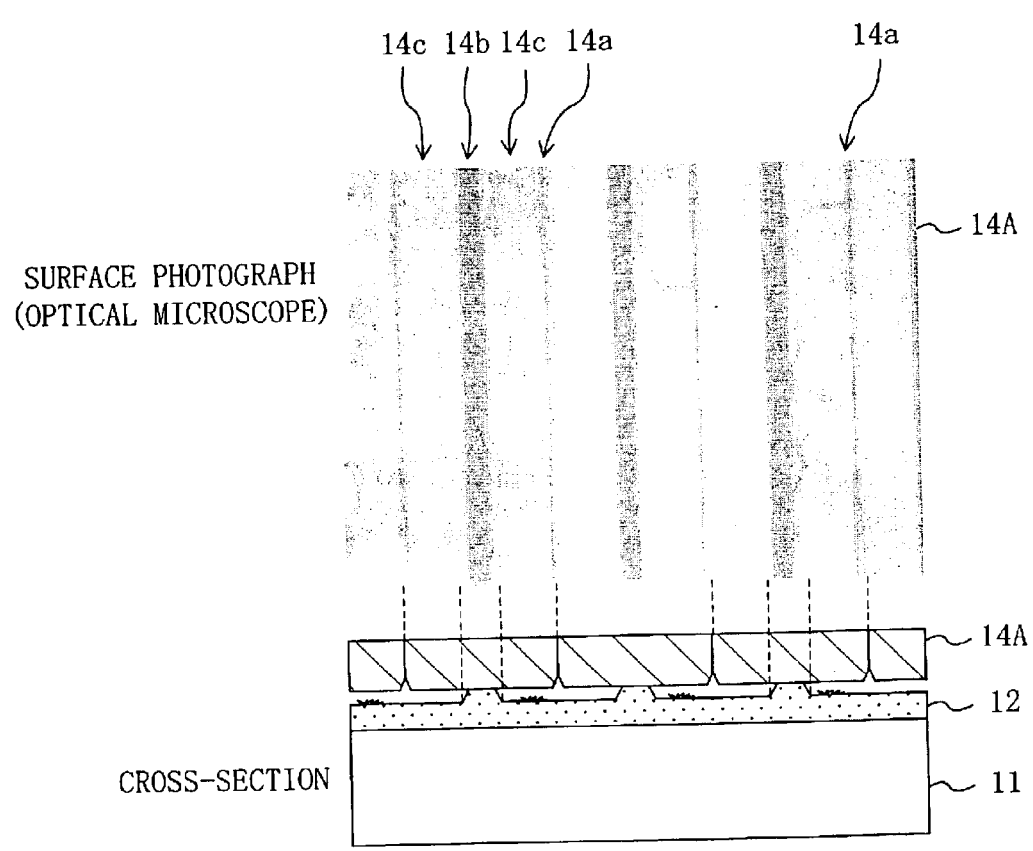
FIG. 17 is a plane photograph obtained with an optical microscope and a corresponding cross-sectional view of a selectively grown layer before forming a lamination body 30 in the gallium nitride-based semiconductor laser diode of Embodiment 3.

FIG. 17 shows a plane photograph of the selectively grown layer 14A prior to the formation of the lamination body 30 obtained with an optical microscope and the corresponding sectional structure of the selectively grown layer 14A. As is shown in FIG. 17, a dislocation low-density region 14c can be easily distinguished from a dislocation high-density region 14b and a junction portion 14a with the optical microscope. Accordingly, in a procedure for aligning the ridge 31 in the photolithography, there is no need to use a dedicated alignment pattern (alignment mark).

Furthermore, it is necessary to cleave the substrate 11 and the lamination body 30 for forming a cavity facet. Also in this embodiment, claws caused in the substrate 11 can be stopped by the gaps 12c provided in the seed layer 12, and hence, the harmful effect on the lamination body 30 can be definitely reduced.

In this embodiment, the n-side electrode 24 is in contact with the n-type superlattice cladding layer 16A and the n-type superlattice cladding layer 16A also serves as the n-type contact layer.

As described above, in order to suppress the leakage of generated light from the MQW active layer 18 to the substrate 11, it is necessary to form a semiconductor layer including aluminum between the n-type light guiding layer 17 and the gaps 12c. However, when the n-type contact layer on which the n-side electrode 24 is formed is made from a bulk layer (single layer) including aluminum in a large composition ratio, for example, a single layer of n-type $Al_{0.07}Ga_{0.93}N$, the driving voltage of the laser diode is increased because the resistivity of the single layer is increased to approximately twice of that of gallium nitride or the contact resistance is increased.

As a result of a variety of examinations, the present inventors have found that the specific resistance of the n-type superlattice cladding layer 16A including, for example, n-type $Al_{0.14}Ga_{0.86}N$ and n-type GaN is substantially equal to that of a single layer of n-type GaN. This is because of large mobility of two-dimensional electron gas generated in the superlattice semiconductor layer. Furthermore, the present inventors have found that the contact resistance of the superlattice semiconductor layer can be substantially equal to that of an n-type GaN layer when the thickness of a unit layer included in the superlattice structure is sufficiently small, for example, is approximately 2 nm. At this point, the doping concentration of the n-type impurity is approximately $1 \times 10^{18}$ cm$^{-3}$.

Accordingly, by forming the superlattice structure from AlGaN and GaN, while making the best use of the small refractive index of AlGaN, low resistance can be simultaneously attained, resulting in definitely attaining a low driving voltage.

The superlattice layer preferably includes aluminum in an average ratio of 2% and has a thickness of $\lambda/(4n)$ or less, wherein $\lambda$ indicates the wavelength of light and n indicates the refractive index of the unit layer.

Moreover, according to this embodiment, uniform step flow growth is observed and satisfactory surface flatness is confirmed in the dislocation low-density region 14c of the selectively grown layer 14A shown in FIG. 17 through the measurement with an atomic-force-microscopy (AFM). As a result, no local segregation of indium is caused in growing the MQW active layer 18 including indium, which reduces the threshold current.

Although the substrate 11 is made from sapphire, for example, silicon carbide, neodymium gallate (NGO), gallium nitride or the like may be used instead of sapphire.

Although the convexes 12a in the seed layer 12 are formed by the lift-off method, any other method may be employed as far as the convexes 12a and the grooves 12b can be formed with the mask film 13 remaining on at least the bottoms of the grooves 12b.

The mask film 13 may be formed on the bottoms of the grooves 12b alone as far as the gaps 12c can be formed.

Furthermore, the mask film 13 may be formed from a dielectric such as silicon nitride and silicon oxide by the ECR sputtering, and preferably, is formed from a metal with a high melting point such as tungsten or its silicide.

Embodiment 4

Embodiment 4 of the invention will now be described with reference to the accompanying drawings.

Figure 18:
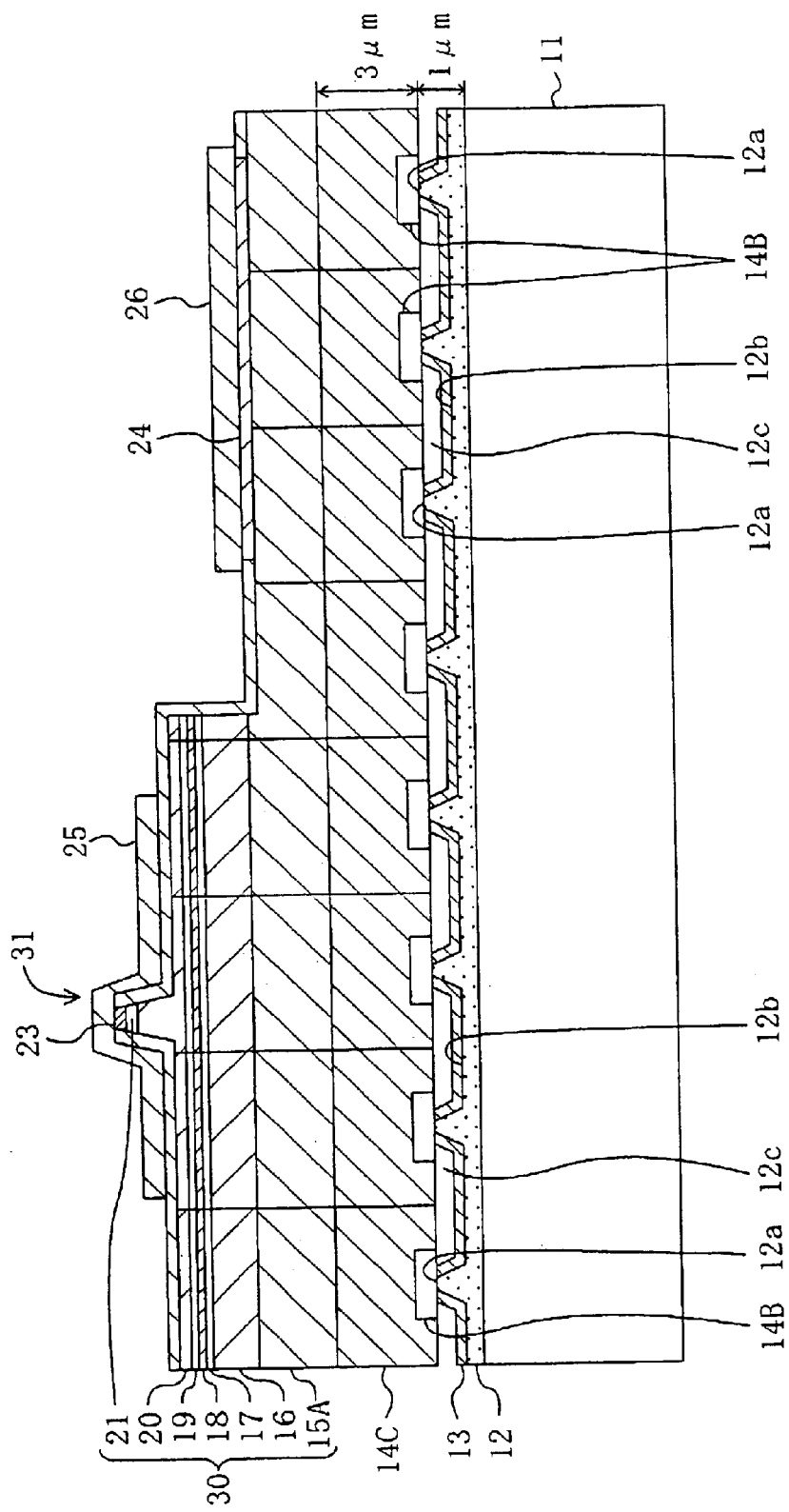
FIG. 18 is a cross-sectional view for showing the structure of a gallium nitride-based semiconductor laser diode according to Embodiment 4 of the invention.

FIG. 18 shows the sectional structure of a gallium nitride-based semiconductor laser diode of Embodiment 4. In FIG. 18, like reference numerals are used to refer to like elements shown in FIG. 1 so as to omit the description.

Herein, structural differences from the structure of Embodiment 3 alone will be described.

In this embodiment, the selectively grown layer 14A of AlGaN of Embodiment 3 is formed to have a two-layer structure including a first selectively grown layer 14B of GaN formed in the vicinity of the top faces of the convexes 12a of the seed layer 12 and a second selectively grown layer 14C of AlGaN for covering the top and side faces of the first selectively grown layer 14B as is shown in FIG. 18.

Furthermore, the n-type superlattice cladding layer 16A also serving as the n-type contact layer is formed to have a two-layer structure including an n-type superlattice contact layer 15A and an n-type cladding layer 16 of a single $Al_{0.07}Ga_{0.93}N$ layer. In this case, the n-type superlattice contact layer 15A has a superlattice structure including n-type $Al_{0.01}Ga_{0.09}N$ and n-type GaN.

Moreover, the p-side electrode 23 is formed merely on the top face of the ridge 31 formed in the upper portion of the lamination body 30, and a p-side line electrode 25 is formed so as to cover the p-side electrode 23 and the ridge 31. Similarly, the n-side electrode 24 is covered with an n-side line electrode 26.

Now, the characteristics of a method of fabricating the semiconductor laser diode of this embodiment will be described.

First, plural first selectively grown layers 14B are grown by using, as the seed crystal, the top faces of the convexes 12a of the seed layer 12. The growth pressure for the first and second selectively grown layers 14B and 14C is set to a comparatively low pressure of approximately 200 Torr until the second selectively grown layers 14C grown by using, as the seed crystal, the first selectively grown layers 14B are integrated.

This is because as the pressure is reduced, the growth rate of the first and second selectively grown layers 14B and 14C is larger in the A-axis direction of the seed layer 12, namely, in a direction crossing the grooves 12b, than in the C-axis direction vertical to the substrate surface.

In contrast, the MQW active layer 18 is grown at a high pressure of approximately 300 Torr. This is because as the growth pressure is higher, indium with a high vapor pressure can be suppressed to evaporate, so that the MQW active layer 18 can attain higher crystal quality. Accordingly, in forming the lamination body 30, the growth pressure is changed from that for growing the first and second selectively grown layers 14B and 14C.

In order to change the growth pressure in continuous growth of nitride semiconductors, one crystal growth furnace capable of changing the growth pressure during its operation may be used, or plural crystal growth furnaces respectively set to different growth pressures may be used.

The semiconductor laser diode of Embodiment 4 exhibits, similarly to that of Embodiment 3, the refractive index distribution and the light intensity distribution as shown in FIG. 15 and attains the far-field pattern of emitted light as shown in FIG. 16.

This is because the MQW active layer 18 is separated from the substrate 11 by the gaps 12c of the seed layer 12, and the n-type superlattice contact layer 15A and the second selectively grown layer 14C having a refractive index smaller than or equivalent to the n-type cladding layer 16A is formed between the n-type cladding layer 16 and the seed layer 12. Accordingly, no parasitic waveguide is formed between the n-type cladding layer 16 and the substrate 11, and the light confinement coefficient of the MQW active layer 18 can be suppressed from being reduced due to the leakage of the generated light.

In this embodiment, it is confirmed through computer simulation that the light leakage to the substrate 11 can be substantially avoided when the depth of the groove 12b is at least approximately 20 nm.

Furthermore, when the second selectively grown layer 14C includes 2% or more and preferably 4% or more of aluminum, the leakage of the generated light to the substrate 11 can be suppressed.

Figure 41:
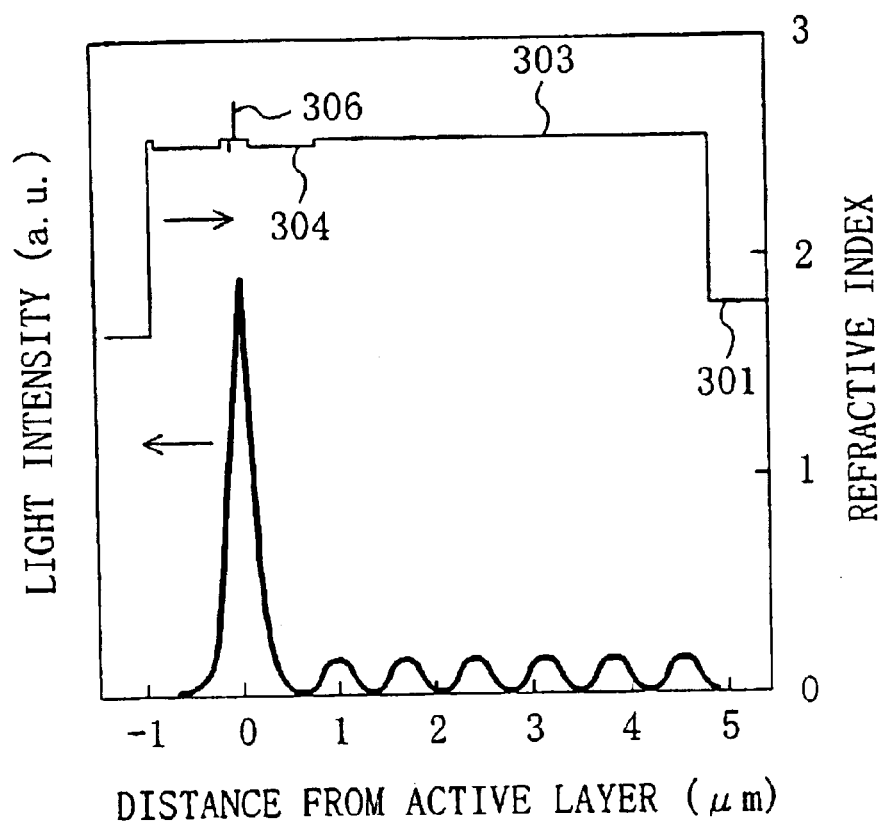
FIG. 41 is a graph for showing the relationship, in the gallium nitride-based semiconductor laser diode of Conventional Example 1, the distribution of a refractive index, along a direction vertical to a substrate surface, in a ridge and the distribution of light intensity on a cavity facet.

Owing to the aforementioned structure, the light confinement coefficient of the MQW active layer 18 is approximately 1.5 times as large as that shown in FIG. 41, resulting in reducing the threshold current of the laser diode.

Figure 38:
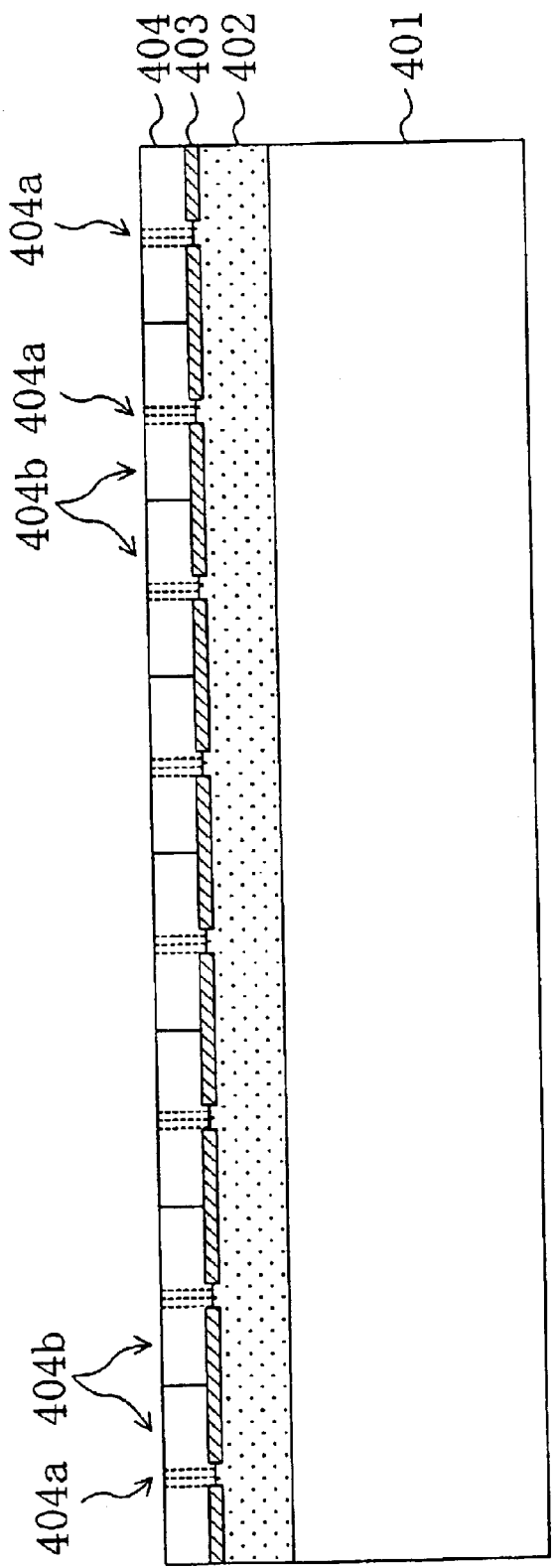
FIG. 38 is a cross-sectional view for schematically showing the distribution of crystal dislocations in gallium nitride formed by ELOG according to Conventional Example 2.

Now, a difference in the growth mechanism between the selective growth of this invention by using the top faces of the convexes 12a as the seed crystal and the selective growth of Conventional Example 2 by masking a flat seed layer in the shape of stripes shown in FIG. 38 will be described.

Figure 19A:
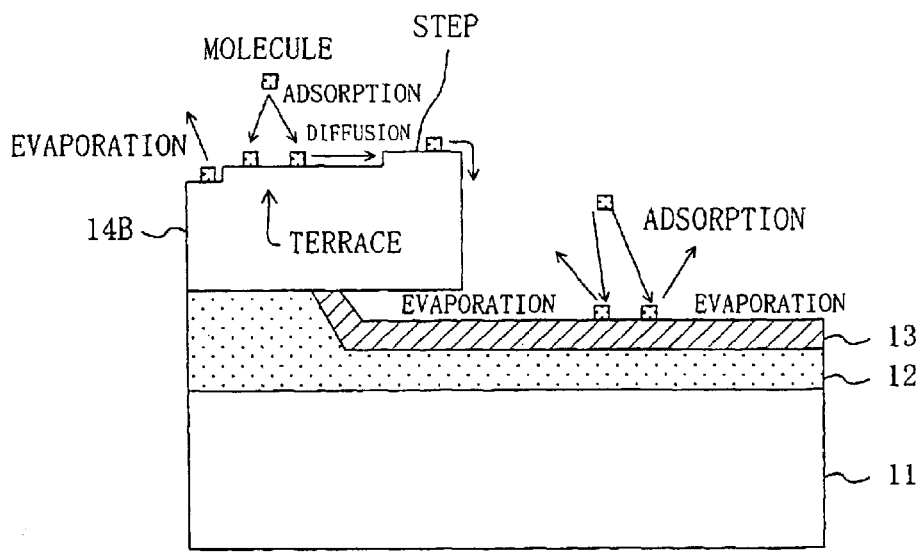
FIG. 19(a) is a cross-sectional view for schematically showing a selective growth mechanism in fabrication of the gallium nitride-based semiconductor laser diode of Embodiment 4.
Figure 19B:
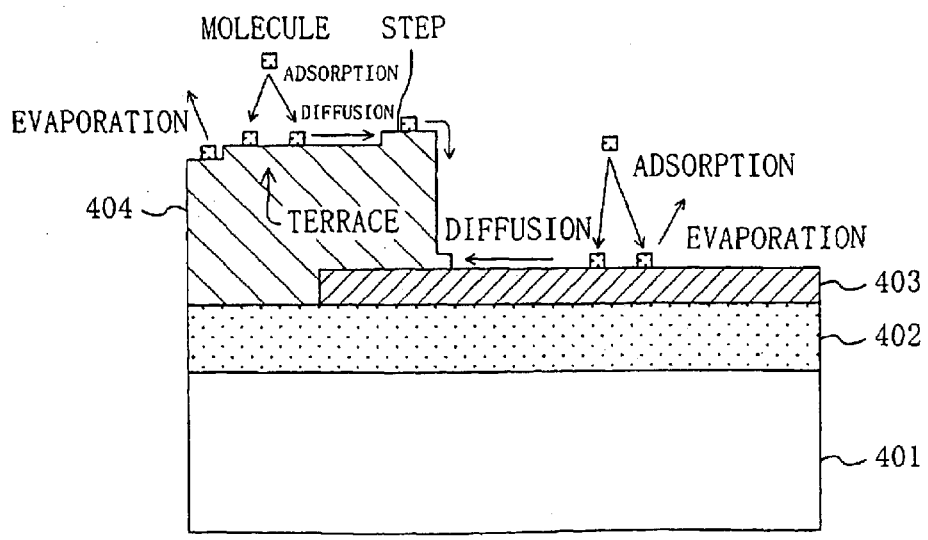
FIG. 19(b) is a cross-sectional view for schematically showing a selective growth mechanism in fabrication of a gallium nitride-based semiconductor laser diode according to Conventional Example 2.

FIG. 19(a) schematically shows the selective growth mechanism of Embodiment 4 and FIG. 19(b) schematically shows the selective growth mechanism of Conventional Example 2.

As is well known, during growth of a reaction seed of molecules or the like into a desired crystal, processes of adsorption, diffusion, evaporation and the like of the reaction seed are repeated on the surfaces of the crystal and a mask film. For example, atoms adsorbed onto the surface of a crystal of GaN are diffused over a terrace, that is, the top face of the crystal. Also, atoms adsorbed onto the surface are crystallized on a level difference portion on the terrace designated as a step.

As is shown in FIG. 19(b), the similar processes are repeated on the mask film 403 in the conventional ELOG. Specifically, atoms diffused over the mask film 403 are adsorbed on the edge of the semiconductor layer 404 of GaN. At this point, silicon or oxygen included in the mask film 403 is decomposed through a reducing function of hydrogen or ammonia so as to be incorporated into the semiconductor layer 404 as an impurity. This degrades the crystallinity of the semiconductor layer 404.

In contrast in this embodiment, as is shown in FIG. 19(a), no atoms are diffused over the mask film 13 so as to be incorporated into the first selectively grown layer 14B of GaN. This is because no crystal grows on the lower face of the first selectively grown layer 14B. Thus, the reaction seed on the mask film 13 makes a different contribution to the crystal growth from that in the conventional ELOG, which differs the growth mechanism of this invention from that of the conventional ELOG.

Although the first selectively grown layer 14B is formed from GaN and the second selectively grown layer 14C is formed from $Al_{0.05}Ga_{0.95}N$ in this embodiment, the first selectively grown layer 14B may be formed from any nitride semiconductor including 4% or less of aluminum and represented by $Al_xGa_yIn_zN$, wherein x+y+z=1.

Now, the purpose of forming the first selectively grown layer 14B by using the seed layer 12 as the seed crystal before growing the second selectively grown layer 14C with a small refractive index will be described with reference to the drawings.

As described in Embodiment 3, there is no need to form the selectively grown layer in a two-layer structure merely for controlling the lateral mode in a direction vertical to the substrate surface and increasing the light confinement coefficient of the MQW active layer 18.

Figure 20A:
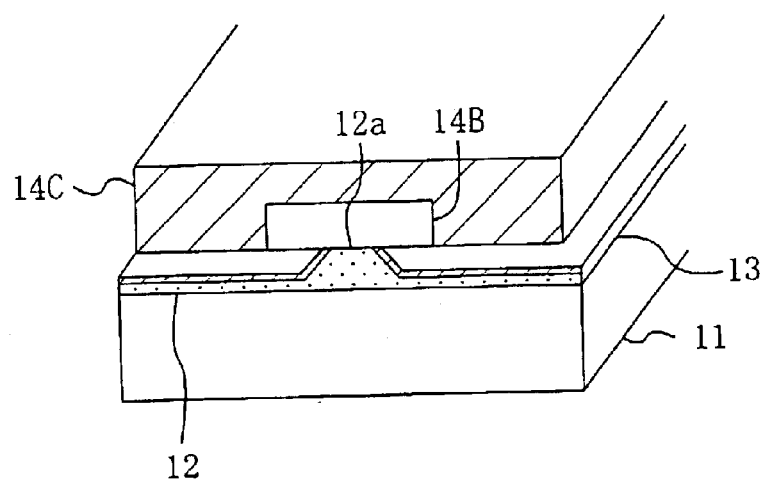
FIG. 20(a) is a partial perspective view for showing an effect of forming a selectively grown layer in two steps in the fabrication of the gallium nitride-based semiconductor laser diode of Embodiment 4.
Figure 20B:
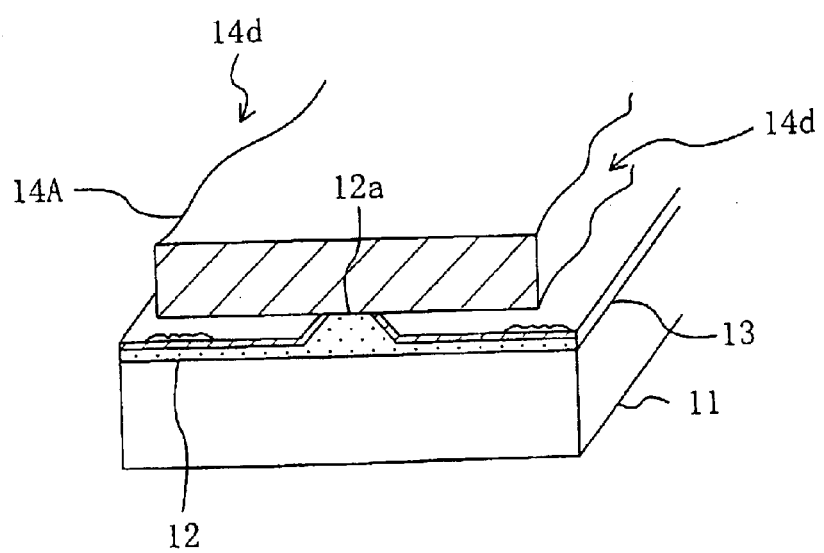
FIG. 20(b) is a partial perspective view for comparison for showing a state where roughness is caused on a side face of a selectively grown layer of a gallium nitride-based semiconductor laser diode.

However, in the case where the selectively grown layer 14A of AlGaN includes 4% or more of aluminum, roughness 14d may be caused at the end in the growing direction of the selectively grown layer 14A as is shown in FIG. 20(b). Such roughness maybe rather suppressed by appropriately setting the growth conditions for the selectively grown layer 14A, such as a growth pressure, a growth temperature and a V/III ratio, that is, a molar ratio between a group III element source and a group V element source. However, in consideration of mass production, the roughness 14d at the growth end is preferably minimized as far as possible.

The present inventors have found that a nitride semiconductor layer including aluminum in a small composition ratio is preferably used for the selectively grown layer formed by using the seed layer 12 as the seed crystal.

Specifically, as is shown in FIG. 20(a), the first selectively grown layer 14B of a gallium nitride-based semiconductor including 4% or less of aluminum is first grown in the vicinity of the convexes 12a of the seed layer 12, and then, the second selectively grown layer 14C of a gallium nitride-based semiconductor including more than 4% of aluminum and having a small refractive index is grown by using the first selectively grown layer 14B as the seed crystal. In this manner, the second selectively grown layer 14C can be satisfactorily laterally grown without causing the roughness 14d at the growth end.

Furthermore, as the composition ratio of aluminum is larger in the second selectively grown layer 14C and as the growth time is longer, more polycrystals 41 are deposited on the mask film 13. This is because the evaporation rate of the AlGaN crystal or the AlN crystal is smaller than that of the GaN crystal.

As is shown in FIGS. 21(a) through 21(d), since the first selectively grown layer 14B of GaN causing less deposition of the polycrystals 41 is first grown, the growth time required for integrating the growth ends of the second selectively grown layers 14C can be shortened.

Figure 21A:
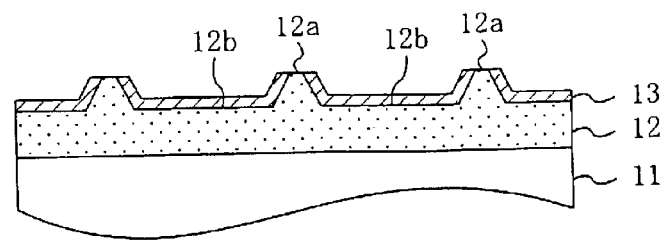
FIGS. 21(a), 21(b), 21(c) and 21(d) are schematic cross-sectional views for showing, in a stepwise manner, the characteristic of the fabrication of the gallium nitride-based semiconductor laser diode of Embodiment 4.
Figure 21B:
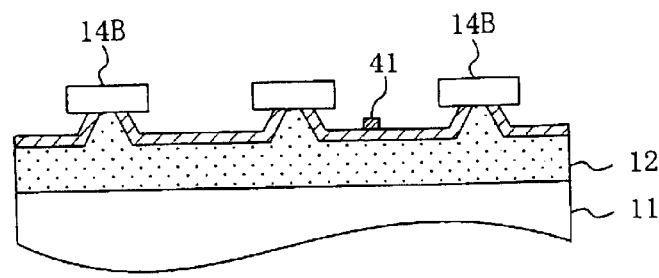
Figure 21C:
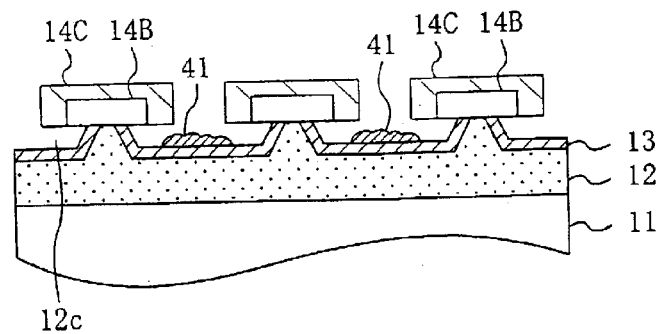
Figure 21D:
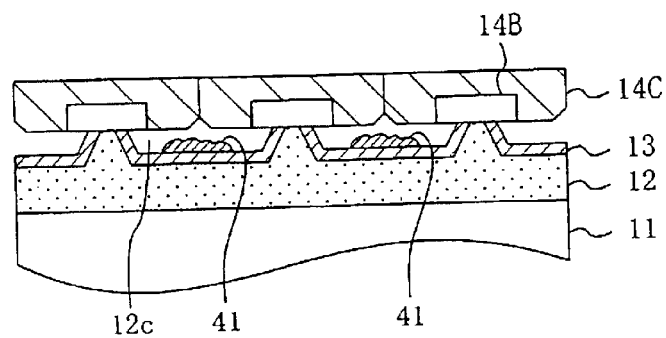

Moreover, since the first selectively grown layer 14B is grown in the shape of an umbrella as shown in FIG. 21(c), the quantity of the reaction seed supplied onto the mask film 13 can be reduced. Accordingly, the quantity of the polycrystals 41 deposited on the mask film 13 can be largely reduced, so as to minimize the harmful effect on the lamination body 30 grown above the gaps 12c. As a result, the light confinement coefficient can be definitely increased, and the production yield can be definitely improved because the crystallinity of the lamination body 30 is so improved that the variation in the operation characteristic of the laser diode is largely reduced.

Although the substrate 11 is made from sapphire in this embodiment, for example, silicon carbide, neodymium gallate, gallium nitride or the like may be used instead of sapphire.

Also, the mask film 13 can be formed merely on the bottoms of the grooves 12b as far as the gaps 12c can be formed.

Furthermore, the mask film 13 may be formed from a dielectric such as silicon nitride and silicon oxide by the ECR sputtering, and more preferably, is formed from a metal with a high melting point such as tungsten or its silicide.

Embodiment 5

Embodiment 5 of this invention will now be described with reference to the accompanying drawings.

Figure 22:
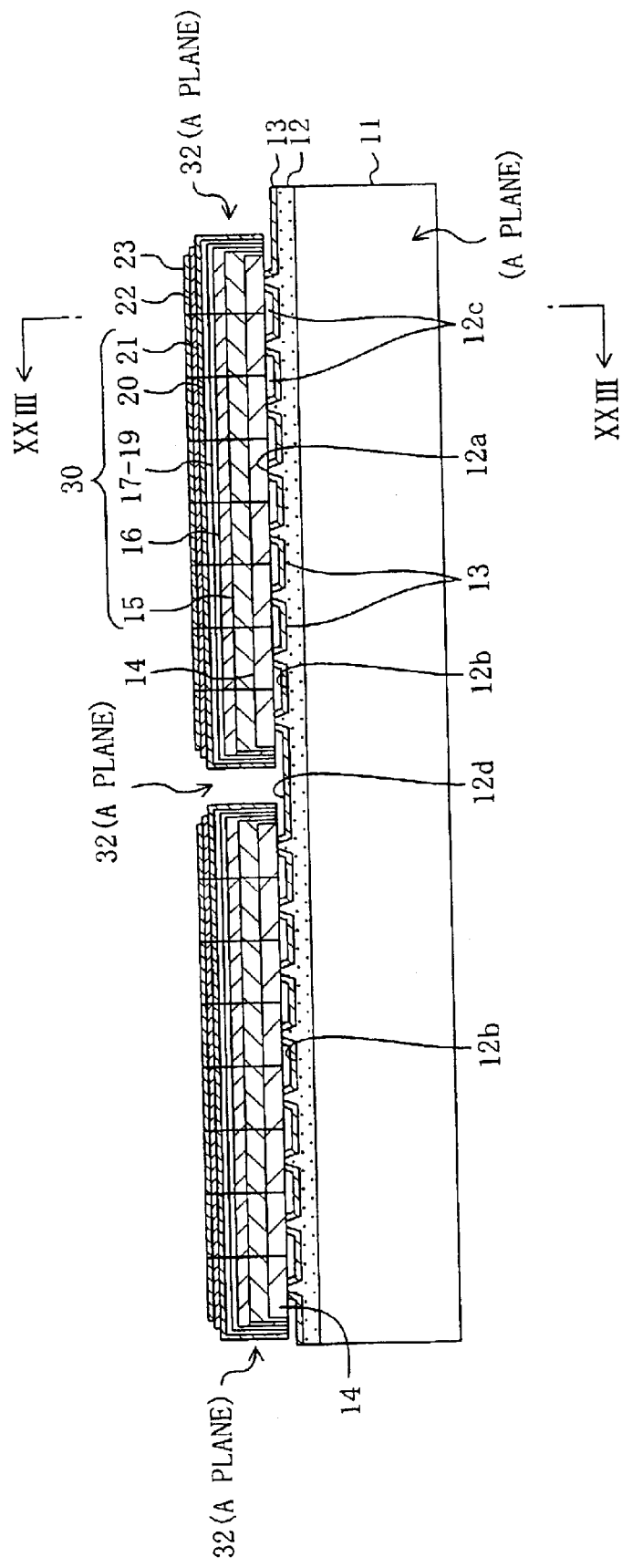
FIG. 22 is a cross-sectional view for showing the structure of a gallium nitride-based semiconductor laser diode according to Embodiment 5 taken on the M plane of a lamination body, namely, the A plane of a substrate.
Figure 23:
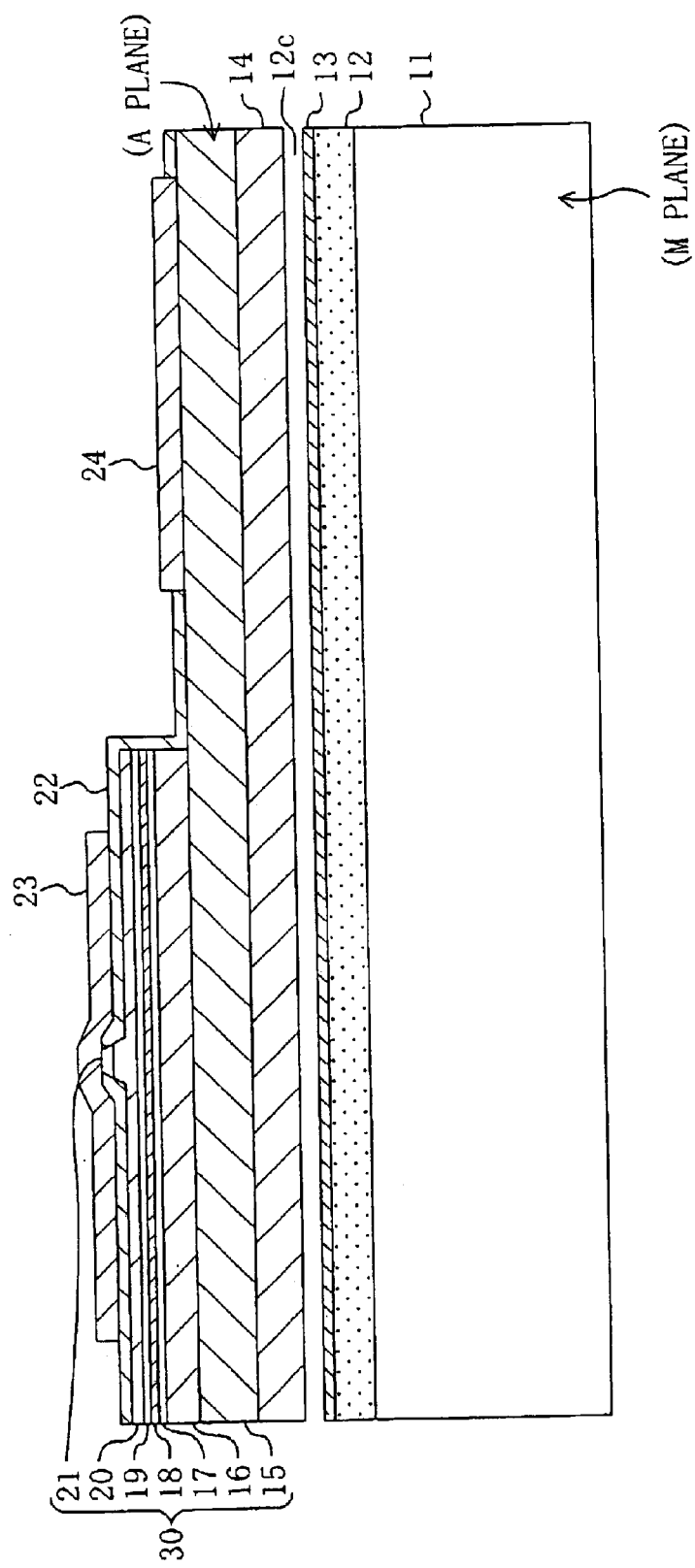
FIG. 23 is a cross-sectional view of the gallium nitride-based semiconductor laser diode of Embodiment 5 taken on line XXIII—XXIII of FIG. 22.

FIGS. 22 and 23 show a gallium nitride-based semiconductor laser diode according to Embodiment 5, wherein FIG. 22 shows the sectional structure taken on the M plane of a lamination body, namely, the A plane of a substrate, and FIG. 23 shows the sectional structure taken on line XXIII—XXIII of FIG. 22 corresponding to the A plane of the lamination body, namely, the M plane of the substrate. In FIGS. 22 and 23, like reference numerals are used to refer to like elements shown in FIG. 1 so as to omit the description.

Embodiment 5 is characterized by definitely fabricating a semiconductor laser diode with a flat cavity facet 32 by using the lamination body 30 including the MQW active layer 18.

As is shown in FIG. 22, in an upper portion of the seed layer 12, a cyclic structure including, as one cycle, the convex 12a with a sectional width of approximately 3 μm and the groove 12b with a sectional width of approximately 12 μm is formed, and every 34 cycles (corresponding to a length of 510 μm) of the cyclic structure, an enlarged groove 12d with an enlarged sectional width of approximately 20 μm is formed.

Figure 43:
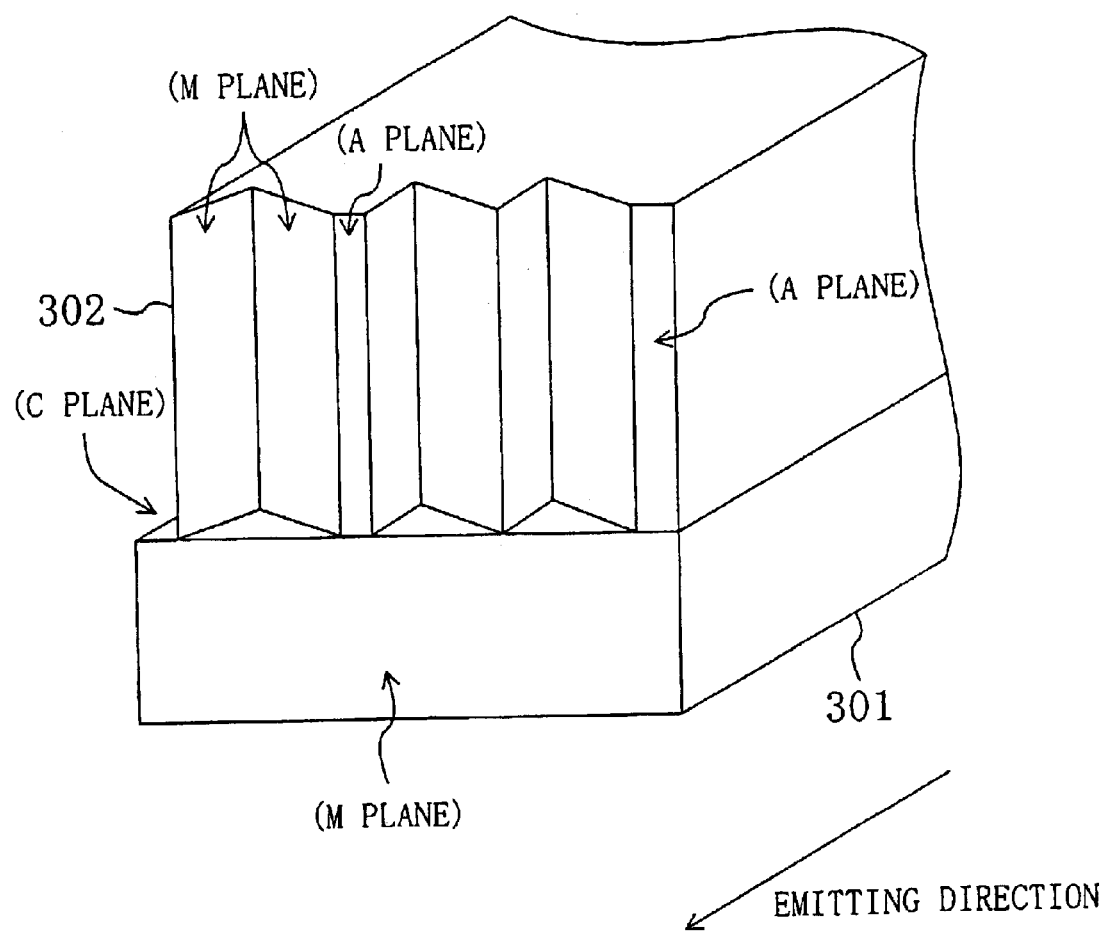
FIG. 43 is a schematic perspective view of cleaved ends of a substrate and a cavity in the gallium nitride-based semiconductor laser diode of Conventional Example 1.

When the lamination body 30 is formed in the same manner as in Embodiment 1, the lamination bodies 30 laterally grown by using the top faces of the respective convexes 12a of the seed layer 12 as the seed crystal are not integrated above the enlarged groove 12d. Therefore, the A planes of the adjacent lamination bodies 30 appear above the enlarged groove 12d without being in contact with each other. These growth ends are naturally formed crystal planes, and includes no other surface orientations such as the M plane. Accordingly, when such a growth end is used as the cavity facet 32, the mirror loss on the cavity facet derived from mixture of the A plane and the M plane as in the conventional semiconductor laser diode of FIG. 43 can be avoided.

When the growth end with the naturally formed A plane is observed with an atomic-force-microscopy (AFM), it is confirmed that the end has a very flat surface with an average of a square of the roughness smaller than 1 nm.

Furthermore, when the growth end is used as the cavity facet 32, the P-type light guiding layer 19 and the p-type cladding layer 20 with larger energy gap than the MQW active layer 18 can be formed on the cavity facet 32. Therefore, emitted light is never absorbed at the ends of the p-type light guiding layer 19 and the p-type cladding layer 20. As a result, the temperature increase in the lamination body 30 in the vicinity of the cavity facet 32 can be suppressed, and hence, the reliability can be prevented from degrading due to degradation of the facet.

In the semiconductor laser diode of Embodiment 5, the ELOG using the top faces of the convexes 12*a* in the shape of stripes as the seed crystal is employed, and the enlarged grooves 12*d* are formed in a cycle larger than that of the grooves 12*b* formed by the side faces of the convexes 12*a*. Therefore, the growth end of the lamination body 30 is directly exposed above the enlarged groove 12*d*, and hence, the naturally formed exposed end can be formed into the cavity facet 32. When the semiconductor laser diode having such a cavity facet is compared with the semiconductor laser diode of Conventional Example 2 of FIG. 39 in the threshold value for laser action, the threshold value of the laser diode of this embodiment is lower by approximately 30% than that of the conventional laser diode.

Although the substrate 11 is formed from sapphire in this embodiment, for example, silicon carbide, neodymium gallate (NGO), gallium nitride or the like may be used instead of sapphire.

Also, the mask film 13 may be formed merely on the bottoms of the grooves 12*b* as far as the gaps 12*c* can be formed.

Furthermore, the mask film 13 may be formed from a dielectric such as silicon nitride and silicon oxide by the ECR sputtering, and more preferably, is formed from a metal with a high melting point such as tungsten or its silicide.

Moreover, the widths of the convex 12*a* and the groove 12*b* formed in the upper portion of the seed layer 12 are not limited to 3 $\mu$m and 12 $\mu$m, respectively but the convex 12*a* preferably has a smaller width than the groove 12*b*. In this manner, the influence of dislocations propagated from the seed crystal on the top faces of the convexes 12*a* to the lamination body 30 can be reduced, and the degradation of the laser operation characteristics due to the dislocations can be prevented, resulting in improving the reliability of the laser diode.

Also, the cycle of forming the enlarged grooves 12*d* in the upper portion of the seed layer 12 may be set to an appropriate value in accordance with the length of the cavity.

In Embodiment 5, the stripe direction of the convexes 12*a* is set to the M-axis direction of the lamination body 30 so as to use the naturally formed A plane as the cavity facet 32. Instead, when the stripe direction of the convexes 12*a* is set to the A-axis direction perpendicular to the M-axis of the lamination body 30, the M plane can be naturally formed. Accordingly, when the convexes 12*a* are formed in the shape of stripes extending along the A-axis direction, a highly reliable semiconductor laser diode including the naturally formed M plane as the cavity facet 32 and having a largely reduced threshold current can be obtained.

Modification 1 of Embodiment 5

Modification 1 of Embodiment 5 will now be described with reference to the accompanying drawing.

Figure 24:
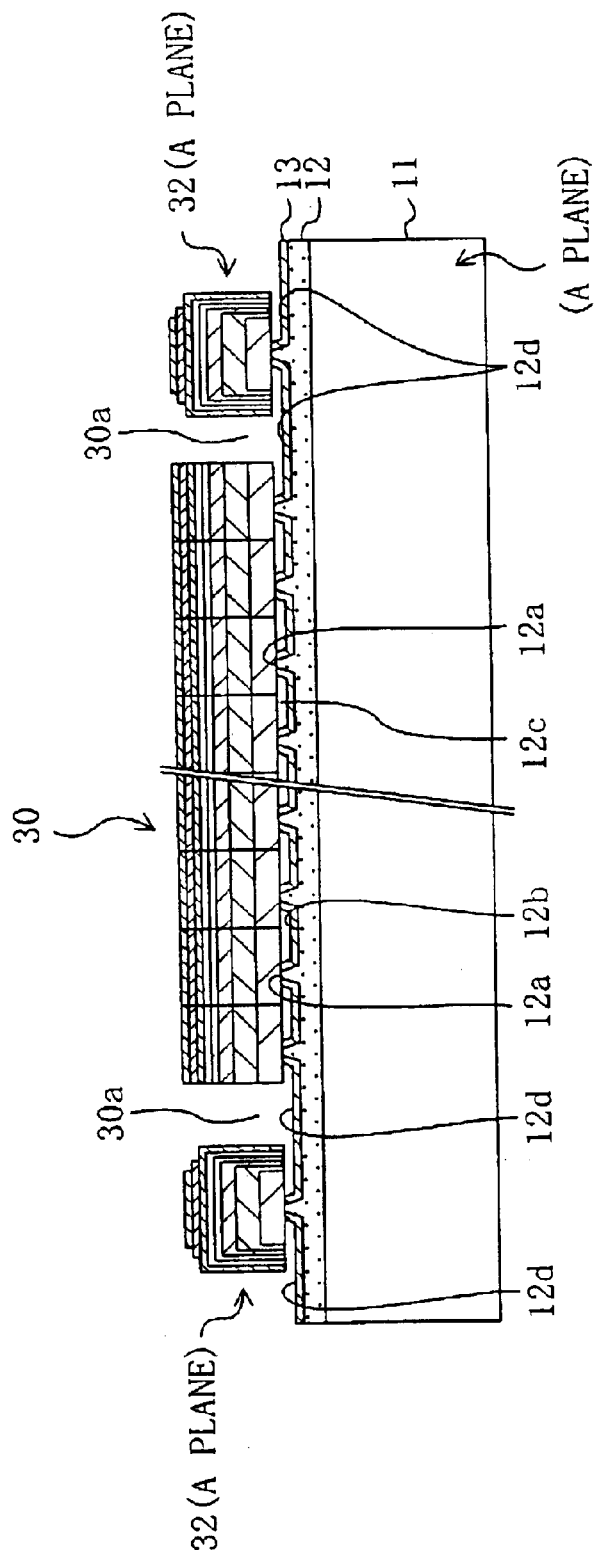
FIG. 24 is a cross-sectional view for showing the structure of a gallium nitride-based semiconductor laser diode according to Modification 1 of Embodiment 5 taken on the M plane of a lamination body, namely, the A plane of a substrate.

FIG. 24 shows the sectional structure of a gallium nitride-based semiconductor laser diode of Modification 1 of Embodiment 5 taken on the M plane of a lamination body, namely, the A plane of a substrate. In FIG. 24, like reference numerals are used to refer to like elements shown in FIG. 22.

As is shown in FIG. 24, in the semiconductor laser diode of Modification 1, an enlarged groove 12*d* with an enlarged sectional width of approximately 20 $\mu$m is formed on the inside of and adjacent to the enlarged groove 12*d* for naturally forming the cavity facet 32 of the lamination body 30. Accordingly, side gaps 30*a* having the A plane as the opposing faces are formed on both sides of the lamination body 30 close to the cavity facets.

Since the side gap 30*a* having a refractive index of 1 and the lamination body 30 of a gallium nitride-based semiconductor having a refractive index of approximately 2.6 are combined to form the cavity facet 32, a large difference in the refractive index can be obtained. Accordingly, the reflectance of a laser beam on the cavity facet 32 can be increased as compared with the case where the cavity facet is coated with a dielectric film or the like.

For the purpose of increasing the reflectance of a laser beam on the cavity facet 32, an isolation body isolated from the lamination body 30 by the side gap 30*a* preferably has a lateral dimension, along the light emitting direction, of an integral multiple of $\lambda/(4n)$, wherein $\lambda$ indicates the wavelength of light and n indicates the refractive index of the isolation body.

Although the side gaps 30*a* are formed on both sides of the lamination body 30 in this modification, the side gap 30*a* may be formed on either side of the lamination body 30 for increasing the reflectance so as to increase the output power of emitted light.

According to this modification, the threshold current for laser action is reduced by approximately 20% as compared with the case where the side gaps 30*a* are not formed, and thus, the effect attained by the side gaps 30*a* is remarkable. It is noted that the lamination body 30 may include three or more side gaps 30*a*.

Modification 2 of Embodiment 5

Figure 25:
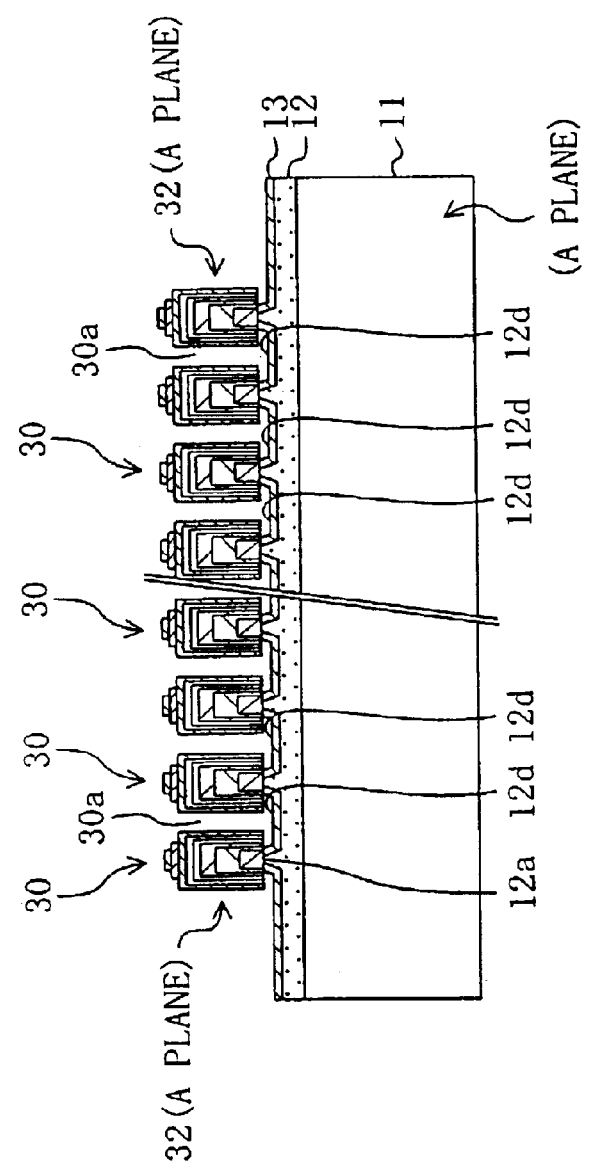
FIG. 25 is a cross-sectional view for showing the structure of a gallium nitride-based semiconductor laser diode according to Modification 2 of Embodiment 5 taken on the M plane of a lamination body, namely, the A plane of a substrate.

FIG. 25 shows Modification 2 of Embodiment 5, wherein all the grooves in the shape of stripes formed in the upper portion of the seed layer 12 are formed as enlarged grooves 12*d*.

In this manner, plural lamination bodies 30 are all isolated from one another on the substrate 11. Accordingly, when a cavity is formed from plural isolation bodies so as to obtain a desired cavity length and the substrate 11 is divided in a side gap 30*a* in a position corresponding to the facet of the thus formed cavity, one semiconductor laser diode including plural isolation bodies can be obtained.

Accordingly, the semiconductor laser diode of Modification 2 has a very flat A plane free from irregularities causing mirror loss of a laser beam, and when the number of isolation bodies included in the laser diode is changed, the cavity length can be easily changed.

Furthermore, when the substrate 11 is divided in every enlarged groove 12*d*, a laser diode including one convex 12*a* and having a cavity length of approximately 15 $\mu$m can be obtained. In a conventional technique to simultaneously cleave a substrate and a lamination body, it is very difficult to fabricate such a small cavity with keeping the flatness of the cavity facet.

Modification 3 of Embodiment 5

In Modification 3 of Embodiment 5, convexes in the shape of stripes are further formed in an upper portion of a selectively grown layer so as to completely eliminate crystal dislocations from the lamination body 30. Thus, the reliability of the semiconductor laser diode can be further improved.

Figure 26:
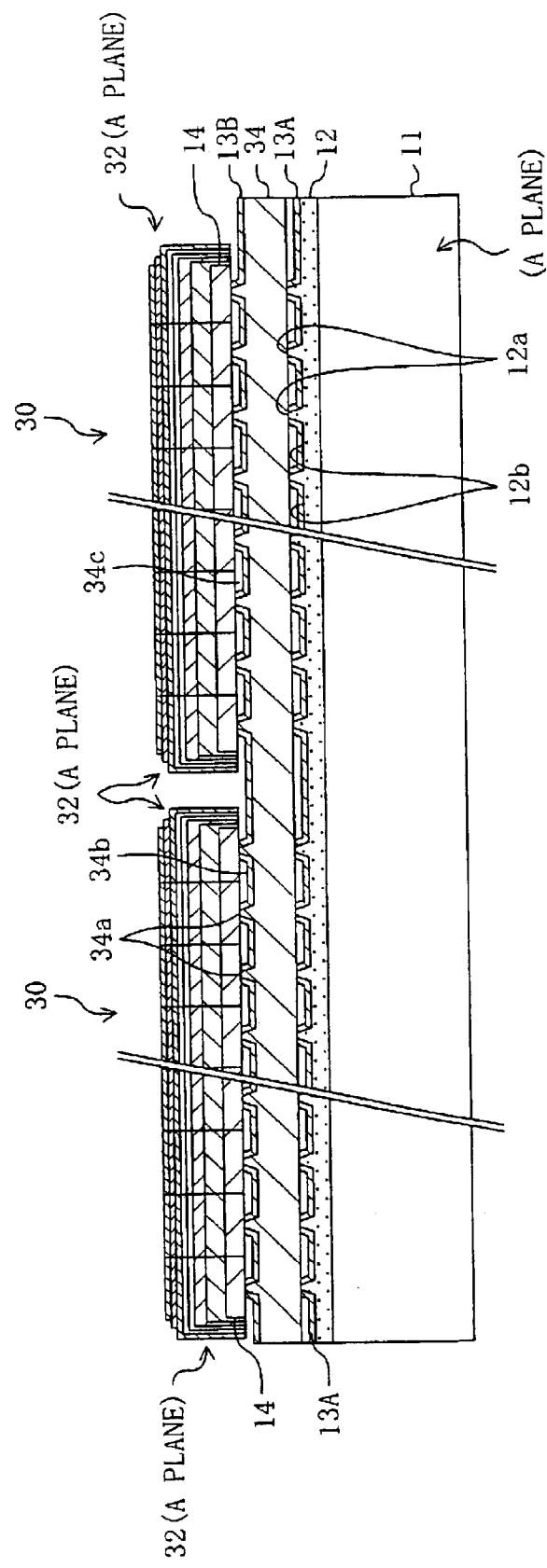
FIG. 26 is a cross-sectional view for showing the structure of a gallium nitride-based semiconductor laser diode according to Modification 3 of Embodiment 5 taken on the M plane of a lamination body, namely, the A plane of a substrate.

As is shown in FIG. 26, on a seed layer 12 having convexes 12a and grooves 12b in the upper portion with a first mask film 13A formed on the bottoms and the walls of the grooves 12b, a selectively grown seed layer 34 is integrally formed through the ELOG.

In an upper portion of the selectively grown seed layer 34, convexes 34a and grooves 34b are formed in an equivalent cycle of the convexes 12a and the grooves 12b of the seed layer 12, and a second mask film 13B is formed on the bottoms and the walls of the grooves 34b.

In this case, the convexes 34a are formed above the grooves 12b so as to be formed neither in a dislocation low-density region nor in a junction portion of the selectively grown seed layer 34.

In this manner, according to Modification 3, the selectively grown layer 14 is grown by using, as the seed crystal, the C plane on the top faces of the convexes 34a formed in the upper portion of the selectively grown seed layer 34. On the top face of the convex 34a appears a high quality crystal face free from not only dislocations derived from the seed crystal on the top face of the convex 12a of the seed layer 12 but also a defect derived from the junction portion of the selectively grown seed layer 34. As a result, the lamination body 30 formed on the high quality selectively grown layer 14 is free from defectives. Accordingly, it is possible to avoid loss resulting from scatter of a laser beam due to a crystal defective and degradation of the reliability through a non-luminescent process of carriers. Thus, this modification realizes a very high quality gallium nitride-based semiconductor laser diode.

Embodiment 6

Embodiment 6 of the invention will now be described with reference to the accompanying drawings.

Figure 27:
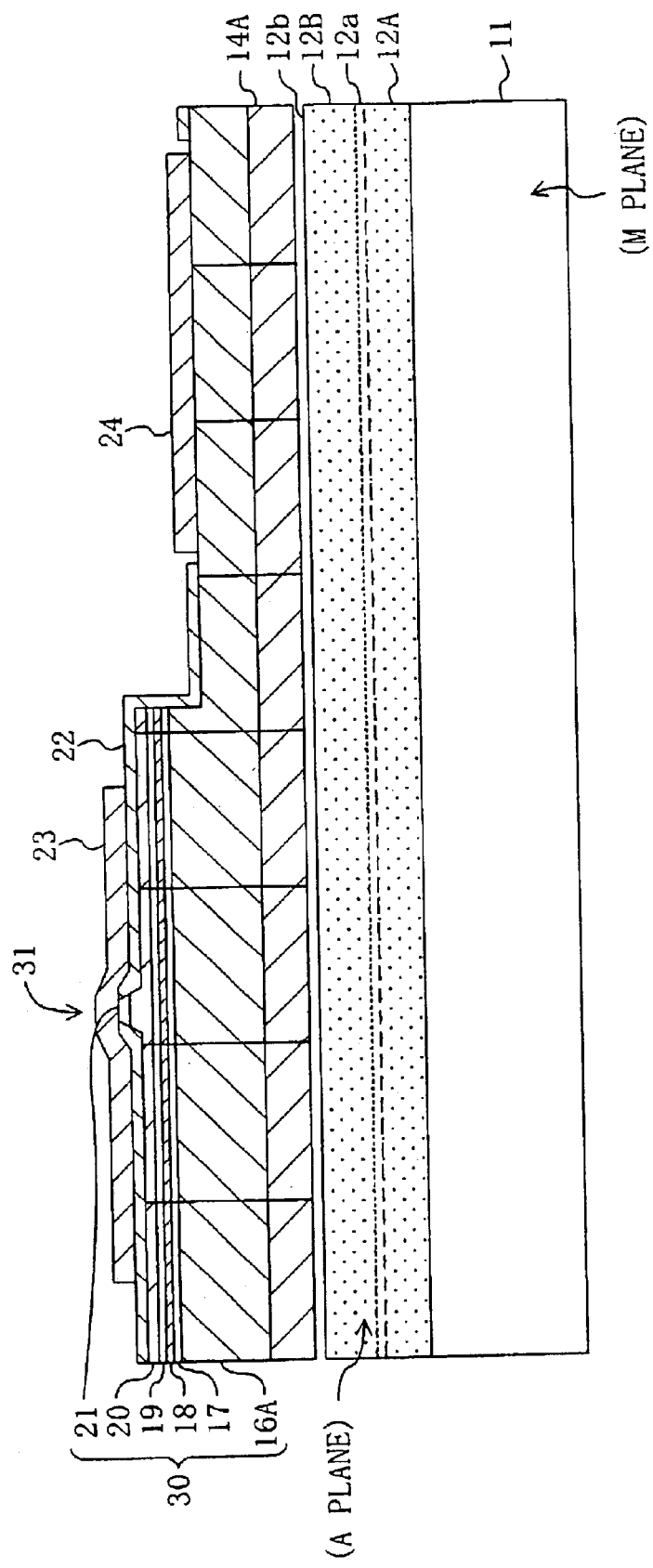
FIG. 27 is a cross-sectional view for showing the structure of a gallium nitride-based semiconductor laser diode according to Embodiment 6 of the invention taken on the A plane of a lamination body, namely, the M plane of a substrate.

FIG. 27 shows the sectional structure of a gallium nitride-based semiconductor laser diode of Embodiment 6 taken on the A plane of a lamination body, namely, the M plane of a substrate. In FIG. 27, like reference numerals are used to refer to like elements used in Embodiment 3 shown in FIG. 14 so as to omit the description.

Herein, structural differences from the structure of Embodiment 3 alone will be described.

As is shown in FIG. 27, a first seed layer 12A and a second seed layer 12B are formed on the substrate 11 of sapphire.

In an upper portion of the first seed layer 12A, convexes 12a and grooves 12b in the shape of stripes are formed in parallel to the M plane of the substrate 11, namely, the A plane of the lamination body 30. Similarly, in an upper portion of the second seed layer 12B, the convexes 12a and the grooves 12b in the shape of stripes are formed in parallel to the convexes 12a and the grooves 12b of the first seed layer 12A so as not to overlap them in a direction vertical to the substrate surface.

Now, a method of fabricating the semiconductor laser diode having the aforementioned structure will be described with reference to the drawings.

FIGS. 28(a), 28(b), 29(a), 29(b), 30(a), 30(b) and 31 are sectional views taken on the A plane of the substrate for showing procedures in the method of fabricating the semiconductor laser diode of this embodiment.

Figure 28A:
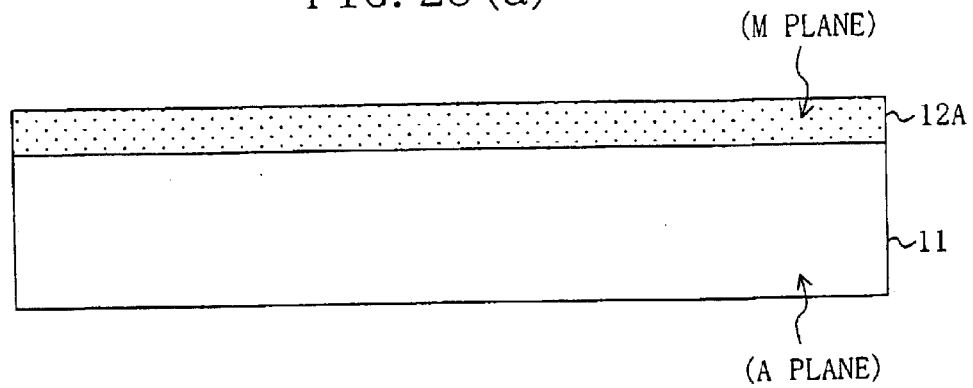
FIGS. 28(a) and 28(b) are cross-sectional views for showing procedures in fabrication of the gallium nitride-based semiconductor laser diode of Embodiment 6.

First, as is shown in FIG. 28(a), a low temperature buffer layer (not shown) of GaN is deposited on a substrate 11 having the C plane as the principal plane by the MOVPE by supplying TMG as a group III element source and $NH_3$ as a nitrogen source with the substrate temperature set to approximately 530° C. in a mixed atmosphere of hydrogen and nitrogen, for example, at a pressure of approximately 300 Torr. Subsequently, after the substrate temperature is increased to approximately 970° C., TMG, $NH_3$ and $SiH_4$ are supplied onto the substrate 11, thereby growing a first seed layer 12A of n-type GaN with a thickness of approximately 0.5 through 1 μm. At this point, the principal plane of the first seed layer accords with the C plane, and the order of a dislocation density is $10^9$ $cm^{-2}$.

Figure 28B:
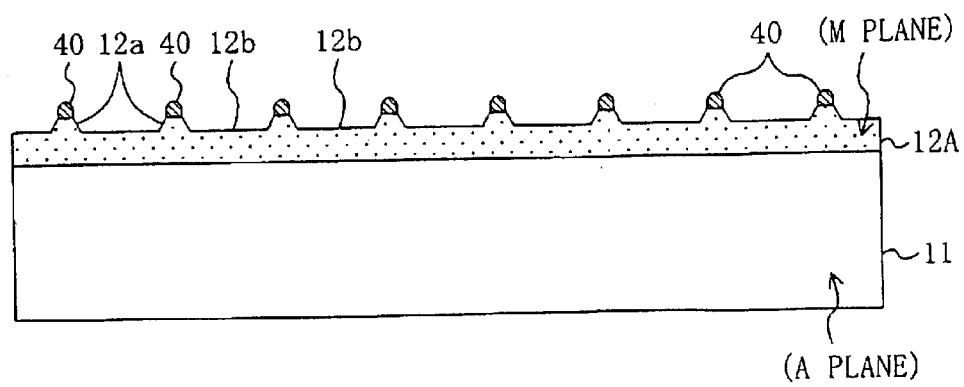

Next, as is shown in FIG. 28(b), after applying a resist film on the first seed layer 12A, the resist film is patterned by the photolithography into stripes extending along the M-axis direction of the first seed layer 12A, thereby forming a resist pattern 40. Subsequently, by using the resist pattern 40 as a mask, the first seed layer 12A is dry etched, thereby forming, in an upper portion of the first seed layer 12A, a cyclic structure including, as one cycle, a convex 12a with a sectional width of approximately 3 through 6 μm and a groove 12b with a sectional width of approximately 12 through 24 μm. At this point, the groove 12b has a depth of approximately 50 nm through 1 μm.

Figure 29A:
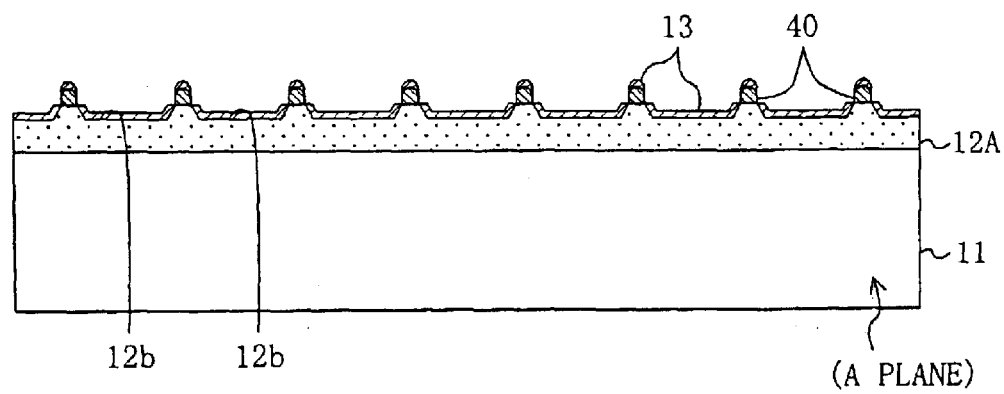
FIGS. 29(a) and 29(b) are cross-sectional views for showing other procedures in the fabrication of the gallium nitride-based semiconductor laser diode of Embodiment 6.

Then, as is shown in FIG. 29(a), a mask film 13 of silicon nitride is deposited on the bottoms and the walls of the grooves 12b of the first seed layer 12A and the resist pattern 40 by the ECR sputtering. Also in this case, solid silicon is used as the raw material for silicon, nitrogen is used as a reaction gas, and argon is used as plasma gas.

Figure 29B:
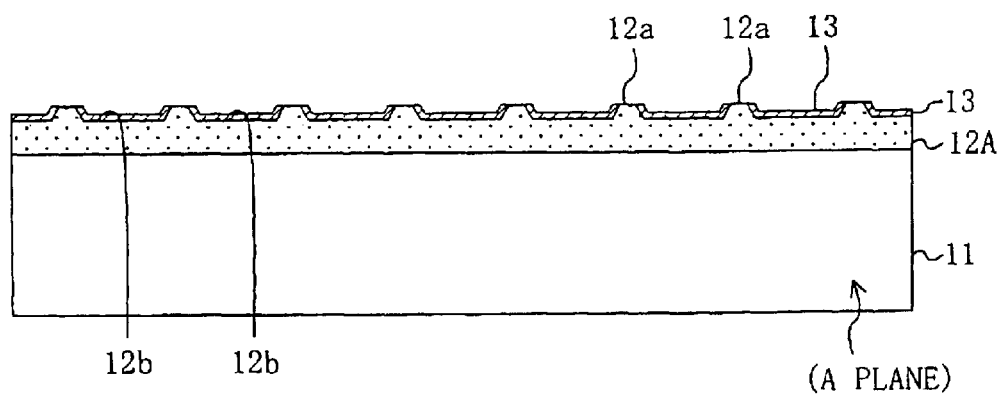

Next, as is shown in FIG. 29(b), the resist pattern 40 is lifted off, thereby removing the resist pattern 40 and a portion of the mask film 13 deposited on the resist pattern 40. The mask film 13 may cover whole or a part of the wall of the groove 12b.

Figure 30A:
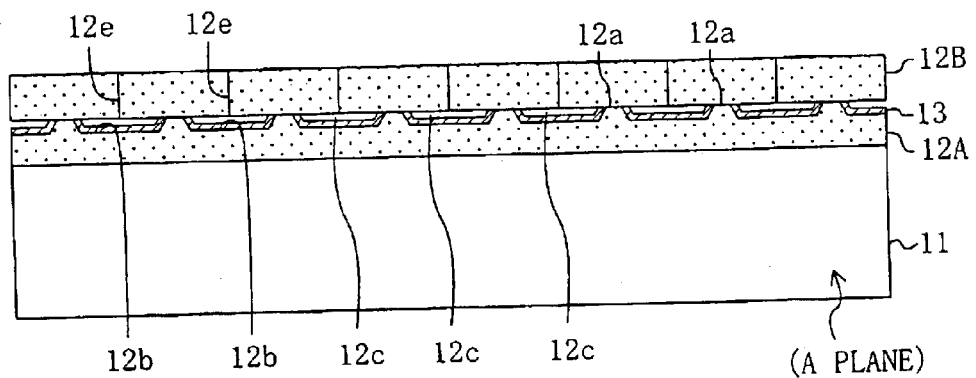
FIGS. 30(a) and 30(b) are cross-sectional views for showing still other procedures in the fabrication of the gallium nitride-based semiconductor laser diode of Embodiment 6.

Then, as is shown in FIG. 30(a), after increasing the substrate temperature to approximately 1000° C., TMG, $NH_3$ and $SiH_4$ are supplied onto the first seed layer 12A by the MOVPE again in a mixed atmosphere of hydrogen and nitrogen, for example, at a pressure of approximately 100 Torr, so as to grow a second seed layer 12B of n-type GaN by using, as the seed crystal, portions of the first seed layer 12A exposed from the mask film 13. At this point, the second seed layer 12B grows upward from the top faces of the convexes 12a as well as laterally grows in a direction parallel to the substrate surface. The crystals grown from the both sides of the groove 12b meet at substantially the center of the groove 12b so as to form a junction portion 12e. In this manner, the respective crystals grown from the top faces of the plural convexes 12a are integrated one another, so as to form the second seed layer 12B having the C plane as the top face. Also, at this point, plural gaps 12c are formed to be surrounded with the bottoms and the walls of the grooves 12b of the first seed layer 12A and the lower face of the second seed layer 12B. The thickness of the second seed layer 12B depends upon the width and the like of the groove 12b and is approximately 2 through 6 μm.

In a selectively grown region of the second seed layer 12B excluding the junction portions 12e, threading dislocations are observed at a dislocation density of approximately $1 \times 10^6$ $cm^{-2}$, while crystal dislocations are observed in the junction portion 12e in a dislocation density, in a direction parallel to the C plane, of approximately $4 \times 10^7$ $cm^{-2}$.

Furthermore, a tilt angle between the C-axis in a portion of the second seed layer 12B above the convex 12a and the C-axis in a portion thereof above the gap 12c is 0.01 through 0.03 degree.

The tilt angle is thus very small in the ELOG of this embodiment as compared with that in the conventional ELOG because the second seed layer 12B corresponding to a crystal layer formed through the ELOG is not in contact with the first seed layer 12A and hence no stress is applied to the interface with the mask film 13 differently from the conventional ELOG.

It is noted that a void in the shape of a reverse V having an opening on the gap 12c is formed in a lower portion of the junction portion 12e.

Furthermore, according to this embodiment, even when polycrystals are deposited on the bottoms of the grooves 12b in the selective growth of the second seed layer 12B, the polycrystals are not in contact with the second seed layer 12B owing to a level difference caused by the convexes 12a and the grooves 12b formed in the upper portion of the first seed layer 12A, and hence do not harmfully affect the crystallinity of a lamination body 30 including the laser structure. As a result, the variation in the operation characteristics of the laser diode including the lamination body 30 can be reduced, so as to improve the yield.

Figure 30B:
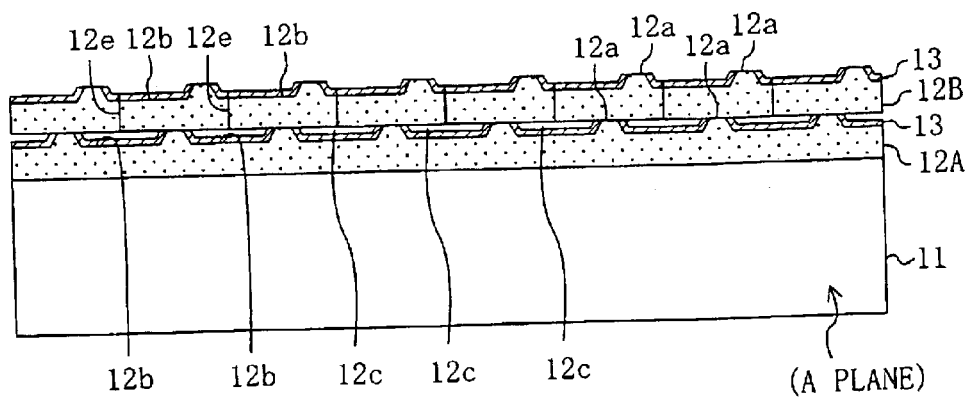

Next, as is shown in FIG. 30(b), a cyclic structure including, as one cycle, the convex 12a and the groove 12b is formed in the upper portion of the second seed layer 12B in the same manner as in the first seed layer 12A. At this point, it is preferred that the convexes 12a of the second seed layer 12B are formed so as to have their top faces positioned above the dislocation low-density regions of the second seed layer 12B. Specifically, the top faces of the convexes 12a of the second seed layer 12B are formed in positions different from the top faces of the convexes 12a of the first seed layer 12A in a direction along the substrate surface and on sides of the junction portions 12e.

In this manner, the second ELOG can be conducted by using, as the seed crystal, the dislocation low-density regions of the second seed layer 12B positioned above the gaps 12c of the first seed layer 12A. Since a gallium nitride-based crystal is transparent against visible light, the convex 12a and the groove 12b can be easily identified from each other with an optical microscope. Therefore, there is no need to use a dedicated alignment pattern in determining the positions of the convexes 12a in the stripe pattern in the photolithography.

Figure 31:
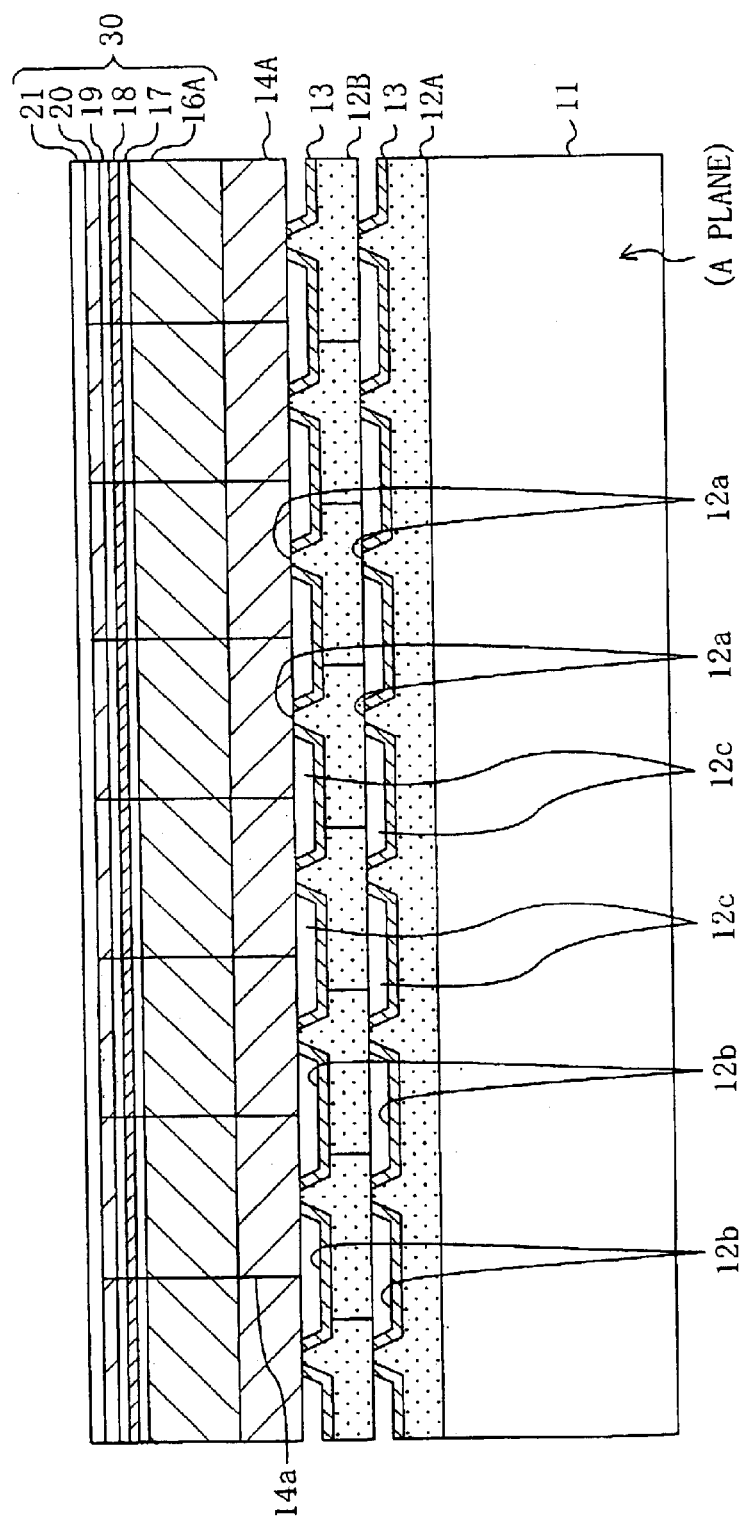
FIG. 31 is a cross-sectional view for showing another procedure in the fabrication of the gallium nitride-based semiconductor laser diode of Embodiment 6.

Then, as is shown in FIG. 31, selectively grown layers 14A of n-type AlGaN having the C plane as the principal plane are grown to be integrated on the second seed layer 12B by the MOVPE in, for example, a mixed atmosphere of hydrogen and nitrogen at a pressure of approximately 100 Torr at a substrate temperature of approximately 1000° C. by using, as the seed crystal, the C plane appearing on the top faces of the convexes 12a exposed from the mask film 13. In this manner, in all the regions of the selectively grown layers 14A excluding junction portions 14a cyclically formed, the dislocation density is as small as approximately $1\times10^6$ cm$^{-2}$.

Subsequently, in a mixed atmosphere of hydrogen and nitrogen at a pressure of approximately 300 Torr and at a substrate temperature of approximately 970° C., an n-type superlattice cladding layer 16A, an n-type light guiding layer 17, a MQW active layer 18, a p-type light guiding layer 19, a p-type cladding layer 20 and a p-type contact layer 21 are successively grown on the integrated selectively grown layer 14A, so as to form the lamination body 30. At this point, the MQW active layer 18 includes, for example, a well layer of $Ga_{0.92}In_{0.08}N$ with a thickness of approximately 4 nm and a barrier layer of GaN with a thickness of approximately 6 nm, so as to show laser action at a wavelength of 400 nm band.

Thereafter, as is shown in FIG. 27, a ridge 31 with a width of 2 through 5 $\mu$m for selectively injecting a current into the MQW active layer 18 is formed in the A-axis direction of the lamination body 30, namely, in a direction perpendicular to the direction of the stripes of the convexes 12a by the dry etching from an upper portion of the p-type cladding layer 20 and the p-type contact layer 21.

Subsequently, the lamination body 30 excluding the ridge 31 is dry etched, so as to partly expose the n-type superlattice cladding layer 16A, and an insulating film 22 is deposited on the exposed faces of the lamination body 30. Then, openings are formed in the insulating film 22 in positions on the ridge 31 and the n-type superlattice cladding layer 16A. Thereafter, a p-side electrode 23 is formed on a portion on the ridge 31 exposed in the opening of the insulating film 22 and around the ridge 31, and an n-side electrode 24 is formed on a portion of the n-type superlattice cladding layer 16A exposed in the opening of the insulating film 22 by the evaporation or the sputtering.

Next, a cavity facet is formed through the cleavage on the A plane of the lamination body 30, namely, on the M plane of the substrate 11 of sapphire. Since the M plane of sapphire can be easily cleaved, the yield in the cleavage of the semiconductor laser diode can be satisfactorily retained. Although the plural gaps 12c in two stages extending in parallel to the cleaved end are present between the substrate 11 and the lamination body 30, these gaps 12c never lower the yield in the cleavage.

Then, the cleaved end is coated with a dielectric or the like so as to attain appropriate reflectance, and the substrate is divided into chips. Thus, the semiconductor laser diode of FIG. 27 is fabricated.

As a characteristic of the semiconductor laser diode of Embodiment 6, the cavity formed in the A-axis direction of the lamination body 30 including the MQW active layer 18 is provided in a direction perpendicular to the gaps 12c formed through the selective growth in the shape of stripes extending in the M-axis direction.

In this case, as is understood from FIG. 31, the current injecting region for the MQW active layer 18 extending in the lengthwise direction of the ridge 31 crosses the junction portion 14a of the semiconductor layers. As a result, dislocations collected in the junction portion 14a can affect the operation of the laser diode. It is, however, confirmed through observation of dislocations within the MQW active layer 18 that threading dislocations are present on the plane uniformly at a density of approximately $1\times10^6$ cm$^{-2}$ regardless of the junction portion 14a. Accordingly, the current injecting region crossing the junction portion 14a does not harmfully affect the reliability of the semiconductor laser diode.

Furthermore, when a tilt is present in the C-axis between the second seed layer 12B serving as the seed crystal and the selectively grown layer 14A, a zigzag waveguide waving in the direction vertical to the substrate surface is formed so as to cause guide loss in the cavity formed in the A-axis direction. As a result, the operation current of the laser diode can be increased. Actually, in a laser diode fabricated by the conventional ELOG as shown in FIG. 38, a tilt angle is as large as 0.1 degree or more. Therefore, when the width of the gap 12c is, for example, 12 $\mu$m, a zigzag waveguide with a level difference of 10 nm or more is formed, resulting in increasing the operation current of the laser diode.

On the other hand, when the tilt angle is 0.05 degree or less, the level difference in the waveguide can be suppressed to approximately 5 nm, and hence, the influence of the zigzag waveguide can be substantially ignored. According to this embodiment, the tilt angle can be suppressed to 0.03 degree or less owing to the lateral growth where the selectively grown layer is grown with forming the gaps 12c, and hence, the formation of the zigzag waveguide can be avoided.

Moreover, uniform step flow growth is observed in a laterally grown region of the selectively grown layer 14A. When the MQW active layer 18 is formed on such a flat face, local segregation of indium can be prevented, so as to obtain the MQW active layer 18 with uniform quality. Accordingly, the operation current can be reduced.

The far-field pattern, in the direction vertical to the substrate surface, of the semiconductor laser diode of this embodiment is equivalent to that shown in FIG. 16, and thus, a unimodal and satisfactory light intensity distribution can be obtained.

This is because, similarly to Embodiment 3, the selectively grown layers 14A grown from the top faces of the convexes 12a of the second seed layer 12B to be integrated are formed from n-type AlGaN, and the n-type superlattice cladding layer 16A having the superlattice structure including n-type AlGaN and n-type GaN also works as the n-type contact layer. Thus, the light confinement coefficient of the MQW active layer 18 can be largely increased.

As described above, when the selectively grown layer 14A includes 2% or more and preferably 4% or more of aluminum, the leakage of light to the substrate 11 can be definitely prevented.

Although the first and second seed layers 12A and 12B are formed from GaN in this embodiment, these seed layers may be made from a gallium nitride-based mixed crystal represented by a general formula, $Al_uGa_vIn_wN$ (wherein $0 \leq u, v, w \leq 1$ and $u+v+w=1$), and in particular, AlGaN or GaInN. The optimal growth conditions for the lateral growth are selected in accordance with the composition of the mixed crystal to be used.

Furthermore, although the low temperature buffer layer is formed below the first seed layer 12A, the low temperature buffer layer is not always necessary as far as the first seed layer can be formed in a monocrystal.

Although the substrate 11 is made from sapphire, for example, silicon carbide, neodymium gallate (NGO), gallium nitride or the like may be used instead of sapphire. However, when the substrate 11 is made from silicon carbide, tensile strain is applied to the lamination body 30 and hence cracks can be easily caused. Therefore, it is preferred in this case that the integrated second seed layer 12B has a thickness smaller than 2 μm by reducing the sectional width of the groove 12b as far as possible. In this manner, the lamination body 30 can be free from cracks even after the two selective growths and the growth of the lamination body 30.

Accordingly, regardless of the material for the substrate 11, three or more selective growths are not only meaningless but also unpreferable because new problems derived from strain can be caused.

Although the lift-off method is employed in forming the convexes 12a in the upper portions of the first and second seed layers 12A and 12B, any other method can be employed instead as far as the convexes 12a and the grooves 12b can be formed with the mask film 13 remaining at least on the bottoms of the grooves 12b. Specifically, any other method can be employed as far as the C plane on the portions of the convexes 12a not covered with the mask film 13 can be used as the seed crystal and the gaps 12c can be formed.

The material for the mask film 13 is not limited to silicon nitride but can be a dielectric, an amorphous insulator, a metal with a high melting point or a metal compound with a high melting point as described in Embodiment 1 and its Modification 1. When a dielectric film is used, the mask film 13 with good quality can be formed at a low temperature by employing the ECR sputtering.

Furthermore, by using the nitride semiconductor layer including a dislocation low-density region of this embodiment, not only a light emitting device but also another semiconductor device such as an electronic device can be fabricated. Thus, the reliability and the yield of the semiconductor device can be improved.

Embodiment 7

Embodiment 7 of the invention will now be described with reference to the accompanying drawings.

Figure 32:
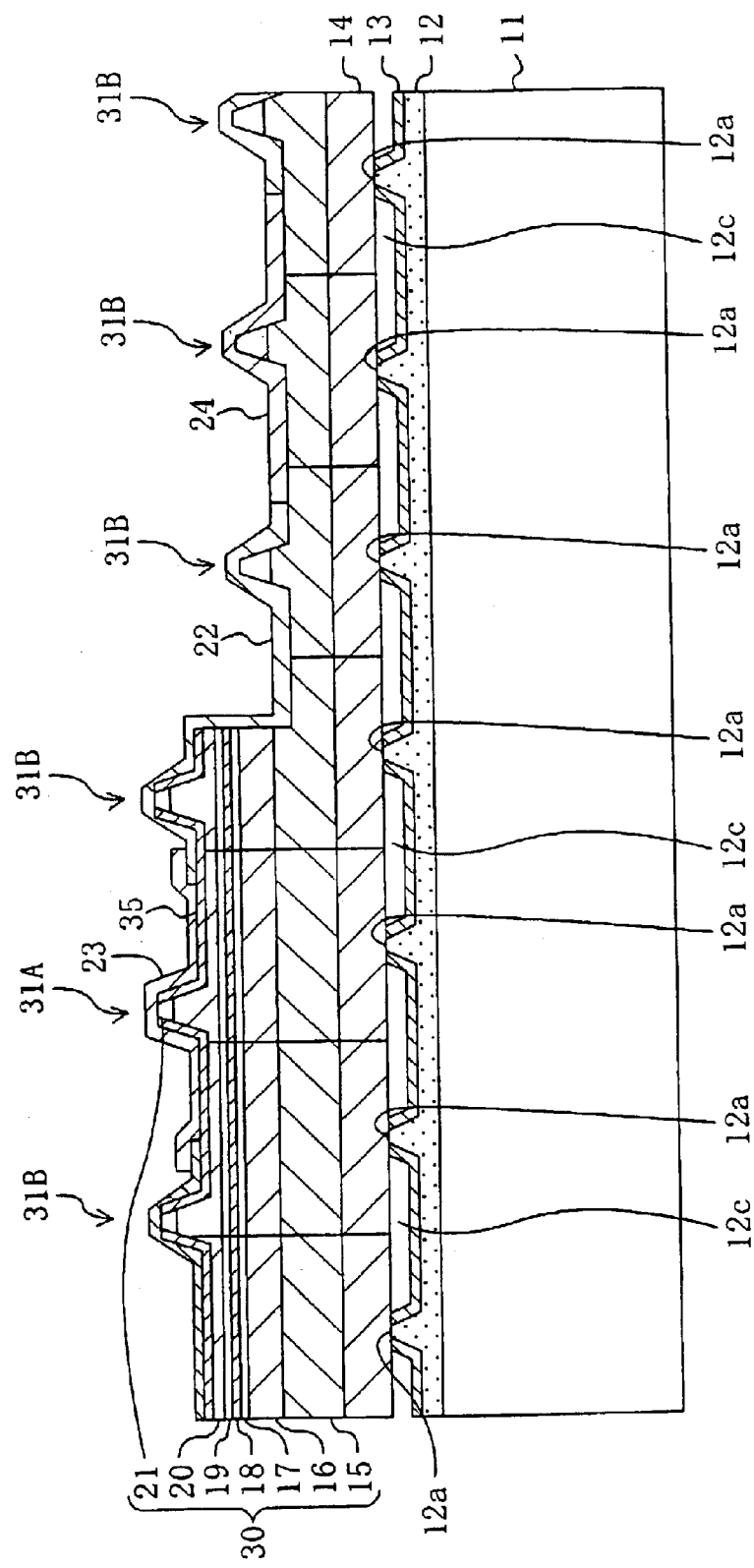
FIG. 32 is a cross-sectional view for showing the structure of a gallium nitride-based semiconductor laser diode according to Embodiment 7 of the invention.

FIG. 32 shows the sectional structure of a gallium nitride-based semiconductor laser diode of Embodiment 7. In FIG. 32, like reference numerals are used to refer to like elements shown in FIG. 1 so as to omit the description.

As is shown in FIG. 32, the semiconductor laser diode of this embodiment includes convexes 12a in the shape of stripes formed in a first formation cycle in an upper portion of the seed layer 12 and serving as the seed crystal for the ELOG, and one ridge 31A for current injection and plural dummy ridges 31B for aligning the ridge 31A formed in an upper portion of the lamination body 30. The ridge 31A and the dummy ridges 31B are arranged in the same direction as the convexes 12a in a second formation cycle different from the first formation cycle.

Now, a method of fabricating the semiconductor laser diode having the aforementioned structure will be described with reference to the drawings.

Figure 33:
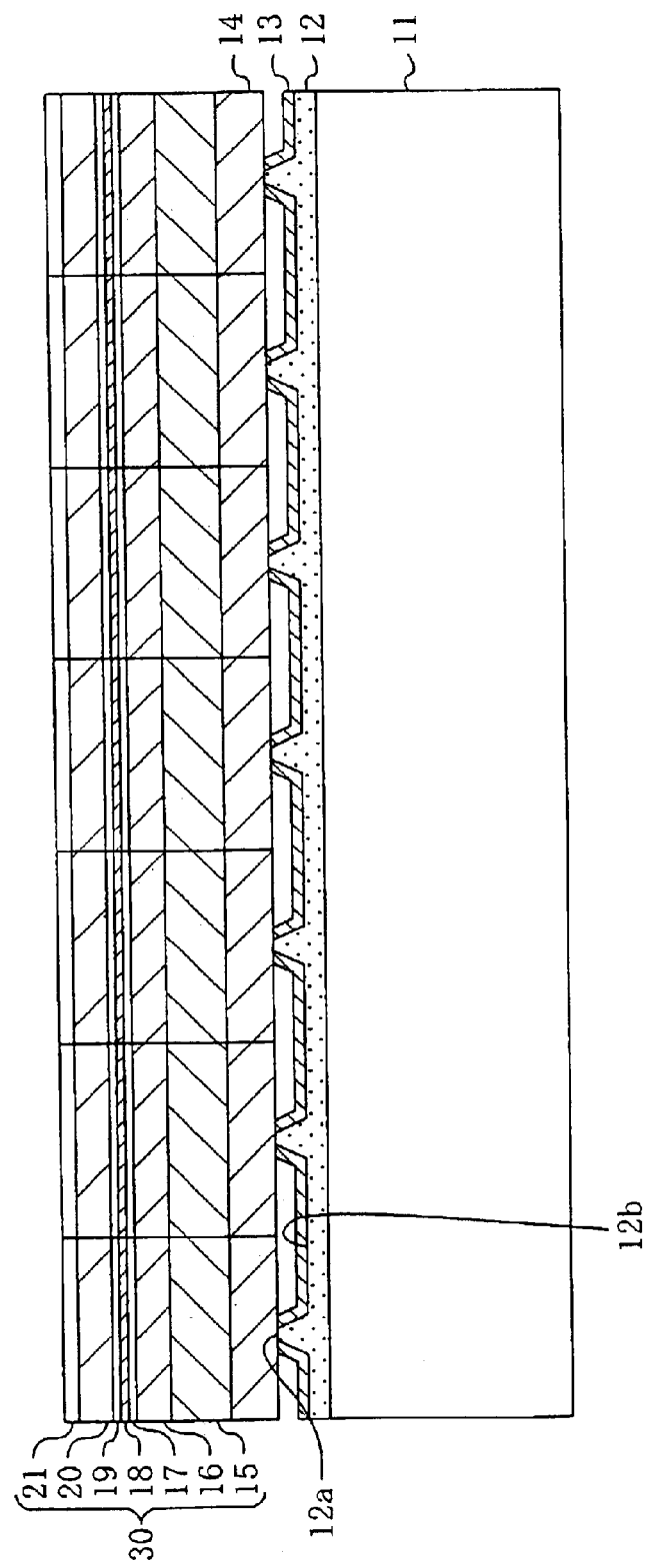
FIG. 33 is a cross-sectional view for showing a procedure in fabrication of the gallium nitride-based semiconductor laser diode of Embodiment 7.
Figure 34:
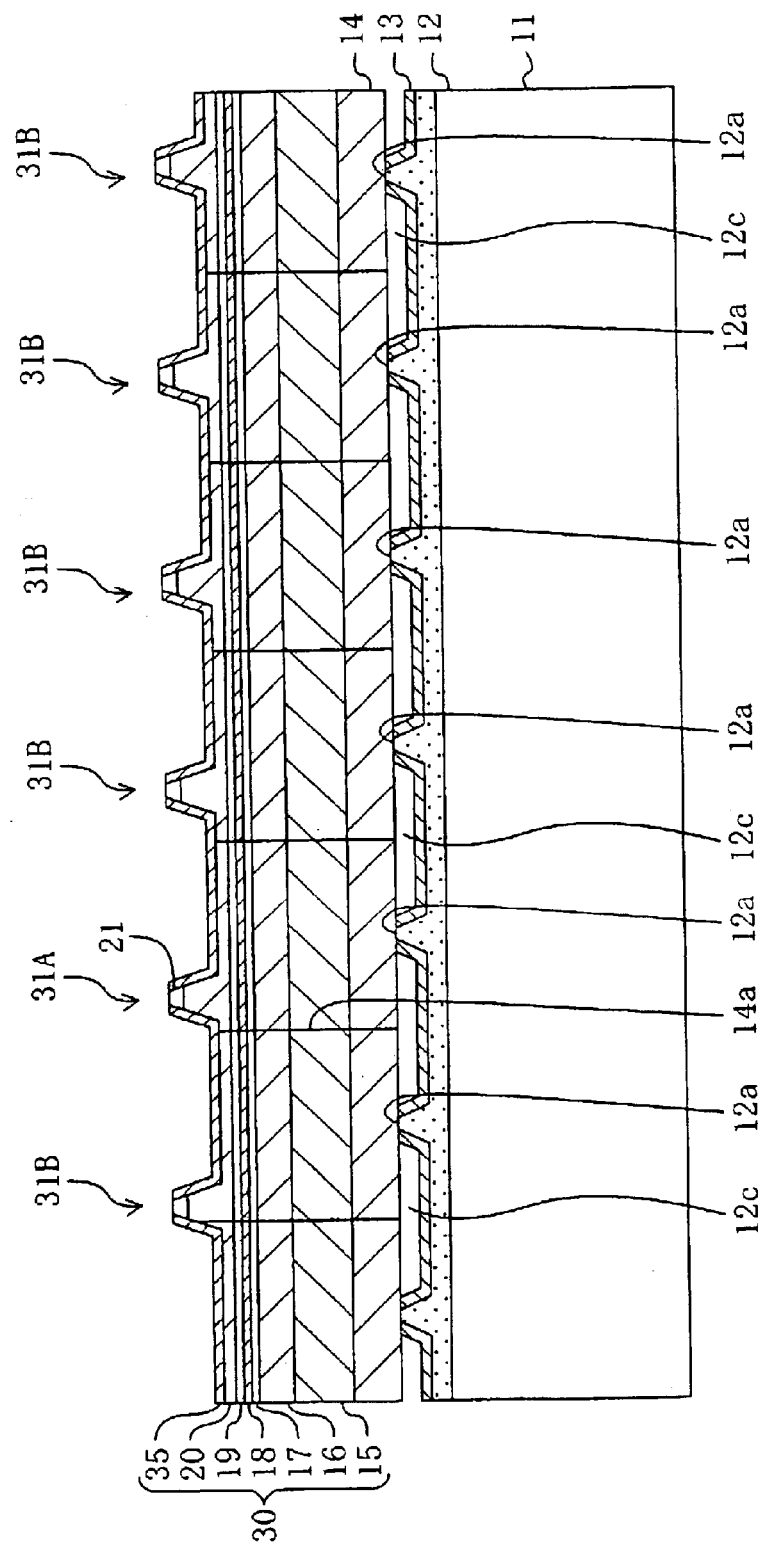
FIG. 34 is a cross-sectional view for showing another procedure in the fabrication of the gallium nitride-based semiconductor laser diode of Embodiment 7.
Figure 35:
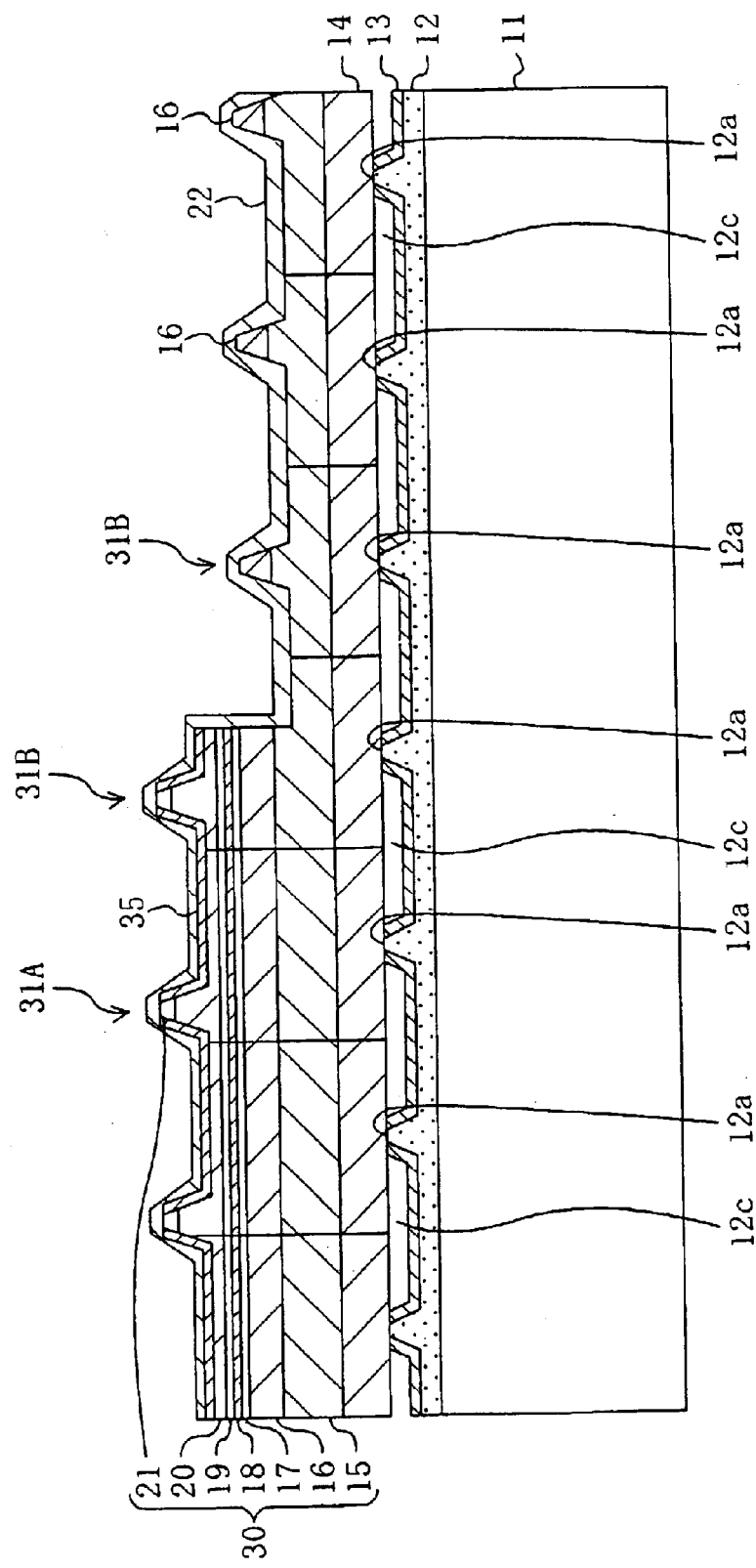
FIG. 35 is a cross-sectional view for showing still another procedure in the fabrication of the gallium nitride-based semiconductor laser diode of Embodiment 7.

FIGS. 33 through 35 are sectional views for showing procedures in the method of fabricating the semiconductor laser diode of Embodiment 7.

First, as is shown in FIG. 33, a seed layer 12 of GaN is grown on a substrate 11 of sapphire by the MOVPE in the same manner as in Embodiment 1, and convexes 12a in the shape of ridge stripes are formed in an upper portion of the seed layer 12 by the photolithography and the dry etching using a resist film. In this embodiment, for example, the convex 12a has a sectional width of approximately 4 μm, a groove 12b has a sectional width of approximately 12 μm, and the first formation cycle is 16 μm.

Next, a mask film 13 of silicon nitride is deposited by the ECR sputtering on the entire top face of the seed layer 12 including the convexes 12a, and the resist film is lifted off, thereby exposing at least the top faces of the convexes 12a from the mask film 13. At this point, the mask film 13 may or may not cover the walls of the grooves 12b.

Subsequently, a selectively grown layer 14 and a lamination body 30 are successively grown by the MOVPE on the seed layer 12 by using, as the seed crystal, the C plane appearing on the top faces of the convexes 12a not covered with the mask film 13 in the same manner as in Embodiment 1.

Next, as is shown in FIG. 34, an upper portion of a p-type cladding layer 20 and a p-type contact layer 21 are formed into a ridge 31A and dummy ridges 31B each with a sectional width of approximately 3 μm in the second formation cycle of 18 μm. At this point, the ridge 31A for current injection is formed in a region above a gap 12c and not overlapping a junction portion 14a, namely, in a dislocation low-density region including few crystal dislocations. Thereafter, the side faces of the ridge 31A and the dummy ridges 31B and areas therebetween are covered with an insulating film 35 of aluminum nitride (AlN) by the ECR sputtering in an argon atmosphere by using metallic aluminum and nitrogen as material sources.

Next, as is shown in FIG. 35, faces of the lamination body 30 excluding the ridge 31A is dry etched, so as to partly expose an n-type contact layer 15 in such a manner that the dummy ridge 31B can be formed from an n-type cladding layer 16. Then, an insulating film 22 of silicon nitride is deposited on exposed faces of the lamination body 30.

Then, as is shown in FIG. 32, openings are formed in the insulating film 22 in positions on and on both sides of the ridge 31A and in positions on and on both sides of one dummy ridge 31B above the n-type contact layer 15 by the reactive ion etching (RIE) using carbon tetrafluoride ($CF_4$). Thereafter, a p-side electrode 23 is formed over exposed portions in the openings of the insulating film 22 on and on the sides of the ridge 31A, and an n-side electrode 24 is formed over exposed portions in the openings of the insulating film 22 on and on the sides of the dummy ridge 31B above the n-type contact layer 15. In removing the portions of the insulating film 22 on and on the sides of the ridge 31A, the insulating film 35 formed below the insulating film 22 is slightly etched, which is negligible when the current confinement of an injected current and the horizontal lateral mode control are not affected.

The semiconductor laser diode fabricated in the aforementioned manner shows laser action at a wavelength of approximately 403 nm owing to a MQW active layer 18 including a well layer of $Ga_{0.8}In_{0.2}N$ with a thickness of approximately 3 nm and a barrier layer of GaN with a thickness of approximately 6 nm.

Now, the alignment of the ridge 31A and the dummy ridges 31B against the convexes 12a, that is, a characteristic of the method of fabricating the semiconductor laser diode of this embodiment, will be described with reference to the drawings.

As described above, it is indispensable for improving the characteristic of the semiconductor laser diode to form the ridge 31A for current injection in the dislocation low-density region of the lamination body 30 in FIG. 32.

Figure 36A:
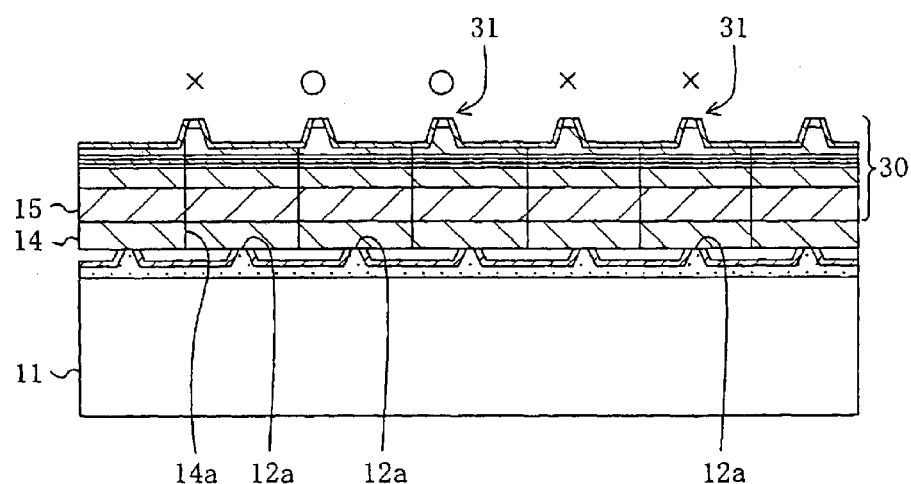

FIG. 36(a) shows examples of a ridge 31 appropriate for current injection among plural ridges 31. Each of the ridges 31 marked with ○ is formed above a region having the lowest dislocation density between the convex 12a and the junction portion 14a. In contrast, each of the ridges 31 marked with X is formed above a dislocation high-density region.

Accordingly, in the etching for partly exposing the n-type contact layer 15 shown in FIG. 35, it is necessary to allow the ridge 31 marked with ○ to remain as the ridge 31A for current injection.

Figure 36B:
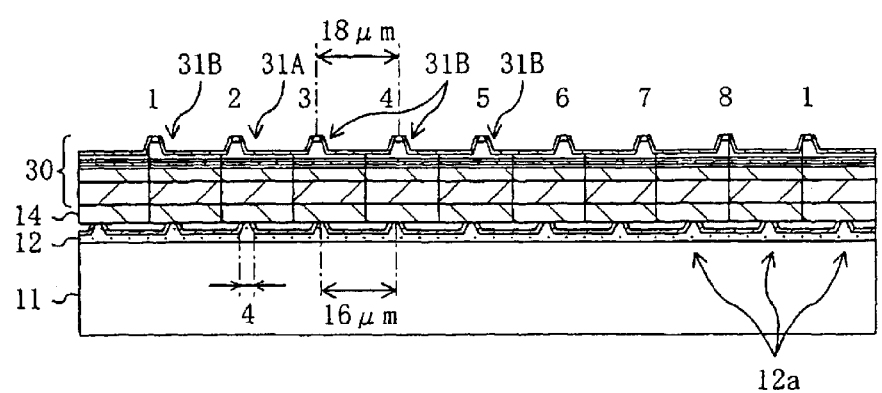

Therefore, in this embodiment, the following method is employed so as to easily and definitely distinguish the ridge 31A from the dummy ridge 31B as shown in FIG. 36(b).

Each of the ridges is previously given a number or the like for distinguishing the ridge 31A and the dummy ridges 31B having the second formation cycle (pattern B). It is herein assumed that the ridge 31 given a number "2" is to be used as the ridge 31A for current injection.

On the other hand, on the wafer, for example, in cleavage areas between the laser diodes on the substrate 11, alignment marks (alignment pattern) are provided so as to correspond to the respective numbers given to the ridges 31. In this embodiment, since a difference between the first formation cycle (pattern A) and the second formation cycle (pattern B) is 2 $\mu$m, the positional relationship between a ridge 31 and the closest convex 12a becomes the same at every 8 cycles of the pattern B. Accordingly, when at least 8 alignment marks are provided, at least one ridge 31 can be marked with ○ among the ridges 31 numbered "1" through "8".

Accordingly, in the etching shown in FIG. 35, when the boundary of the photomask is aligned, for example, in an area between the dummy ridge 31B numbered "3" and the dummy ridge 31B numbered "4", the ridge 31A for current injection can be allowed to remain.

Also, in the etching for forming the openings in the insulating film 22 for forming the p-side electrode 23, the ridge 31A numbered with "2" can be easily identified.

Since the chip width of the laser diode is approximately 300 through 500 $\mu$m, the third cycle of the ridges numbered "1" through "8" appears not once but twice or three times.

Furthermore, the effect exhibited in the mask alignment by the gaps 12c in the stripe shape formed between the seed layer 12 and the selectively grown layer 14 will now be described. This effect is exhibited because the top faces of the convexes 12a formed between the gaps 12c in the upper portion of the seed layer 12 are used as the seed crystal for the ELOG. Specifically, in order to select a ridge with few dislocations, it is necessary to identify a dislocation low-density region in the lamination body through observation from the upside with an optical microscope or the like. In this embodiment, as is shown in FIG. 32, the refractive index difference of observation light is largely varied owing to the gaps 12c, the positions of the convexes 12a (the dislocation high-density regions) are obvious. Accordingly, a ridge 31 that is a candidate for the ridge 31A for current injection and is positioned between the convex 12a and the junction portion 14a can be easily and definitely identified. As a result, the mask alignment in the photolithography is eased, so as to increase the throughput in the photolithography.

Although the first formation cycle of the convexes 12a and the second formation cycle of the ridges 31 are both constant in this embodiment, these cycles are not necessarily constant as far as the formation cycles are shifted from each other. For example, each formation cycle may form a sequence group satisfying arithmetical series.

Furthermore, the insulating film 35 is formed from aluminum nitride and the insulating film 22 is formed from silicon nitride in this embodiment. However, the materials for the insulating films are not limited to them as far as the etch selectivity against the insulating film 35 is sufficiently large in etching the insulating film 22. For example, the insulating film 35 may be formed from silicon oxide with the insulating film 22 formed from silicon nitride. Also, the insulating film 22 may be etched by wet etching or dry etching.

Although the substrate 11 is made from sapphire, for example, silicon carbide, neodymium gallate (NGO), gallium nitride or the like may be used instead.

Furthermore, the mask film 13 may be formed from a dielectric such as silicon nitride and silicon oxide by the ECR sputtering, and more preferably, is formed from a metal with a high melting point such as tungsten or its silicide.

Although the lift-off method is used for forming the convexes 12a in the upper portion of the seed layer 12, any other method may be employed instead as far as the convexes 12a and the grooves 12b can be formed.

Moreover, the fabrication method of this embodiment using two kinds of cyclic structures having different cycles is applicable to the conventional ELOG or the like.

What is claimed is:

1. A method of fabricating a nitride semiconductor device comprising the steps of:

forming a first nitride semiconductor layer on a substrate;

forming, in an upper portion of said first nitride semiconductor layer, plural grooves extending at intervals along a substrate surface direction;

forming a mask film for covering bottoms of said grooves;

growing, by using, as a seed crystal, C planes corresponding to portions of a top face of said first nitride semiconductor layer exposed from said mask film between said grooves, a lamination body including a second nitride semiconductor layer, an active layer formed from a third nitride semiconductor layer having a smaller energy gap than said second nitride semiconductor layer and a fourth nitride semiconductor layer having a larger energy gap than said active layer stacked in this order from a substrate side; and forming, on said lamination body, a current confinement part for selectively injecting carriers into said active layer.

2. The method of fabricating a nitride semiconductor device of claim 1, wherein the step of forming said plural grooves includes a sub-step of forming, on said first nitride semiconductor layer, a resist mask for covering said first nitride semiconductor layer in the shape of stripes and etching said first nitride semiconductor layer by using said resist mask, and the step of forming said mask film includes a sub-step of lifting off said resist mask.

3. The method of fabricating a nitride semiconductor device of claim 1, wherein said mask film is formed from a dielectric.

4. The method of fabricating a nitride semiconductor device of claim 3, wherein said dielectric is silicon nitride, silicon oxide, nitrided silicon oxide, aluminum oxide, nitrided aluminum oxide, titanium oxide, zirconium oxide or niobium oxide.

5. The method of fabricating a nitride semiconductor device of claim 3, wherein said mask film is formed by using electron cyclotron resonance plasma.

6. The method of fabricating a nitride semiconductor device of claim 3, wherein said mask film is formed by electron cyclotron resonance sputtering.

7. The method of fabricating a nitride semiconductor device of claim 1, wherein said mask film is formed from a metal with a high melting point or a metal compound with a high melting point.

8. The method of fabricating a nitride semiconductor device of claim 7, wherein said metal with a high melting point or said metal compound with a high melting point is tungsten, molybdenum, niobium, tungsten silicide, molybdenum silicide or niobium silicide.

9. A method of fabricating a nitride semiconductor device comprising the steps of:

forming a first nitride semiconductor layer on a substrate;

forming, in an upper portion of said first nitride semiconductor layer, plural grooves extending at intervals along a substrate surface direction;

forming a mask film for covering bottoms and at least part of walls of said grooves;

growing, by using, as a seed crystal, portions of said first nitride semiconductor layer exposed from said mask film between said grooves, a lamination body including a second nitride semiconductor layer, an active layer formed from a third nitride semiconductor layer having a smaller energy gap than said second nitride semiconductor layer and a fourth nitride semiconductor layer having a larger energy gap than said active layer stacked in this order from a substrate side; and forming, on said lamination body, a current confinement part for selectively injecting carriers into said active layer.

10. The method of fabricating a nitride semiconductor device of claim 9, wherein the step of forming said plural grooves includes a sub-step of forming, on said first nitride semiconductor layer, a resist mask for covering said first nitride semiconductor layer in the shape of stripes and etching said first nitride semiconductor layer by using said resist mask, and the step of forming said mask film includes a sub-step of lifting off said resist mask.

11. The method of fabricating a nitride semiconductor device of claim 9, wherein said mask film is formed from a dielectric.

12. The method of fabricating a nitride semiconductor device of claim 11, wherein said dielectric is silicon nitride, silicon oxide, nitrided silicon oxide, aluminum oxide, nitrided aluminum oxide, titanium oxide, zirconium oxide or niobium oxide.

13. The method of fabricating a nitride semiconductor device of claim 11, wherein said mask film is formed by using electron cyclotron resonance plasma.

14. The method of fabricating a nitride semiconductor device of claim 11, wherein said mask film is formed by electron cyclotron resonance sputtering.

15. The method of fabricating a nitride semiconductor device of claim 9, wherein said mask film is formed from a metal with a high melting point or a metal compound with a high melting point.

16. The method of fabricating a nitride semiconductor device of claim 15, wherein said metal with a high melting point or said metal compound with a high melting point is tungsten, molybdenum, niobium, tungsten silicide, molybdenum suicide or niobium suicide.

17. A method of fabricating a nitride semiconductor device comprising the steps of:

forming, in an upper portion of a substrate, plural grooves extending at intervals along a substrate surface direction;

selectively growing, on a top face of said substrate between said grooves, a lamination body including a first nitride semiconductor layer, an active layer formed from a second nitride semiconductor layer having a smaller energy gap than said first nitride semiconductor layer and a third nitride semiconductor layer having a larger energy gap than said active layer stacked in this order from a substrate side; and forming, on said lamination body, a current confinement part for selectively injecting carriers into said active layer.

18. The method of fabricating a nitride semiconductor device of claim 17, wherein the step of growing said lamination body includes a sub-step of forming plural gaps surrounded with bottoms and walls of said grooves and a surface of said lamination body opposing said grooves.

19. The method of fabricating a nitride semiconductor device of claim 17, wherein, in the step of growing said lamination body, said lamination body is grown on said substrate without forming a buffer layer therebetween.

20. A method of fabricating a nitride semiconductor device comprising the steps of:

forming a first nitride semiconductor layer on a substrate;

forming, in an upper portion of said first nitride semiconductor layer, plural grooves extending at intervals along a substrate surface direction;

forming a mask film for covering bottoms of said grooves;

growing, by using, as a seed crystal, C planes corresponding to portions of a top face of said first nitride semiconductor layer exposed from said mask film between said grooves, a lamination body including a second nitride semiconductor layer, a third nitride semiconductor layer, an active layer formed from a fourth nitride semiconductor layer having a larger refractive index than said third nitride semiconductor layer and a fifth nitride semiconductor layer having a smaller refractive index than said active layer stacked in this order from a substrate side; and forming, on said lamination body, a current confinement part for selectively injecting carriers into said active layer, wherein the step of growing said lamination body includes a sub-step of growing said second nitride semiconductor layer with a refractive index thereof smaller than or equivalent to a refractive index of said third nitride semiconductor layer.

21. The method of fabricating a nitride semiconductor device of claim 20, wherein the step of growing said lamination body includes, when said second nitride semiconductor layer includes aluminum, a sub-step of forming, between said first nitride semiconductor layer and said second nitride semiconductor layer, plural sixth nitride semiconductor layers including aluminum in a smaller composition ratio than in said second nitride semiconductor layer for covering a top face and its vicinity of each of said convexes alone.

22. The method of fabricating a nitride semiconductor device of claim 20, wherein the step of growing said lamination body includes a sub-step of forming, between said second nitride semiconductor layer and said third nitride semiconductor layer, a sixth nitride semiconductor layer having a superlattice structure with a refractive index smaller than or equivalent to the refractive index of said second nitride semiconductor layer or said third nitride semiconductor layer.

23. The method of fabricating a nitride semiconductor device of claim 20, wherein the step of forming said plural grooves includes a sub-step of forming, on said first nitride semiconductor layer, a resist mask for covering said first nitride semiconductor layer in the shape of stripes and etching said first nitride semiconductor layer by using said resist mask, and the step of forming said mask film includes a sub-step of lifting off said resist mask.

24. The method of fabricating a nitride semiconductor device of claim 20, wherein said mask film is formed from a dielectric.

25. The method of fabricating a nitride semiconductor device of claim 24, wherein said dielectric is silicon nitride, silicon oxide, nitrided silicon oxide, aluminum oxide, nitrided aluminum oxide, titanium oxide, zirconium oxide or niobium oxide.

26. The method of fabricating a nitride semiconductor device of claim 24, wherein said mask film is formed by using electron cyclotron resonance plasma.

27. The method of fabricating a nitride semiconductor device of claim 24, wherein said mask film is formed by electron cyclotron resonance sputtering.

28. The method of fabricating a nitride semiconductor device of claim 24, wherein said mask film is formed from a metal with a high melting point or a metal compound with a high melting point.

29. The method of fabricating a nitride semiconductor device of claim 28, wherein said metal with a high melting point or said metal compound with a high melting point is tungsten, molybdenum, niobium, tungsten suicide, molybdenum suicide or niobium silicide.

30. A method of fabricating a nitride semiconductor device comprising the steps of:

forming a first nitride semiconductor layer on a substrate;

forming, in an upper portion of said first nitride semiconductor layer, plural grooves extending at intervals along a substrate surface direction;

forming a mask film for covering bottoms and at least part of walls of said grooves;

growing, by using, as a seed crystal, portions of said first nitride semiconductor layer exposed from said mask film between said grooves, a lamination body including a second nitride semiconductor layer, a third nitride semiconductor layer, an active layer formed from a fourth nitride semiconductor layer having a larger refractive index than said third nitride semiconductor layer and a fifth nitride semiconductor layer having a smaller refractive index than said active layer stacked in this order from a substrate side; and forming, on said lamination body, a current confinement part for selectively injecting carriers into said active layer, wherein the step of growing said lamination body includes a sub-step of growing said second nitride semiconductor layer with a refractive index thereof smaller than or equivalent to a refractive index of said third nitride semiconductor layer.

31. The method of fabricating a nitride semiconductor device of claim 30, wherein the step of growing said lamination body includes, when said second nitride semiconductor layer includes aluminum, a sub-step of forming, between said first nitride semiconductor layer and said second nitride semiconductor layer, plural sixth nitride semiconductor layers each including aluminum in a smaller composition ratio than in said second nitride semiconductor layer for covering a top face and its vicinity of each of said convexes alone.

32. The method of fabricating a nitride semiconductor device of claim 30, wherein the step of growing said lamination body includes a sub-step of forming, between said second nitride semiconductor layer and said third nitride semiconductor layer, a sixth nitride semiconductor layer having a superlattice structure with a refractive index smaller than or equivalent to the refractive index of said second nitride semiconductor layer or said third nitride semiconductor layer.

33. The method of fabricating a nitride semiconductor device of claim 30, wherein the step of forming said plural grooves includes a sub-step of forming, on said first nitride semiconductor layer, a resist mask for covering said first nitride semiconductor layer in the shape of stripes and etching said first nitride semiconductor layer by using said resist mask, and the step of forming said mask film includes a sub-step of lifting off said resist mask.

34. The method of fabricating a nitride semiconductor device of claim 30, wherein said mask film is formed from a dielectric.

35. The method of fabricating a nitride semiconductor device of claim 34, wherein said dielectric is silicon nitride, silicon oxide, nitrided silicon oxide, aluminum oxide, nitrided aluminum oxide, titanium oxide, zirconium oxide or niobium oxide.

36. The method of fabricating a nitride semiconductor device of claim 34, wherein said mask film is formed by using electron cyclotron resonance plasma.

37. The method of fabricating a nitride semiconductor device of claim 34, wherein said mask film is formed by electron cyclotron resonance sputtering.

38. The method of fabricating a nitride semiconductor device of claim 30, wherein said mask film is formed from a metal with a high melting point or a metal compound with a high melting point.

39. The method of fabricating a nitride semiconductor device of claim 38, wherein said metal with a high melting point or said metal compound with a high melting point is tungsten, molybdenum, niobium, tungsten silicide, molybdenum silicide or niobium suicide.

40. A method of fabricating a nitride semiconductor comprising the steps of:
forming, on a substrate, a first nitride semiconductor layer of $Al_uGa_vIn_wN$, wherein $0 \leq u, v, w \leq 1$ and $u+v+w=1$;
forming, in an upper portion of said first nitride semiconductor layer, plural convexes extending at intervals along a substrate surface direction;
forming a mask film for covering bottoms of recesses formed between said convexes adjacent to each other; and
growing, on said first nitride semiconductor layer, plural second nitride semiconductor layers of $Al_xGa_yIn_zN$, wherein $0 \leq x, y, z \leq 1$ and $x+y+z=1$, by using, as a seed crystal, C planes corresponding to top faces of said convexes exposed from said mask film,
wherein the step of forming said plural second nitride semiconductor layers includes a sub-step of forming each of said second nitride semiconductor layers in a manner that a facet of said second nitride semiconductor layer parallel to a direction of extending said convexes is exposed every time said second nitride semiconductor layer extends over a given number of convexes among said plural convexes.

41. The method of fabricating a nitride semiconductor of claim 40, wherein said facet is an A plane or an M plane.

42. The method of fabricating a nitride semiconductor of claim 40, wherein, in the step of forming said plural convexes, said plural convexes are formed in such a formation cycle that a region where said facet is exposed is larger than a region where said facet is not exposed.

43. The method of fabricating nitride semiconductor of claim 40, wherein said mask film is formed from a dielectric.

44. The method of fabricating a nitride semiconductor of claim 43, wherein said dielectric is silicon nitride, silicon oxide, nitrided silicon oxide, aluminum oxide, nitrided aluminum oxide, titanium oxide, zirconium oxide or niobium oxide.

45. The method of fabricating a nitride semiconductor of claim 40, wherein said mask film is formed from a metal with a high melting point or a metal compound with a high melting point.

46. The method of fabricating a nitride semiconductor of claim 45, wherein said metal with a high melting point or said metal compound with a high melting point is tungsten, molybdenum, niobium, tungsten silicide, molybdenum silicide or niobium silicide.

47. A method of fabricating a nitride semiconductor comprising the steps of:
forming, on a substrate, a first nitride semiconductor layer of $Al_uGa_vIn_wN$, wherein $0 \leq u, v, w \leq 1$ and $u+v+w=1$;
forming, in an upper portion of said first nitride semiconductor layer, plural convexes extending at intervals along a substrate surface direction;
forming a mask film for covering bottoms and at least part of walls of recesses formed between said convexes adjacent to each other; and
growing, on said first nitride semiconductor layer, plural second nitride semiconductor layers of $Al_xGa_yIn_zN$, wherein $0 \leq x, y, z \leq 1$ and $x+y+z=1$, by using, as a seed crystal, portions of said convexes exposed from said mask film,
wherein the step of forming said plural second nitride semiconductor layers includes a sub-step of forming each of said second nitride semiconductor layers in a manner that a facet of said second nitride semiconductor layer parallel to a direction of extending said convexes is exposed every time said second nitride semiconductor layer extends over a given number of convexes among said plural convexes.

48. The method of fabricating a nitride semiconductor of claim 47, wherein said facet is an A plane or an M plane.

49. The method of fabricating a nitride semiconductor of claim 47, wherein, in the step of forming said plural convexes, said plural convexes are formed in such a formation cycle that a region where said facet is exposed is larger than a region where said facet is not exposed.

50. The method of fabricating a nitride semiconductor of claim 47, wherein said mask film is formed from a dielectric.

51. The method of fabricating a nitride semiconductor of claim 50, wherein said dielectric is silicon nitride, silicon oxide, nitrided silicon, aluminum, nitrided aluminum oxide, titanium oxide, zirconium oxide or niobium oxide.

52. The method of fabricating a nitride semiconductor of claim 47, wherein said mask film is formed from a metal with a high melting point or a metal compound with a high melting point.

53. The method of fabricating a nitride semiconductor of claim 52, wherein said metal with a high melting point or said metal compound with a high melting point is tungsten, molybdenum, niobium, tungsten silicide, molybdenum silicide or niobium silicide.

54. A method of fabricating a nitride semiconductor device comprising the steps of:
forming a first nitride semiconductor layer on a substrate;
forming, in an upper portion of said first nitride semiconductor layer, plural grooves extending at intervals along a substrate surface direction;
forming a mask film for covering bottoms of said grooves;
growing, by using, as a seed crystal, C planes corresponding to portions of a top face of said first nitride semiconductor layer exposed from said mask film between said grooves, plural lamination bodies each including a second nitride semiconductor layer, an active layer formed from a third nitride semiconductor layer having a smaller energy gap than said second nitride semiconductor layer and a fourth nitride semiconductor layer having a larger energy gap than said active layer stacked in this order from a substrate side; and
forming, on each of said lamination bodies, a current confinement part for selectively injecting carriers into said active layer,
wherein the step of growing said plural lamination bodies includes a sub-step of forming each of said lamination bodies in a manner that a cavity facet including said current confinement part is exposed every time said lamination body extends over a given number of C planes of said first nitride semiconductor layer.

55. The method of fabricating a nitride semiconductor device of claim 54, wherein said cavity facet is an A plane or an M plane.

56. The method of fabricating a nitride semiconductor device of claim 54, wherein, in the step of forming said plural grooves, said plural grooves are formed in such a formation cycle that a region where said cavity facet is exposed is larger than a region where said cavity facet is not exposed.

57. The method of fabricating a nitride semiconductor device of claim 54, wherein said mask film is formed from a dielectric.

58. The method of fabricating a nitride semiconductor device of claim 57, wherein said dielectric is silicon nitride, silicon oxide, nitrided silicon oxide, aluminum oxide, nitrided aluminum oxide, titanium oxide, zirconium oxide or niobium oxide.

59. The method of fabricating a nitride semiconductor device of claim 54, wherein said mask film is formed from a metal with a high melting point or a metal compound with a high melting point.

60. The method of fabricating a nitride semiconductor device of claim 59, wherein said metal with a high melting point or said metal compound with a high melting point is tungsten, molybdenum, niobium, tungsten silicide, molybdenum suicide or niobium suicide.

61. A method of fabricating a nitride semiconductor device comprising the steps of:
    forming a first nitride semiconductor layer on a substrate;
    forming, in an upper portion of said first nitride semiconductor layer, plural grooves extending at intervals along a substrate surface direction;
    forming a mask film for covering bottoms and at least part of walls of said grooves;
    growing, by using, as a seed crystal, portions of said first nitride semiconductor layer exposed from said mask film between said grooves, plural lamination bodies each including a second nitride semiconductor layer, an active layer formed from a third nitride semiconductor layer having a smaller energy gap than said second nitride semiconductor layer and a fourth nitride semiconductor layer having a larger energy gap than said active layer stacked in this order from a substrate side; and
    forming, on each of said lamination bodies, a current confinement part for selectively injecting carriers into said active layer,
    wherein the step of growing said plural lamination bodies includes a sub-step of forming each of said lamination bodies in a manner that a cavity facet including said current confinement part is exposed every time said lamination body extends over a given number of portions of said first nitride semiconductor layer sandwiched between said grooves adjacent to each other.

62. The method of fabricating a nitride semiconductor device of claim 61, wherein said cavity facet is an A plane or an M plane.

63. The method of fabricating a nitride semiconductor device of claim 61, wherein, in the step of forming said plural grooves, said plural grooves are formed in such a formation cycle that a region where said cavity facet is exposed is larger than a region where said cavity facet is not exposed.

64. The method of fabricating a nitride semiconductor device of claim 61, wherein, said mask film is formed from a dielectric.

65. The method of fabricating a nitride semiconductor device of claim 64, wherein said dielectric is silicon nitride, silicon oxide, nitrided silicon oxide, aluminum oxide, nitrided aluminum oxide, titanium oxide, zirconium oxide or niobium oxide.

66. The method of fabricating a nitride semiconductor device of claim 61, wherein said mask film is formed from a metal with a high melting point or a metal compound with a high melting point.

67. The method of fabricating a nitride semiconductor device of claim 66, wherein said metal with a high melting point or said metal compound with a high melting point is tungsten, molybdenum, niobium, tungsten suicide, molybdenum silicide or niobium silicide.

68. A method of fabricating a nitride semiconductor device comprising the steps of:
    forming a first nitride semiconductor layer on a substrate;
    forming, in an upper portion of said first nitride semiconductor layer, plural first grooves extending at intervals along one substrate surface direction;
    forming a first mask film for covering bottoms of said first grooves;
    growing a second nitride semiconductor layer by using, as a seed crystal, C planes corresponding to portions of a top face of said first nitride semiconductor layer exposed from said first mask film between said first grooves;
    forming, in an upper portion of said second nitride semiconductor layer, plural second grooves extending at intervals in said one substrate surface direction and having portions between said second grooves adjacent to each other in different positions, in a substrate surface direction, from the portions between said first grooves adjacent to each other;
    forming a second mask film for covering bottoms of said second grooves;
    growing a third nitride semiconductor layer including an active layer by using, as a seed crystal, C planes corresponding to portions of a top face of said second nitride semiconductor layer exposed from said second mask film between said second grooves; and
    forming, on said third nitride semiconductor layer, a current confinement part with a resonating direction of generated light substantially perpendicular to said one substrate surface direction.

69. A method of fabricating a nitride semiconductor device comprising the steps of:
    forming a first nitride semiconductor layer on a substrate;
    forming, in an upper portion of said first nitride semiconductor layer, plural first grooves extending at intervals along one substrate surface direction;
    forming a first mask film for covering bottoms and at least part of walls of said first grooves;
    growing a second nitride semiconductor layer by using, as a seed crystal, portions of said first nitride semiconductor layer exposed from said first mask film between said first grooves;
    forming, in an upper portion of said second nitride semiconductor layer, plural second grooves extending at intervals along said one substrate surface direction and having portions between said second grooves adjacent to each other in positions different, in a substrate surface direction, from portions between said first grooves adjacent to each other;
    forming a second mask film for covering bottoms and at least part of walls of said second grooves;

growing a third nitride semiconductor layer including an active layer by using, as a seed crystal, portions of said second nitride semiconductor layer exposed from said second mask film between said second grooves; and forming, on said third nitride semiconductor layer, a current confinement part with a resonating direction of generated light substantially perpendicular to said one substrate surface direction.

70. A method of fabricating a semiconductor light emitting device comprising the steps of:

forming a first semiconductor layer on a substrate and forming, in an upper portion of said first semiconductor layer, plural first convexes extending at intervals along a substrate surface direction;

forming, on said first semiconductor layer, a second semiconductor layer having a lower face in contact with said first convexes from a lamination body including an active layer; and forming, in an upper portion of said second semiconductor layer, plural second convexes extending in a direction the same as said first convexes at intervals different from the intervals of said first convexes;

forming, on said substrate, a mark for aligning a mask for identifying a convex for injecting carriers into said active layer among said plural second convexes; and aligning said mask by using said mark and forming one of said plural second convexes into a carrier injection part by using said mask.

71. The method of fabricating a semiconductor light emitting device of claim 70, wherein said first semiconductor layer and said second semiconductor layer are formed from nitride semiconductors, the step of forming said first convexes includes a sub-step of forming a dielectric, film in each area sandwiched between said first convexes, and the step of forming said mark includes a sub-step of forming said mark for identifying one of said second convexes in a position not overlapping any of said first convexes in a direction vertical to a surface of said substrate and in the vicinity of any of said first convexes.

72. A method of fabricating a semiconductor light emitting device comprising the steps of:

forming a first nitride semiconductor layer on a substrate;

forming, in an upper portion of said first nitride semiconductor layer, plural grooves extending at intervals in a substrate surface direction;

forming a mask film for covering bottoms of said grooves;

growing, by using, as a seed crystal. C planes corresponding to portions of a top face of said first nitride semiconductor layer exposed from said mask film between said grooves, a lamination body including a second nitride semiconductor layer, an active layer formed from a third nitride semiconductor layer having a smaller energy gap than said second nitride semiconductor layer and a fourth nitride semiconductor layer having a larger energy gap than said active layer stacked in this order from a substrate side;

forming, in an upper portion of said lamination body, plural convexes extending in a direction the same as said grooves at intervals different from the intervals of said grooves; and selecting one convex in a position above any of said grooves and in the vicinity of an area between said grooves among said plural convexes and forming said selected convex into a carrier injection part for injecting carriers into said active layer.

73. The method of fabricating a semiconductor light emitting device of claim 72, wherein the step of forming said plural grooves includes a sub-step of forming on said first nitride semiconductor layer, a resist mask for covering said first nitride semiconductor layer in the shape of stripes and etching said first nitride semiconductor layer by using said resist mask, and the step of forming said mask film includes a sub-step of lifting off said resist mask.

74. The method of fabricating a semiconductor light emitting device of claim 72, wherein said mask film is formed from a dielectric.

75. The method of fabricating a semiconductor light emitting device of claim 74, wherein said dielectric is silicon nitride, silicon oxide, nitrided silicon oxide, aluminum oxide, nitrided aluminum oxide, titanium oxide, zirconium oxide or niobium oxide.

76. The method of fabricating a semiconductor light emitting device of claim 74, wherein said mask film is formed by using electron cyclotron resonance plasma.

77. The method of fabricating a semiconductor light emitting device of claim 74, wherein said mask film is formed by electron cyclotron resonance sputtering.

78. The method of fabricating a semiconductor light emitting device of claim 72, wherein said mask film is formed from a metal with a high melting point or a metal compound with a high melting point.

79. The method of fabricating a semiconductor light emitting device of claim 78, wherein said metal with a high melting point or said metal compound with a high melting point is tungsten, molybdenum, niobium, tungsten silicide, molybdenum suicide or niobium silicide.

80. A method of fabricating a semiconductor light emitting device comprising the steps of:

forming a first nitride semiconductor layer on a substrate;

forming, in an upper portion of said first nitride semiconductor layer, plural grooves extending at intervals in a substrate surface direction;

forming a mask film for covering bottoms and at least part of walls of said grooves;

growing, by using, as a seed crystal, portions of said first nitride semiconductor layer exposed from said mask film between said groove, a lamination body including a second nitride semiconductor layer, an active layer formed from a third nitride semiconductor layer having a smaller energy gap than said second nitride semiconductor layer and a fourth nitride semiconductor layer having a larger energy gap than said active layer stacked in this order from a substrate side;

forming, in an upper portion of said lamination body, plural convexes extending in a direction the same as said grooves at intervals different from the intervals of said grooves; and selecting one convex in a position above any of said grooves and in the vicinity of an area between said grooves among said plural convexes and forming said selected convex into a carrier injection part for injecting carriers into said active layer.

81. The method of fabricating a semiconductor light emitting device of claim 80, wherein the step of forming said plural grooves includes a sub-step of forming, on said first nitride semiconductor layer, a resist mask for covering said first nitride semiconductor layer in the shape of stripes and etching said first nitride semiconductor layer by using said resist mask, and the step of forming said mask film includes a sub-step of lifting off said resist mask.

82. The method of fabricating a semiconductor light emitting device of claim 80, wherein said mask film is formed from a dielectric.

83. The method of fabricating a semiconductor light emitting device of claim 82, wherein said dielectric is silicon nitride, silicon oxide, nitrided silicon oxide, aluminum oxide, nitrided aluminum oxide, titanium oxide, zirconium oxide or niobium oxide.

84. The method of fabricating a semiconductor light emitting device of claim 82, wherein said mask film is formed by using electron cyclotron resonance plasma.

85. The method of fabricating a semiconductor light emitting device of claim 82, wherein said mask film is formed by electron cyclotron resonance sputtering.

86. The method of fabricating a semiconductor light emitting device of claim 80, wherein said mask film is formed from a metal with a high melting point or a metal compound with a high melting point.

87. The method of fabricating a semiconductor light emitting device of claim 86, wherein said metal with a high melting point or said metal compound with a high melting point is tungsten, molybdenum, niobium, tungsten silicide, molybdenum suicide or niobium silicide.

* * * * *

UNITED STATES PATENT AND TRADEMARK OFFICE
CERTIFICATE OF CORRECTION

PATENT NO. : 6,911,351 B2
DATED : June 28, 2005
INVENTOR(S) : Kidoguchi, Isao et al.

It is certified that error appears in the above-identified patent and that said Letters Patent is hereby corrected as shown below:

<u>Title page,</u>
Item [56], References Cited, FOREIGN PATENT DOCUMENTS, add:
-- WO  99/65068 --.

Signed and Sealed this

Sixth Day of December, 2005

JON W. DUDAS
*Director of the United States Patent and Trademark Office*